(12) United States Patent
Yamaguchi et al.

(10) Patent No.: US 7,054,358 B2
(45) Date of Patent: *May 30, 2006

(54) MEASURING APPARATUS AND MEASURING METHOD

(75) Inventors: Takahiro Yamaguchi, Tokyo (JP); Masahiro Ishida, Tokyo (JP); Hirobumi Musha, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 841 days.

This patent is subject to a terminal disclaimer.

(21) Appl. No.: 10/134,298

(22) Filed: Apr. 29, 2002

(65) Prior Publication Data

US 2003/0202573 A1  Oct. 30, 2003

(51) Int. Cl.
*H04B 17/00* (2006.01)
*H04L 25/00* (2006.01)

(52) U.S. Cl. ..................... 375/226; 375/371
(58) Field of Classification Search ............... 375/226, 375/359, 130, 371; 702/69, 57, 66; 324/622
See application file for complete search history.

(56) References Cited

U.S. PATENT DOCUMENTS

| 6,460,001 | B1* | 10/2002 | Yamaguchi et al. | .......... 702/69 |
| 2003/0125888 | A1* | 7/2003 | Yamaguchi et al. | .......... 702/69 |
| 2005/0031029 | A1* | 2/2005 | Yamaguchi et al. | ........ 375/226 |

FOREIGN PATENT DOCUMENTS

| JP | 08-050156 | 2/1996 |
| JP | 08-220163 | 8/1996 |
| JP | 08-248078 | 9/1996 |
| JP | 11-083924 | 3/1999 |
| WO | WO00/46606 | 8/2000 |

OTHER PUBLICATIONS

Japanese Search Report dated May 27, 2003, 3 pages.
Patent Abstracts of Japan, Publication No. 11-083924, Publication Date Mar. 26, 1999, 2 pages.
Patent Abstracts of Japan, Publication No. 08-248078, Publication Date Sep. 27, 1996, 2 pages.
Patent Abstracts of Japan, Publication No. 08-220163, Publication Date Aug. 30, 1996, 2 pages.
Patent Abstracts of Japan, Publication No. 08-050156, Publication Date Feb. 20, 1996, 2 pages.

* cited by examiner

Primary Examiner—Khai Tran
(74) Attorney, Agent, or Firm—Osha-Liang LLP

(57) ABSTRACT

A measuring apparatus is provided that includes: a timing jitter calculator for calculating the first timing jitter sequence of the first signal and the second timing jitter sequence of the second signal; and a jitter transfer function estimator for calculating a jitter transfer function between the first and second signals based on frequency components of the first and second timing jitter sequences. The jitter transfer function estimator calculates the jitter transfer function, for a plurality of frequency component pairs each of which is formed by a frequency component of a timing jitter in the first timing jitter sequence and a frequency component of a timing jitter in the second timing jitter sequence which correspond to approximately equal frequencies, based on frequency component ratios of the timing jitters in the first and second timing jitter sequences.

40 Claims, 35 Drawing Sheets

MEASURING APPARATUS AND MEASURING METHOD

BACKGROUND OF THE INVENTION

1. Field of the Invention

The present invention relates to a measuring apparatus and a measuring method for performing measurement for an electronic circuit. More particularly, the present invention relates to a measuring apparatus that measures a jitter transfer function, a bit error rate and jitter tolerance of the electronic circuit.

2. Description of the Related Art

Jitter test is an important item to a serial communication device (serializer, deserializer or the like). For example, Recommendations and Requirements from International Telecommunication Union and Bellcore ((1) ITU-T, Recommendation G.958: Digital Line Systems Based on the Synchronous Digital Hierarchy for Use on Optical Fibre Cables, November 1994., (2) ITU-T, Recommendation O.172: Jitter and Wander Measuring Equipment for Digital Systems Which are Based on the Synchronous Digital Hierarchy (SDH), March 1999., and (3) Bellcore, Generic Requirements GR-1377-Core: SONET OC-192 Transport System Genetic Criteria, December 1998) define measurements of jitter tolerance, jitter generation and a jitter transfer function.

Therefore, the serial communication devices and the like have to satisfy the values described in the above specifications. For example, the jitter tolerance measurement of the deserializer is performed in the following manner. (a) A jitter (sinusoidal jitter) is incorporated into zero-crossings of an input bit stream. Then, (b) the deserializer samples the bit stream with the incorporated jitter at times in the vicinity of optimum sampling times so that the serial bit stream is output as parallel data. (c) One port is connected to a bit error rate measurement device so as to calculate a bit error rate. (d) The optimum sampling times have to be obtained from a recovered clock or a clock extracted from the data stream, in which the zero-crossings have jitter. Thus, it is apparent from the above that the jitter tolerance measurement is one of the most difficult measurements.

According to an well-known eye-diagram measurement, the performance of the communication device can be tested easily. FIG. 43 shows an eye diagram. The horizontal eye opening provides a peak-to-peak value of the timing jitter, while the vertical eye opening provides noise immunity or a signal-to-noise ratio. In the jitter tolerance measurement, however, the zero-crossings are caused to jitter by the timing jitter having a peak-to-peak value of 1 UI (Unit Interval, 1 UI is equal to the bit period $T_b$) or more. As a result, the eye-diagram measurement can merely measure a closed eye pattern. Therefore, it was difficult to apply the eye diagram to the jitter tolerance measurement.

FIG. 44 illustrates an exemplary arrangement for the jitter tolerance measurement of the deserializer. The jitter tolerance measurement is an extension of the bit error rate test. The deserializer performs serial-parallel conversion for the input serial bit stream, so that it outputs the resultant data as, for example, 16-bit recovered data. The instantaneous phase $\Delta\theta[nT]$ of the input bit stream to the deserializer under test is made to fluctuate by the sinusoidal jitter, where T is a data rate. A bit error rate tester provides a time delay to the output recovered clock so as to obtain the optimum timing, and samples the output recovered data. By comparing the sampled values of the recovered data with expected values corresponding thereto, the bit error rate of the parallel data is tested. However, since the output recovered clock is extracted from the serial bit stream in which edges fluctuate, it becomes difficult to sample the output recovered data at the optimum sampling times when the amount of the incorporated jitter is larger. On the other hand, according to the method in which the clock is extracted from the recovered data stream, the bit error rate tester has to include a high-performance clock recovery unit. This is because the jitter tolerance measurement of the deserializer requires the clock recovery unit which has larger jitter tolerance than that of the clock recovery unit included in the deserializer under test.

In other words, in the jitter tolerance measurement using the bit error rate tester, it is likely to underestimate the jitter tolerance. Therefore, in order to perform the measurement with excellent reproducibility, high measurement skill or know-how is required.

Moreover, in the jitter tolerance measurement, while the incorporated jitter amount is increased with the fixed jitter frequency $f_J$, the minimum incorporated jitter amount that causes generation of the bit error rate is obtained. For example, in order to perform the bit error rate test for a 2.5 Gbps serial communication device, 1-sec bit error rate test is performed by using a pseudo-random binary sequence having a pattern length of $2^{15}-1$. Therefore, in order to change the incorporated jitter amount 20 times and measure the jitter tolerance for each of 20 types of incorporated jitter amount, the test time of 20 sec is required.

Timing degradation of the input bit stream increases the bit error rate as well as amplitude degradation. The timing degradation corresponds to the horizontal eye opening in the eye-diagram measurement, while the amplitude degradation corresponds to the vertical eye opening. Therefore, by measuring the degrees of the timing degradation and amplitude degradation, the bit error rate can be calculated. Please note that the jitter tolerance measurement corresponds to the horizontal eye opening in the eye-diagram measurement. For example, degradation of the amplitude of a received signal of $\Delta A=10\%$ corresponds to the reduction of the signal-to-noise ratio of $20\log_{10}(100-10)/100=0.9$ dB. Therefore, the bit error rate increases by 0.9 dB. As for the timing degradation $\Delta T$, the similar calculation can be performed. Please note that the % value of the ratio and the dB value are relative values, not absolute values. Thus, in order to obtain an accurate value of the bit error rate, calibration is required.

John E. Gersbach, Ilya I. Novof, Joseph K. Lee, "Fast Communication Link Bit Error Rate Estimator," U.S. Pat. No. 5,418,789, May 23, 1995 discloses the following definition.

$$BER = 10^{\left(\frac{\Delta T}{T} + \frac{\Delta A}{A}\right)^{-K}} \tag{1}$$

In the above patent, an instantaneous bit error rate is calculated from $\Delta A$, $\Delta T$, a local clock period T and the maximum value A of the samples at the optimum sampling times. However, the invention disclosed in the aforementioned patent merely provides a method for estimating the bit error rate by measuring the timing degradation by a Gaussian noise jitter.

The invention disclosed in the aforementioned patent obtains a histogram of data edges, performs a threshold operation and obtains $\Delta T$. This operation is effective to the Gaussian noise jitter having a single peak. FIG. 45 compares a probability density function distribution of the Gaussian noise jitter and that of the sinusoidal jitter. The sinusoidal jitter used in the jitter tolerance test has two peaks at both ends of the distribution. Therefore, ΔT cannot be obtained only by performing the simple threshold operation. Moreover, in the jitter tolerance measurement, the zero-crossings are caused to jitter by the timing jitter of 1 $UI_{PP}$ or more. As a result, the histogram has the distribution in which the probability density functions of adjacent edges overlap each other, as shown in FIG. 45. From such a histogram, it is difficult to obtain ΔT. In addition, it is known that this histogram operation cannot secure a sufficient measurement precision unless about 10000 samples are obtained. Therefore, it is hard to reduce the measurement time. Moreover, K in the above expression does not have an ideal value. Therefore, by calibrating the instantaneous bit error rate with the actual bit error rate, the initial value for K has to be given. Also, a correction value ΔK has to be calculated from the difference between the long-term mean value of the instantaneous bit error rate and the actual bit error rate. In the conventional measurement, it was demanded that the difficulty in the jitter tolerance measurement was solved. Especially, it is demanded to reduce the test time.

SUMMARY OF THE INVENTION

Therefore, it is an object of the present invention to provide a measuring apparatus and a measuring method which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a measuring apparatus for measuring jitter characteristics of an electronic circuit, comprises: a timing jitter calculator operable to calculate a first timing jitter sequence of a first signal and a second timing jitter sequence of a second signal, the first signal being supplied to the electronic circuit or generated by the electronic circuit, the second signal being generated by the electronic circuit; and a jitter transfer function estimator operable to calculate a jitter transfer function between the first signal and the second signal based on frequency components of the first and second timing jitter sequences.

The jitter transfer function estimator may calculate the jitter transfer function based on a ratio of a frequency component of a timing jitter in the first timing jitter sequence and a frequency component of a timing jitter in the second timing jitter sequence, the timing jitter in the first timing jitter sequence and the timing jitter in the second timing jitter sequence having approximately equal frequencies.

Each of the first and second timing jitter sequences may include a plurality of frequency components, and the jitter transfer function estimator may calculate the jitter transfer function, for a plurality of frequency component pairs each of which is formed by a frequency component of a timing jitter in the first timing jitter sequence and a frequency component of a timing jitter in the second timing jitter sequence which correspond to approximately equal frequencies, based on frequency component ratios of the timing jitters in the first and second timing jitter sequences.

The timing jitter calculator may calculate the first timing jitter sequence while using an input signal supplied to the electronic circuit as the first signal.

The first signal may be an input signal supplied to the electronic circuit, and the measuring apparatus may further comprise a jitter incorporating unit operable to incorporate a desired input timing jitter into the input signal.

The jitter incorporating unit may incorporate the input timing jitter having a plurality of frequency components into the input signal.

The jitter transfer function estimator may include a timing jitter spectrum calculator operable to receive the first and second timing jitter sequences and to calculate frequency components of the first and second timing jitter sequences.

The jitter transfer function estimator may include: a power spectrum calculator operable to calculate a power spectrum of the first timing jitter sequence or the second timing jitter sequence; a cross spectrum calculator operable to calculate a cross spectrum between the first timing jitter sequence and the second timing jitter sequence; and a jitter transfer function calculator operable to calculate the jitter transfer function based on a ratio of the power spectrum to the cross spectrum.

The measuring apparatus may further comprise a jitter related transmission penalty calculator operable to calculate jitter related transmission penalty of the electronic circuit based on the jitter transfer function.

The jitter related transmission penalty calculator may include a bit error rate calculator operable to calculate a bit error rate of the electronic circuit based on the jitter transfer function.

The jitter related transmission penalty calculator may include a jitter tolerance calculator operable to calculate jitter tolerance of the electronic circuit based on the jitter transfer function.

Each of the first and second timing jitter sequences may include a plurality of frequency components, and the bit error rate calculator may calculate a worst-case value of the bit error rate for the plurality of frequency components.

Each of the first and second timing jitter sequences may include a plurality of frequency components, and the bit error rate calculator may further calculate a mean value of the bit error rate for the plurality of frequency components.

Each of the first and second timing jitter sequences may includes a plurality of frequency components, and the bit error rate calculator may further calculate the bit error rate in a case where a sinusoidal jitter was incorporated as an input timing jitter into an input signal of the electronic circuit, for the plurality of frequency components.

The bit error rate calculator may calculate performance limit of the bit error rate of the electronic circuit in the case where the sinusoidal jitter was incorporated as the input timing jitter.

Each of the first and second timing jitter sequences may include a plurality of frequency components, and the jitter tolerance calculator may calculate a worst-case value of the jitter tolerance for the plurality of frequency components.

Each of the first and second timing jitter sequences may include a plurality of frequency components, and the jitter tolerance calculator may further calculate a mean value of the jitter tolerance for the plurality of frequency components.

The jitter tolerance calculator may calculate the jitter tolerance of the electronic circuit in the case where the sinusoidal jitter was incorporated as an input timing jitter.

The jitter tolerance calculator may calculate performance limit of the jitter tolerance of the electronic circuit in the case where the sinusoidal jitter was incorporated as the input timing jitter.

The jitter incorporating unit may incorporate the timing jitter into the input signal by performing phase modulation of the input signal.

The jitter incorporating unit may incorporate the timing jitter into the input signal by performing frequency modulation of the input signal.

The second signal may be an output signal output from the electronic circuit; the jitter incorporating unit may incorporate a plurality of input timing jitters having different amplitudes into the input signal, the amplitudes being within a region where a relationship between the input timing jitters and output timing jitters of the output signal is linear; and the jitter transfer function estimator may include a gain calculator operable to calculate a gain of the jitter transfer function by performing linear approximation of a relationship between timing jitter values in the first timing jitter sequence and timing jitter values in the second timing jitter sequence, the timing jitter values in the first and second timing jitter sequences being made to correspond to the respective amplitudes of the input timing jitters.

The jitter transfer function estimator may further include a timing phase difference calculator operable to calculate a phase difference between the input timing jitters and the output timing jitters.

The timing jitter calculator may include: an analytic signal transformer operable to transform the first and second signals to an analytic signal that is a complex number; an instantaneous phase estimator operable to estimate an instantaneous phase of the analytic signal based on the analytic signal; a linear instantaneous phase estimator operable to estimate a linear instantaneous phase of each of the first and second signals based on the instantaneous phase of the analytic signal; and a linear trend remover operable to calculate an instantaneous phase noise, that is obtained by removing the linear instantaneous phase from the instantaneous phase, based on the instantaneous phase and the linear instantaneous phase for each of the first and second signals.

The timing jitter calculator may further include a resampler operable to receive the instantaneous phase noise of each of the first and second signals and to calculate the first and second timing jitter sequences by resampling the received instantaneous phase noise.

The resampler may resample the instantaneous phase noise at times approximately the same as zero-crossing times of a corresponding one of the first and second signals.

The analytic signal transformer may include: a bandwidth limiter operable to extract, from each of the first and second signals, frequency components containing a fundamental frequency of a corresponding one of the first and second signals; and a Hilbert transformer operable to generate, for each of the first and second signals, a Hilbert pair obtained by performing Hilbert transform of the frequency components extracted by the bandwidth limiter, and wherein the analytic signal transformer outputs the Hilbert pair as an imaginary part of the analytic signal.

The analytic signal transformer may include: a time-domain to frequency-domain transformer operable to transform each of the first and second signals to a two-sided spectrum in frequency domain; a bandwidth limiter operable to extract frequency components of the two-sided spectrum, the frequency components containing a positive fundamental frequency; and a frequency-domain to time-domain transformer operable to output as the analytic signal a signal obtained by transforming the frequency components extracted by the bandwidth limiter into time domain.

The analytic signal transformer may include: a buffer memory operable to store the first and second signals; a waveform data selector operable to sequentially select a part of the first and second signals stored in the buffer memory; an window function multiplier operable to multiply the signal part selected by the waveform data selector by a predetermined window function; a time-domain to frequency-domain transformer operable to transform the signal part multiplied by the window function to a spectrum in frequency domain; a bandwidth limiter operable to extract frequency components of the spectrum, the frequency components containing a positive fundamental frequency; a frequency-domain to time-domain transformer operable to transform the frequency components extracted by the bandwidth limiter to a time-domain signal; and an amplitude corrector operable to multiply the time-domain signal by a reciprocal of the window function to generate the analytic signal, and wherein the waveform data selector selects the signal part to partially overlap a previously selected signal part.

The bandwidth limiter may extract a desired frequency band.

The timing jitter estimator may include an waveform clipper operable to remove amplitude modulation components of the first and second signals and to supply the first and second signals without the amplitude modulation components to the analytic signal transformer.

The timing jitter calculator may further include a low frequency component remover operable to remove low frequency components of the instantaneous phase noise and to supply the instantaneous phase noise without the low frequency components to the resampler.

According to the second aspect of the present invention, a measuring apparatus for performing a measurement for an electronic circuit, comprises: an instantaneous phase noise calculator operable to calculate a first instantaneous phase noise of a first signal and a second instantaneous phase noise of a second signal, the first signal being supplied to the electronic circuit or generated by the electronic circuit, the second signal being generated by the electronic circuit; and a jitter transfer function estimator operable to calculate a jitter transfer function between the first and second signals based on frequency components of the first and second instantaneous phase noises.

According to the third aspect of the present invention, a measuring method for measuring jitter characteristics of an electronic circuit, comprises: calculating a first timing jitter sequence of a first signal and a second timing jitter sequence of a second signal, the first signal being supplied to the electronic circuit or generated by the electronic circuit, the second signal being generated by the electronic circuit; and calculating a jitter transfer function between the first and second signals based on frequency components of the first and second timing sequences.

The measuring method may further comprise calculating jitter related transmission penalty of the electronic circuit based on the jitter transfer function.

The calculation of jitter related transmission penalty may include calculation of a bit error rate of the electronic circuit based on the jitter transfer function.

The calculation of jitter related transmission penalty may include calculation of jitter tolerance of the electronic circuit based on the jitter transfer function.

According to the fourth aspect of the present invention, a measuring method for performing a measurement for an electronic circuit, comprises: calculating a first instantaneous phase noise of a first signal and a second instantaneous phase noise of a second signal, the first signal being supplied to the electronic circuit or generated by the electronic circuit, the second signal being generated by the electronic circuit; and calculating a jitter transfer function between the first and second signals based on frequency components of the first and second instantaneous phase noises.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
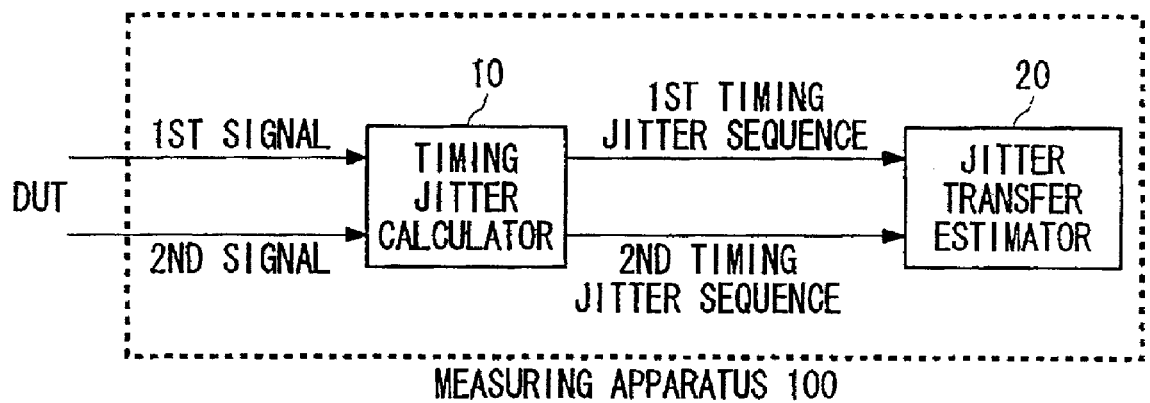
FIG. 1 illustrates an exemplary arrangement of a measuring apparatus 100 according to an embodiment of the present invention.

FIG. 1 illustrates an exemplary arrangement of a measuring apparatus 100 according to an embodiment of the present invention. The measuring apparatus 100 measures a jitter transfer function in an electronic circuit (DUT) as an example of a system, circuit and device under test.

The measuring apparatus 100 includes a timing jitter calculator 10 and a jitter transfer function estimator 20. The timing jitter calculator 10 calculates the first timing jitter sequence of the first signal and the second timing jitter sequence of the second signal in the DUT. Each of the first and second signals may be a signal input to the DUT, a signal output from the DUT or a signal in the DUT. The timing jitter sequence in the above is a signal described later referring to FIGS. 13–20.

The jitter transfer function estimator 20 calculates a jitter transfer function between the first and second signals based on frequency components of the first and second timing jitter sequences. The jitter transfer function estimator 20 may calculate the jitter transfer function based on a ratio of a frequency component of a jitter in the first timing sequence and a frequency component of a jitter in the second timing jitter sequence. Then, the jitter in the first timing sequence and the jitter in the second timing sequence have frequencies approximately equal to each other. Moreover, it is preferable that, for a plurality of frequency component pairs of the jitters in the first and second timing jitter sequences, each of which is formed by the frequency component of the jitter in the first timing sequence and that of the jitter in the second timing sequence have approximately the same frequencies. Then, the jitter transfer function estimator 20 calculates the jitter transfer function based on the frequency component ratios of the jitters in the first and second timing jitter sequences.

Figure 2:
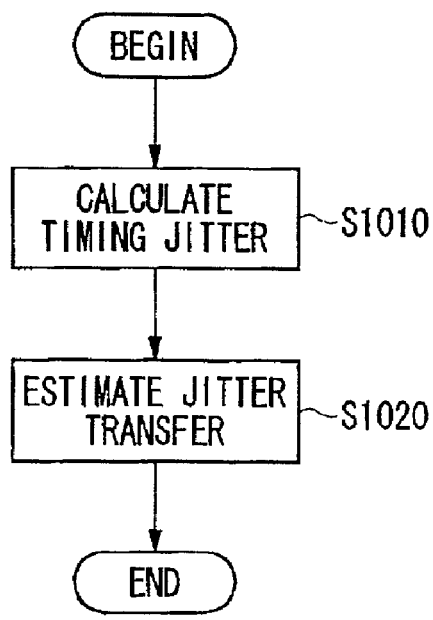
FIG. 2 is a flowchart of an exemplary measuring method according to an embodiment of the present invention.

FIG. 2 is a flowchart showing an exemplary measuring method according to an embodiment of the present invention. This measuring method measures the jitter transfer function in the electronic circuit (DUT) as an example of a system, circuit or a device under test.

In Timing jitter calculation step S1010, the timing jitter sequences of the first and second signals in the DUT are calculated. Step S1010 has a similar function to that of the timing jitter calculator 10 described referring to FIG. 1.

Then, in Jitter transfer function estimation step S1020, the jitter transfer function in the DUT is estimated. Step S1020 has a similar function to that of the jitter transfer function estimator 20 described referring to FIG. 1.

Figure 3:
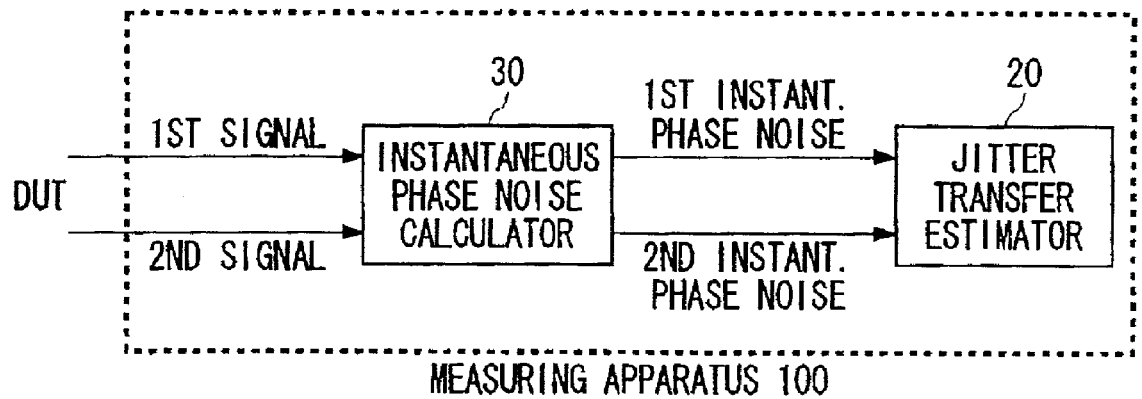
FIG. 3 illustrates another exemplary arrangement of the measuring apparatus 100.

FIG. 3 illustrates another exemplary arrangement of the measuring apparatus 100. In this example, the measuring apparatus 100 shown in FIG. 3 is different from the measuring apparatus 100 shown in FIG. 1 in that an instantaneous phase noise calculator 30 is provided in place of the timing jitter calculator 10.

The instantaneous phase noise calculator 30 calculates an instantaneous phase noise of the first signal and that of the second signal in the DUT. Please note that the instantaneous phase noise is a signal described later referring to FIGS. 13–19.

The jitter transfer function estimator 20 calculates the jitter transfer function between the first and second signals based on the frequency components of the jitters in the first and second instantaneous noises, the frequencies of the jitters being approximately equal to each other. The jitter transfer function estimator 20 has a similar function to that of the jitter transfer function estimator 20 described referring to FIG. 1.

Figure 4:
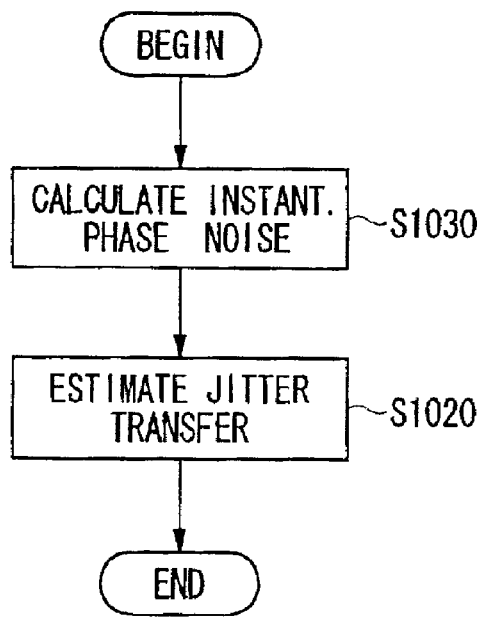
FIG. 4 illustrates another exemplary arrangement of the measuring apparatus 100.

FIG. 4 is another exemplary flowchart showing an exemplary measuring method according to the embodiment of the present invention. This measuring method includes Instantaneous phase noise calculation step S1030 in place of Step S1010 in the measuring method described referring to FIG. 2.

In Instantaneous phase noise calculation step S1030, the instantaneous phase noises of the first and second signals of the DUT are calculated. Step S1060 may have a similar function to that of the instantaneous phase noise calculator 30 described referring to FIG. 3.

Figure 5:
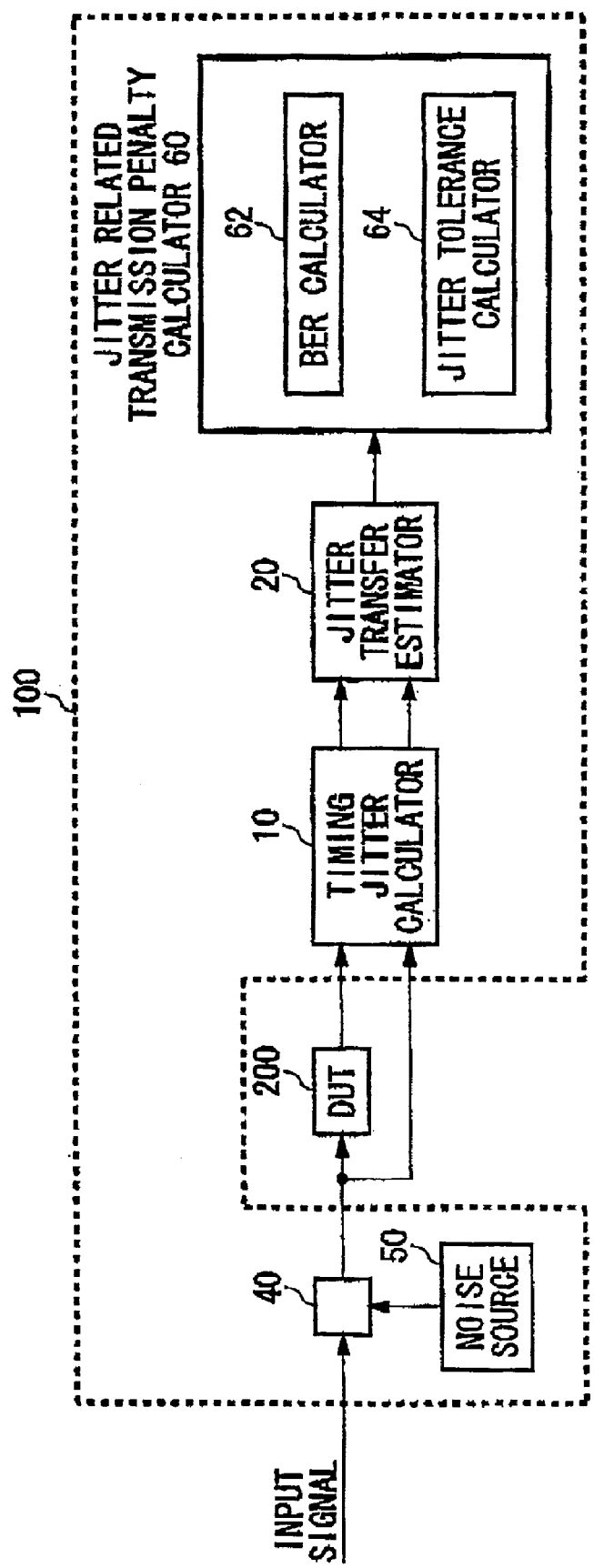
FIG. 5 illustrates other exemplary arrangement of the measuring apparatus 100.

FIG. 5 illustrates another exemplary arrangement of the measuring apparatus 100. In this example, the measuring apparatus 100 receives an input signal and an output signal of the DUT 200 as the first and second signals, respectively. The measuring apparatus 100 includes the arrangement of the measuring apparatus 100 described referring to FIG. 1 and further includes a noise source 50, a jitter incorporating unit 40 and a jitter related transmission penalty calculator 60. Although in this example the jitter transfer function is measured based on the timing jitter sequences of the signals of the DUT 200 like the measuring apparatus 100 described referring to FIG. 1, the jitter transfer function may be measured based on the instantaneous phase noises of the signals of the DUT 200 in an alternative example, like the measuring apparatus 100 described referring to FIG. 3.

The measuring apparatus 100 in this example incorporates the jitter into the input signal to the DUT and measures at lest one of the jitter transfer function, a bit error rate and jitter tolerance of the DUT based on the input signal with the incorporated jitter and the output signal from the DUT.

The noise source 50 generates a desired input timing jitter (noise) to be incorporated into the input signal. The jitter incorporating unit 40 incorporates the input timing jitter generated by the noise source 50 into the input signal. The noise source 50 preferably generates a broadband input timing jitter. In this example, the noise source 50 generates a Gaussian jitter that has frequency components in the broad band.

The jitter incorporating unit 40 may incorporate the timing jitter into the input signal by performing phase modulation or frequency modulation of the input signal. In other words, the jitter incorporating unit 40 may modulate phase terms or frequency terms in the input signal by the Gaussian jitter.

The DUT 200 receives the input signal with the incorporated input timing jitter and outputs the output signal in accordance with the received input signal. The input timing jitter incorporated into the input signal is transferred to the output timing jitter of the output signal in accordance with the jitter transfer function of the DUT 200.

The timing jitter calculator 10 calculates the timing jitter sequence of the input signal, i.e., the first timing jitter sequence, and that of the output signal, i.e., the second timing jitter sequence. The jitter transfer function estimator 20 measures the jitter transfer function based on the first and second timing jitter sequences.

The jitter related transmission penalty calculator 60 calculates jitter related transmission penalty of the DUT based on the jitter transfer function. The jitter related transmission penalty in the present specification means reliability of the DUT's operation with respect to the input timing jitter. In this example, the jitter related transmission penalty calculator 60 includes a bit error rate calculator 62 which calculates a bit error rate of the DUT and a jitter tolerance calculator 64 which calculates jitter tolerance of the DUT.

According to the measuring apparatus 100 of this example, the jitter related transmission penalty of the DUT can be calculated easily. Although the measuring apparatus 100 includes the jitter incorporating unit 40 and the noise source 50 in this example, the jitter incorporating unit 40 and the noise source 50 may be provided in the outside of the measuring apparatus 100 in an alternative example. Moreover, in this example, the timing jitter calculator 10 calculates the timing jitter sequence of the input signal. However, in an alternative example, the timing jitter sequence of the input signal may be given from the outside to the jitter transfer function estimator 20. Also, the noise source 50 may supply the timing jitter sequence of the input signal to the jitter transfer function estimator 20.

Figure 6:
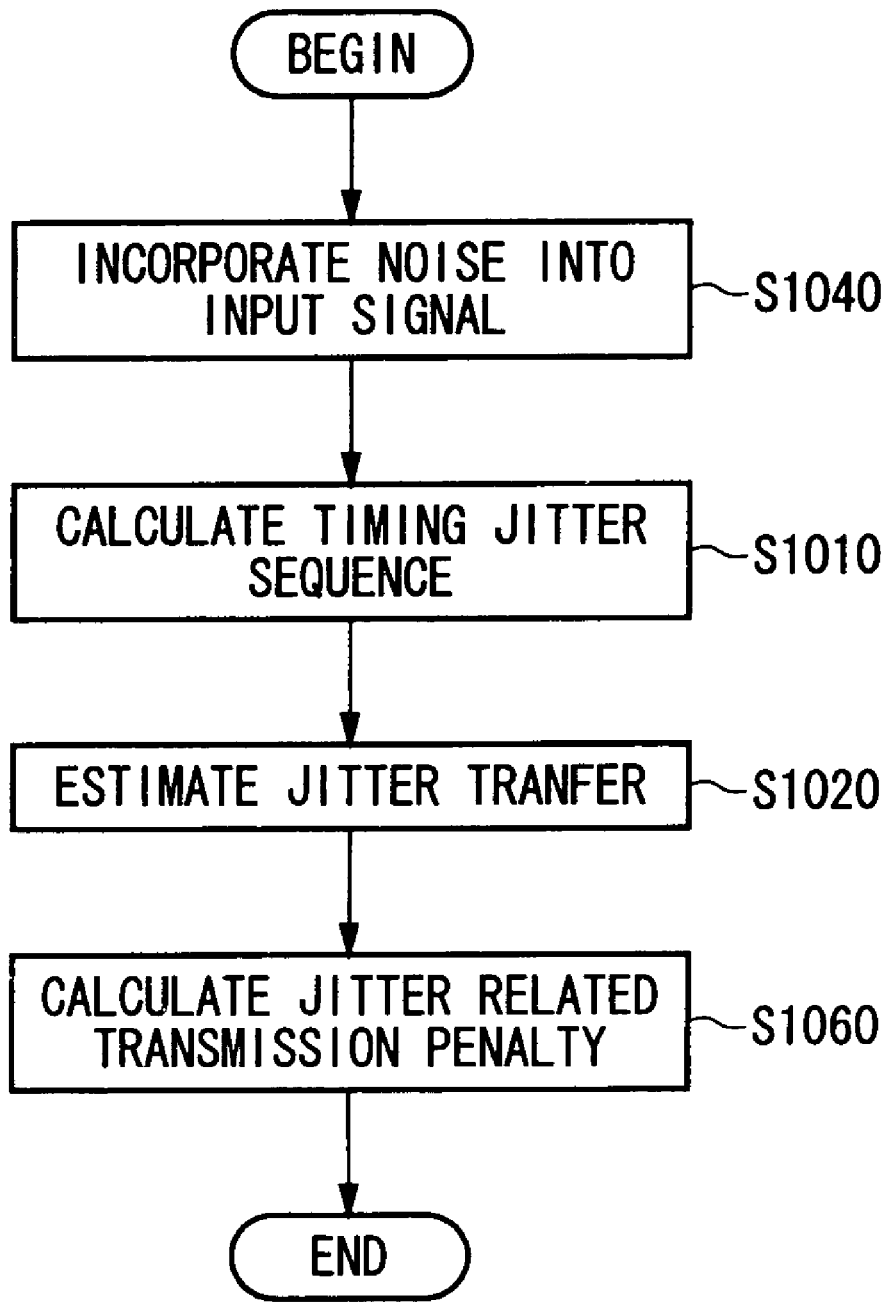
FIG. 6 is a flowchart of another exemplary measuring method.

FIG. 6 is a flowchart showing another exemplary measuring method. The measuring method in this example includes the steps of the measuring method described referring to FIG. 2 and further includes Jitter incorporating step S1040 and Jitter related transmission penalty calculation step S1060.

In Step S1040, a desired timing jitter is incorporated into the input signal. Step S1040 has a similar function to that of the jitter incorporating unit 40 described referring to FIG. 5. Then, the timing jitter sequences of the input and output signals are calculated in Step S1010. Step S1010 has a similar function to that of the timing jitter calculator 10 described referring to FIG. 5.

Next, in Step S1020, the jitter transfer function is estimated based on the timing jitter sequences. Step S1020 has a similar function to that of the jitter transfer function estimator 20 described referring to FIG. 5. Then, the jitter related transmission penalty of the DUT is calculated based on the jitter transfer function in Step S1060. Step S1060 has a similar function to that of the jitter related transmission penalty calculator 60 described referring to FIG. 5. The details of the operation and arrangement of the measuring apparatus 100 and the details of the measuring method are described below.

Figure 7:
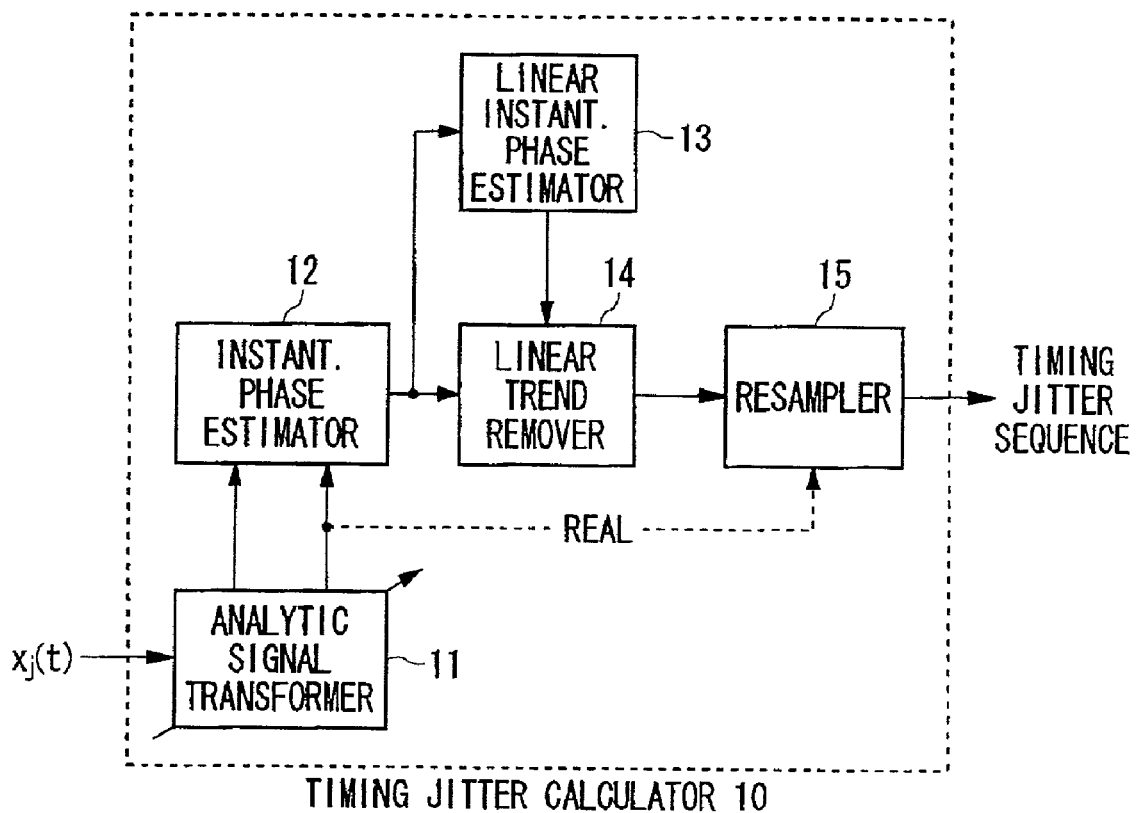
FIG. 7 illustrates an exemplary arrangement of a timing jitter calculator 10.

FIG. 7 illustrates an exemplary arrangement of the timing jitter calculator 10. The timing jitter calculator 10 includes an analytic signal transformer 11, an instantaneous phase estimator 12, a linear instantaneous phase estimator 13, a linear trend remover 14 and a resampler 15. In this example, a case where the timing jitter calculator 10 calculates the timing jitter sequence of the output signal of the DUT is described. The similar description can be applied to another case where the timing jitter calculator 10 calculates the timing jitter sequence of the input signal. Moreover, the measuring apparatus 100 may include the timing jitter calculator 10 for each of the input and output signals.

The analytic signal transformer 11 receives the output signal and transforms the received output signal to an analytic signal that is a complex number. The analytic signal transformer 11 generates the analytic signal by, for example, Fourier transform or Hilbert transform.

The instantaneous phase estimator 12 receives the analytic signal and estimates an instantaneous phase of the received analytic signal. The linear instantaneous phase estimator 13 estimates a linear instantaneous phase of the output signal based on the instantaneous phase of the analytic signal. The linear trend remover 14 calculates an instantaneous phase noise obtained by removing the linear instantaneous phase from the instantaneous phase based on the instantaneous phase and the linear instantaneous phase.

The resampler 15 receives the instantaneous phase noise and calculates the timing jitter sequence of the output signal by resampling the received instantaneous phase noise. For example, the resampler 15 may resample the instantaneous phase noise at times approximately the same as the zero-crossing times of the output signal. That is, the instantaneous phase noise may be resampled based on the zero-crossing times of a real part of the analytic signal.

By resampling the instantaneous phase noise at the zero-crossing times by means of the resampler 15, the timing jitter sequence indicating the jitters at the edges of the output signal can be easily generated.

Figure 8:
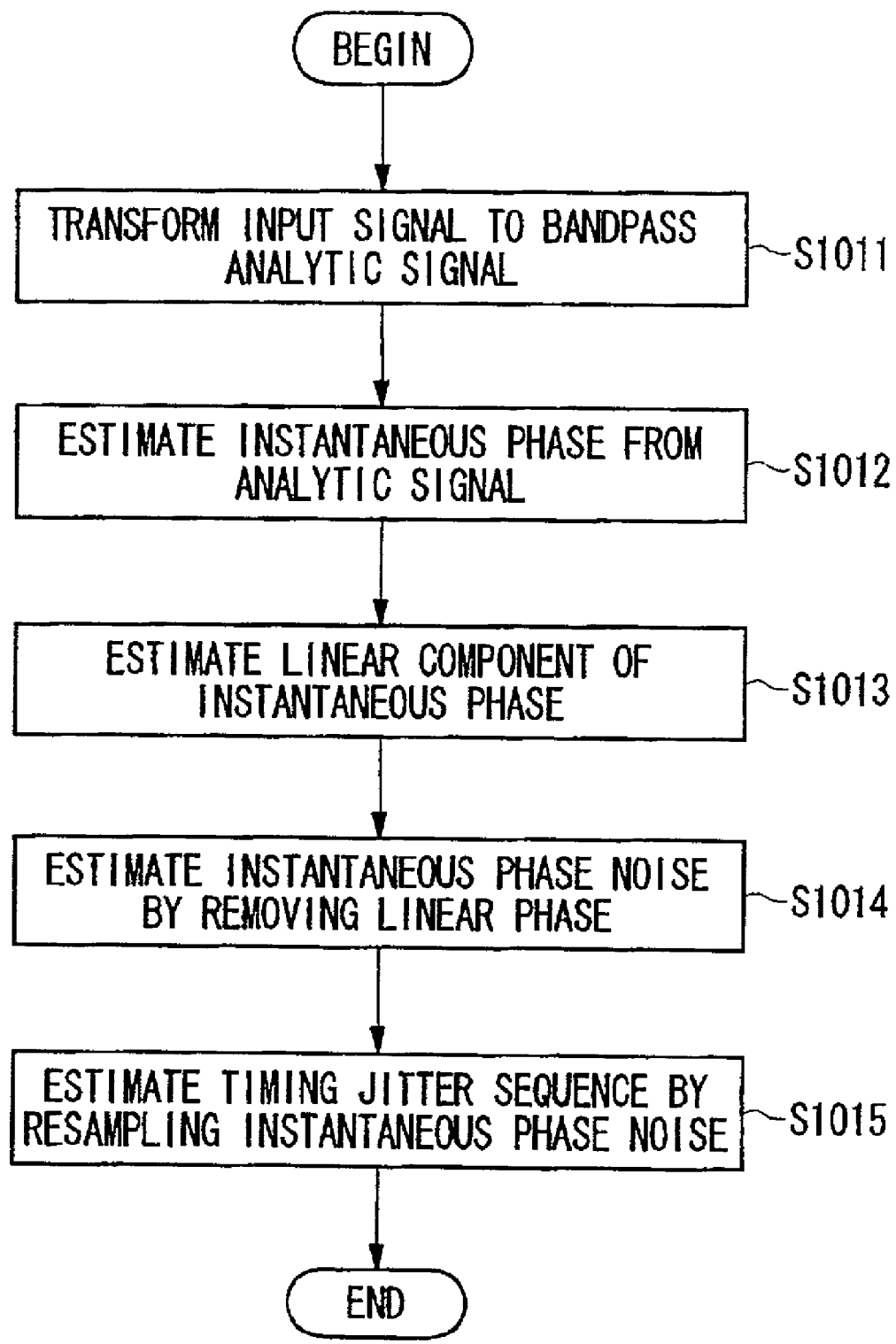
FIG. 8 is a flowchart of an example of Timing jitter calculation step S1010.

FIG. 8 is a flowchart showing an example of Timing jitter calculation step S1010. First, in Analytic signal transforming step S1011, the output signal, that was input, is transformed to the analytic signal. Step S1011 has a similar function to that of the analytic signal transformer 11 described referring to FIG. 7. Then, in Instantaneous phase estimation step S1012, the instantaneous phase of the analytic signal is estimated. Step S1012 has a similar function to that of the instantaneous phase estimator 12 described referring to FIG. 7.

Then, in Linear instantaneous phase estimation step S1013, the linear instantaneous phase is estimated. Step S1013 has a similar function to that of the linear instantaneous phase estimator 13 described referring to FIG. 7.

Then, in Linear phase removing step S1014, the instantaneous phase noise, that is obtained by removing the linear components from the instantaneous phase, is estimated. Step S1014 has a similar function to that of the linear trend remover 14 described referring to FIG. 7. Then, in Resampling step S1015, the instantaneous phase noise is resampled, so as to estimate the timing jitter sequence. Step S1015 has a similar function to that of the resampler 15 described referring to FIG. 7.

Figure 9:
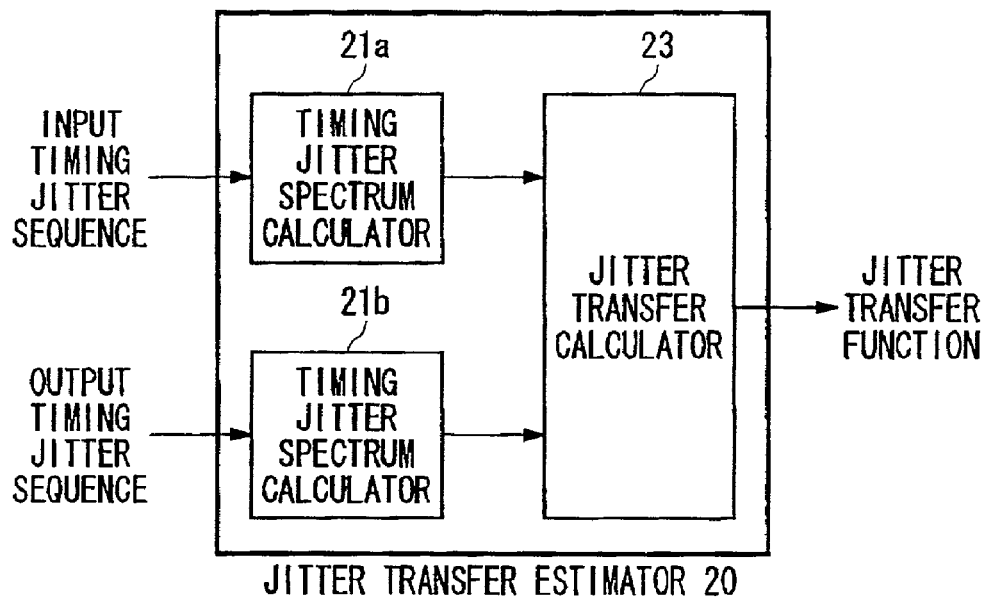
FIG. 9 illustrates an exemplary arrangement of a jitter transfer estimator 20.

FIG. 9 illustrates an exemplary arrangement of the jitter transfer function estimator 20. The jitter transfer function estimator 20 includes a plurality of timing jitter spectrum calculators 21 that are provided for the input signal and the output signal, respectively, and a jitter transfer function calculator 23.

Each timing jitter spectrum calculator 21 calculates frequency components of the timing jitter sequence of the associated one of the input and output signals. The timing jitter spectrum calculator 21 calculates the frequency components of the timing jitter sequence by, for example, Fourier transform.

The jitter transfer function calculator 23 calculates the jitter transfer function based on a ratio of the frequency component of the jitter in the timing jitter sequence of the input signal and the frequency component of the jitter in the timing jitter sequence of the output signal, the frequencies of both the jitters being approximately equal to each other. In this example, since the timing jitter having Gaussian distribution is incorporated into the input signal, the timing jitter sequences of the input and output signal have the frequency components that are not substantially zero in a broad band.

Therefore, the ratios of the frequency components can be calculated for a plurality of frequencies by a single measurement, so that the jitter transfer function can be calculated. For example, in a case where a sinusoidal jitter is incorporated into the input signal, only a ratio of the frequency components at a single frequency can be calculated by a single measurement. Thus, in order to calculate the jitter transfer function in the broad band, it is necessary to sweep the frequency of the sinusoidal jitter in a necessary frequency band so as to calculate the ratios of the frequency components in the timing jitter sequences. In the present example, it is not necessary to sweep the frequency and therefore the measurement time can be greatly reduced.

Figure 10:
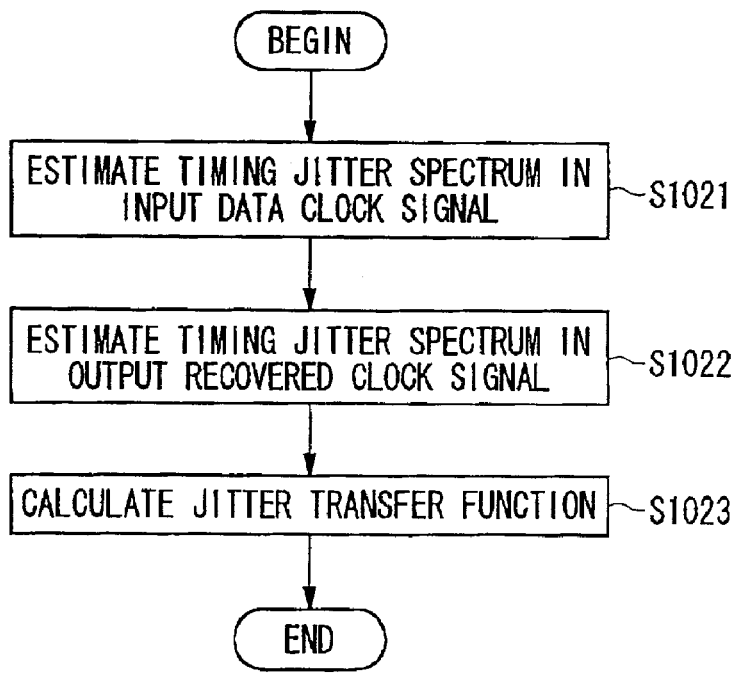
FIG. 10 is a flowchart of an example of Jitter transfer function estimation step S1020.

FIG. 10 is a flowchart showing an example of Jitter transfer function estimation step S1020. Jitter transfer function estimation step S1020 includes Input timing jitter spectrum calculation step S1021, Output timing jitter spectrum calculation step S1022 and Jitter transfer function calculation step S1023.

In Steps S1021 and S1022, the frequency components of the timing jitter sequences of the input and output signals are calculated, respectively. Each of Steps S1021 and S1022 may have a similar function to that of the timing jitter spectrum calculator 21 described referring to FIG. 9. Moreover, either one of Steps S1021 and S1022 may be performed prior to the other. Alternatively, both Steps S1021 and S1022 may be performed at the same time.

Then, in Step S1023, the jitter transfer function is calculated. Step S1023 has a similar function to that of the jitter transfer function calculator 23 described referring to FIG. 9.

Figure 11:
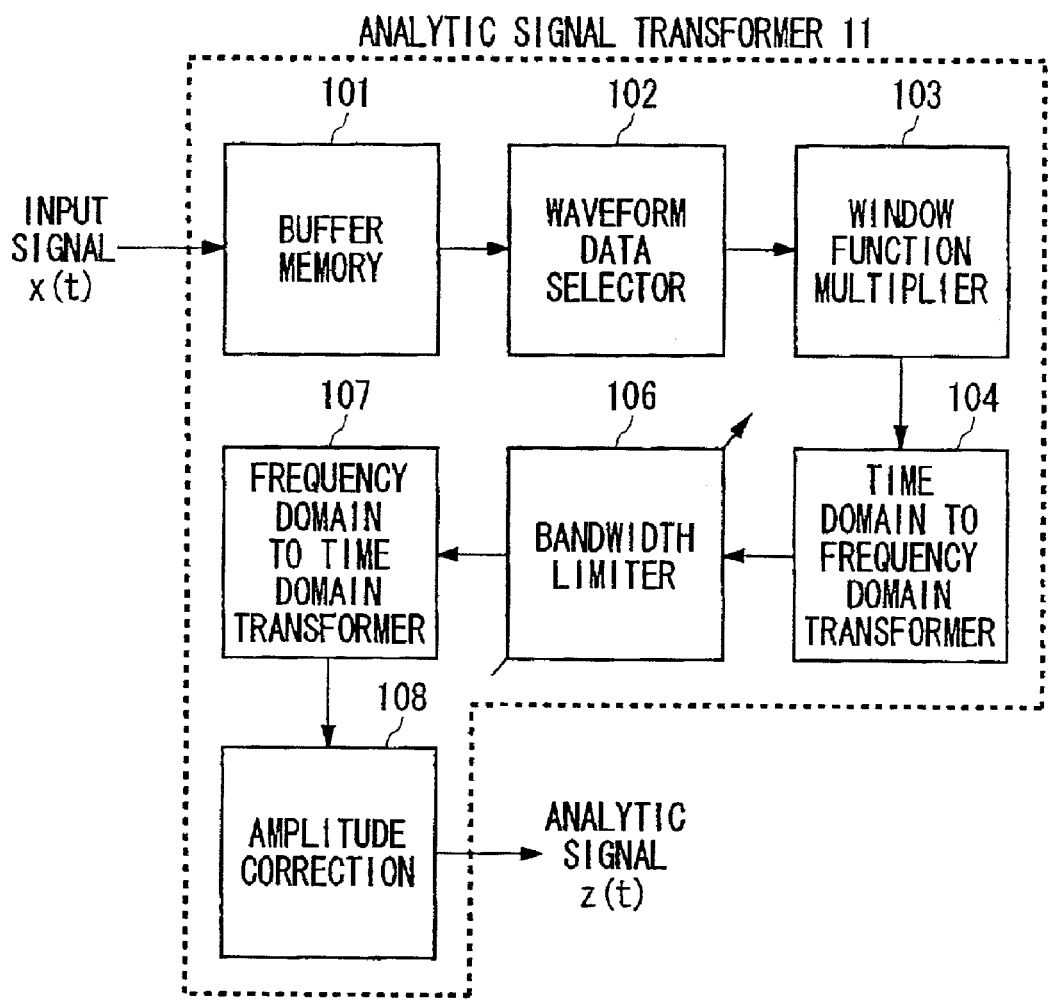
FIG. 11 illustrates an exemplary arrangement of an analytic signal transformer 11.

FIG. 11 illustrates an exemplary arrangement of the analytic signal transformer 11.

The analytic signal transformer 11 includes a buffer memory 101 for storing a received signal; an waveform data selector 102 for sequentially selecting a part of the signal stored in the buffer memory 101; an window function multiplier 103 for multiplying the signal part selected by the waveform data selector 102 by a predetermined window function; a time-domain to frequency-domain transformer 104 for transforming the signal part multiplied by the window function to a spectrum in frequency domain; a bandwidth limiter 106 for extracting frequency components around a fundamental frequency of a given signal; a frequency-domain to time-domain transformer 107 for transforming the frequency components extracted by the bandwidth limiter 106 to a signal in time domain; and an amplitude corrector 108 for multiplying the signal in time domain by a reciprocal of the window function so as to generate the analytic signal. The waveform data selector 102 selects the partial signal in such a manner that the currently selected partial signal partially overlaps the previously selected partial signal.

In a case where a part of a signal x(t) is multiplied by the window function, amplitude modulation is performed for the signal x(t). According to the analytic signal transformer 11, however, the amplitude modulation of the signal x(t) can be corrected by multiplying by the reciprocal of the window function in the amplitude corrector 108.

The window function multiplier 103 outputs a signal x(t)·w(t) obtained by multiplying the signal x(t) by the window function w(t) to the time-domain to frequency-domain transformer 104. The time-domain to frequency-domain transformer 104 transforms the received signal to a signal in frequency domain, and the bandwidth limiter 106 then outputs a spectrum Z(f) obtained by changing the negative frequency components of the frequency-domain signal to zero.

The frequency-domain to time-domain transformer 107 outputs a signal IFFT[Z(f)], that was obtained by transforming the spectrum Z(f) to a signal in time domain. In this example, the analytic signal transformer 11 may output a real part and an imaginary part of the signal output from the frequency-domain to time-domain transformer 107 as the real part and the imaginary part of the analytic signal, respectively. When the real and imaginary parts of the analytic signal are assumed to be $x_{real}(t)$ and $x_{imag}(t)$, respectively, they have the following relationship with the real and imaginary parts of the output signal from the frequency-domain to time-domain transformer 107, Re{IFFT[Z(f)]} and Im{IFFT[Z(f)]}.

$$w'(t)x_{real}(t) = Re\{IFFT[Z(f)]\}$$

$$w'(t)x_{imag}(t) = Im\{IFFT[Z(f)]\} \quad (2)$$

In Expression (2), w'(t) represents components of the window function (t) in the spectrum Z(f). The real part $x_{real}(t)$ and the imaginary part $x_{imag}(t)$ of the analytic signal are influenced by the amplitude modulation by the window function w(t) to substantially the same degree. Thus, the instantaneous phase of the signal x(t) is represented by the following expression.

$$\Delta\phi(t) = \tan^{-1}\left[\frac{\frac{w'(t)}{w(t)}x_{real}(t)}{\frac{w'(t)}{w(t)}x_{imag}(t)}\right] - 2\pi f_j t \approx \tan^{-1}\left[\frac{x_{real}(t)}{x_{imag}(t)}\right] - 2\pi f_j t \quad (3)$$

As indicated in Expression (3), in this example, a phase estimation error caused by the amplitude modulation by the window function can be cancelled in the real and imaginary parts in a case of calculating the instantaneous phase of the signal x(t). When the amplitude modulation by the window function occurred, the phase estimation error is generated by the amplitude modulation as follows.

$$\phi(t) = \tan^{-1}\left[\frac{w'(t)}{w(t)}\frac{\hat{x}(t)}{x(t)}\right] - 2\pi f_j t \quad (4)$$

In the present example, since the phase estimation error by $x_{real}(t)$ and $x_{imag}(t)$ can be cancelled, the instantaneous phase in which the phase estimation error by the amplitude modulation by the window function was removed can be calculated. That is, even in a case where the real part and the imaginary part of the output signal of the frequency-domain to time-domain transformer 107 are output as the real part Re{IFFT[Z(f)]} and the imaginary part Im{IFFT[Z(f)]} of the analytic signal, the instantaneous phase estimator 12 can calculate the instantaneous phase of the signal x(t) with high precision.

In a case where the real and imaginary parts of the signal from which the amplitude modulation components by the window function were removed are output as the real and imaginary parts of the analytic signal in the amplitude corrector 108, other analysis, test or the like can be performed for the DUT efficiently by using that analytic signal.

Next, the operation of the analytic signal transformer 11 is described. First, the buffer memory 101 stores a signal to be measured. Then, the waveform data selector 102 selects and extracts a part of the signal stored in the buffer memory 101. The window function multiplier 103 then multiplies the partial signal selected by the waveform data selector 102 by the window function. The time-domain to frequency-domain transformer 104 then performs FFT for the partial signal multiplied by the window function, so as to transform the time-domain signal to a two-sided spectrum in frequency domain. The bandwidth limiter 106 then replaces the negative frequency components of the two-sided spectrum in frequency domain with zero, and thereafter replaces frequency components other than the frequency components in the vicinity of a fundamental frequency of the signal to be measured with zero, thereby band-limiting the frequency-domain signal. Then, the frequency-domain to time-domain transformer 107 performs inverse FFT for the one-sided spectrum in frequency domain, that was band-limited, so as to transform the frequency-domain signal to a time-domain signal. The amplitude corrector 108 then multiplies the time-domain signal obtained by inverse transform by the reciprocal of the window function, so as to generate the band-limited analytic signal. The analytic signal transformer 11 then checks whether or not any unprocessed data is left in the buffer memory 101. If there is unprocessed data left in the buffer memory 101, the waveform data selector 102 selects and extracts a next part of the signal stored in the buffer memory 101. After the waveform data selector 102 selected and extracted the partial signal sequentially in such a manner that the currently selected partial signal overlaps the previously selected partial signal, the analytic signal transformer 11 repeats the aforementioned procedure.

Figure 12:
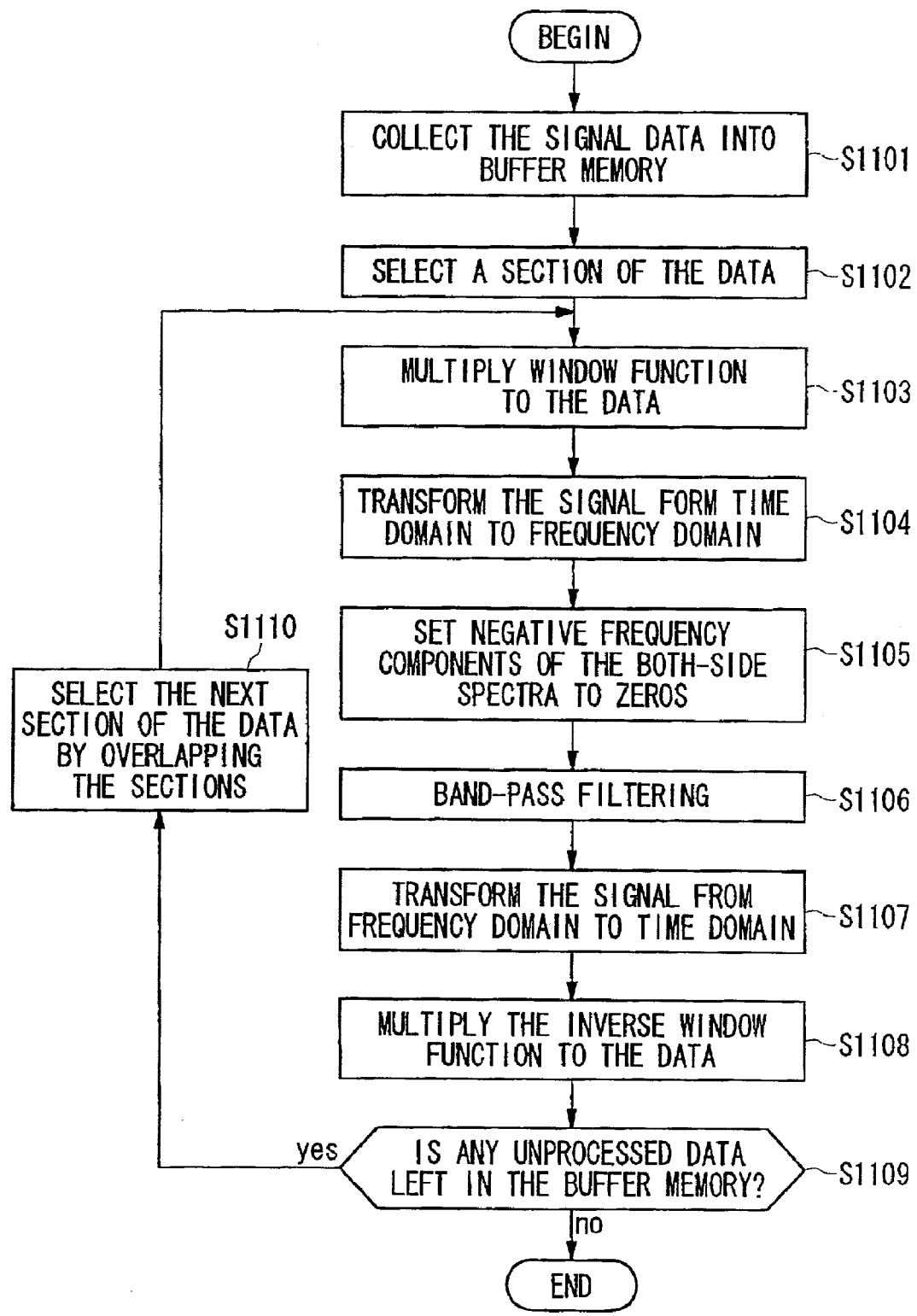
FIG. 12 is a flowchart of an example of Analytic signal transforming step S1011.

FIG. 12 is a flowchart showing an example of the analytic signal transform step S1011. First, in Buffer memory step S1101, the input signal or the output signal is stored. Step S1101 has a similar function to that of the buffer memory 101 described referring to FIG. 11. Then, in Waveform data selection step S1102, a section of the signal stored in Step S1101 is selected and extracted. Step S1102 has a similar function to that of the waveform data selector 102 described referring to FIG. 11.

Then, in Window function multiplying step S1103, the section selected in Step S1102 by a predetermined window function. Step S1103 may multiply the section, i.e., the partial signal, by Hanning function as the window function. Step S1103 has a similar function to that of the window function multiplier 103 described referring to FIG. 11.

Then, in Time-domain to frequency-domain transform step S1104, the signal multiplied by the window function is transformed from time domain to frequency domain. Step S1104 has a similar function to that of the time-domain to frequency-domain transformer 104 described referring to FIG. 11.

Then, in Negative component removing step S1105, negative frequency components of the signal transformed from time domain to frequency domain are removed. Step S1105 has a similar function to that of the bandwidth limiter 106 described referring to FIG. 11.

Then, in Bandwidth limiting step S1106, frequency components in the vicinity of the fundamental frequency of the transformed signal are extracted. Step S1106 has a similar function to that of the bandwidth limiter 106 described referring to FIG. 11.

Then, in Frequency-domain to time-domain transform step S1107, the band-limited signal is transformed to a signal in time domain. Step S1107 has a similar function to that of the frequency-domain to time-domain transformer 107 described referring to FIG. 11.

Then, in Amplitude correction step S1108, amplitude modulation components of the signal transformed from frequency domain to time domain are removed. Step S1108 has a similar function to that of the amplitude corrector 108 described referring to FIG. 11.

Then, in Decision step S1109, it is determined whether or not unprocessed data of the signal to be measured that was stored in Step S1101 is left. In a case where unprocessed data is left, the next section of the signal is extracted in Waveform data selection step S1110 in such a manner that the next section partially overlaps the previously extracted section. Step S1110 has a similar function to that of Step S1102. In another case where it was determined that all data was processed, the procedure is finished. Next, a calculation method of the timing jitter sequence in the timing jitter calculator 10 is described referring to a case of the output signal as an example.

Figure 13:
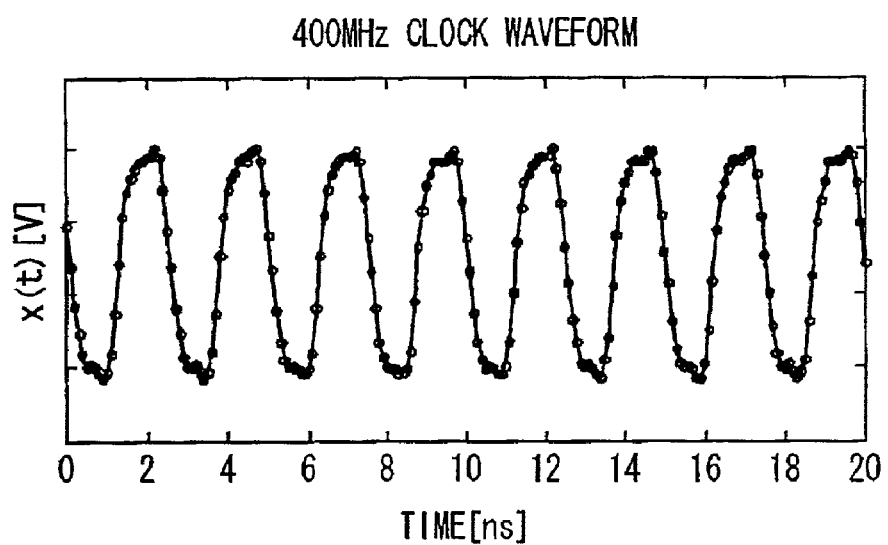
FIG. 13 shows an example of an output signal.

FIG. 13 shows an exemplary output signal. The output signal x(t) shown in FIG. 13 is preferably supplied to the timing jitter calculator 10 after being digitized. The time-domain to frequency-domain transformer 104 performs Fast Fourier Transform for the output signal, for example, so as to calculate a two-sided spectrum (having positive and negative frequency components) of the output signal X(f).

Figure 14:
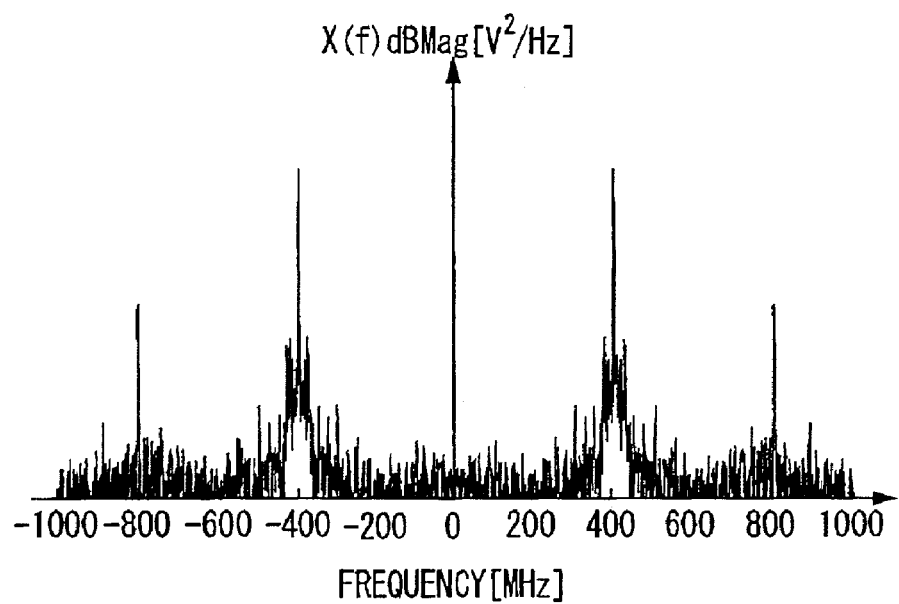
FIG. 14 shows an example of a two-sided spectrum.

FIG. 14 shows an exemplary two-sided spectrum. Next, the bandwidth limiter 106 replaces the frequency components other than the positive frequency components in the vicinity of the fundamental frequency of the two-sided spectrum X(f) with zero so as to leave only the positive frequency components in the vicinity of the fundamental frequency and thereafter doubles the left positive frequency components. These operations performed in frequency domain correspond to band-limiting the signal to be measured in time domain and transforming the band-limited signal to the analytic signal.

Figure 15:
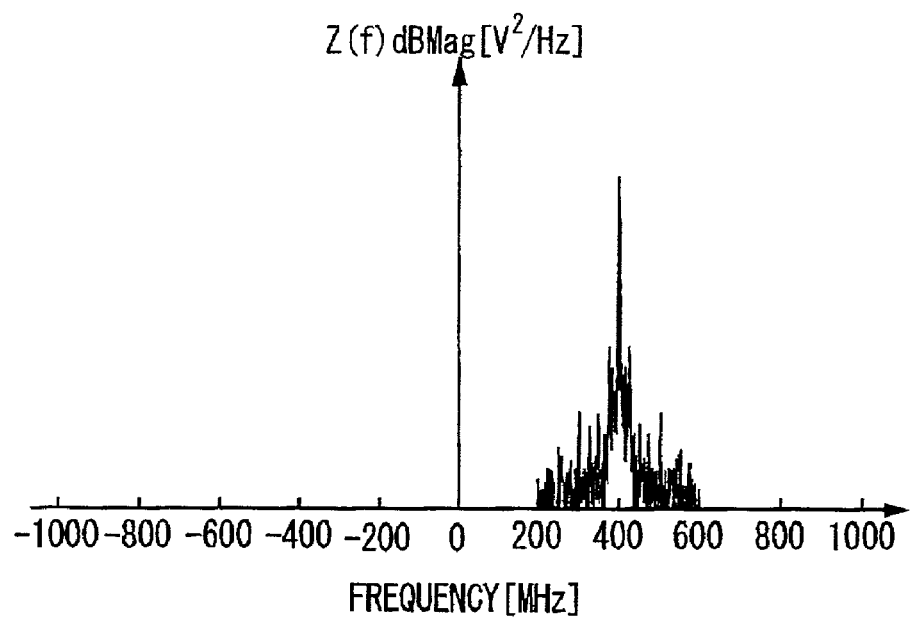
FIG. 15 shows an example of a frequency domain signal Z(f) obtained by transform.

FIG. 15 shows an exemplary frequency-domain signal Z(f) obtained by transforming the signal X(f). The frequency-domain to time-domain transformer 107 then performs inverse Fast Fourier Transform for the signal Z(f) so as to calculate the band-limited analytic signal z(t).

Figure 16:
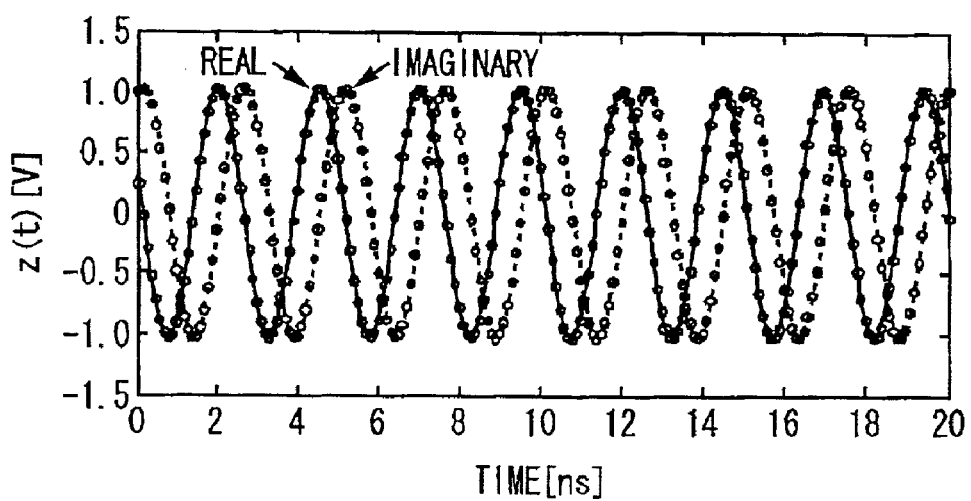
FIG. 16 shows an example of an analytic signal z(t) that was band-limited.

FIG. 16 shows an exemplary band-limited analytic signal z(t). Transform to the analytic signal using FFT is described in J. S. Bendat and A. G. Piersol, Random Data: Analysis and Measurement Procedure, 2nd edition, John Wiley & Sons, Inc., 1986, for example. Please note that the operation for doubling the positive frequency components can be omitted in a case where the objective is to calculate the instantaneous phase. The obtained analytic signal has been subjected to the band-pass filtering operation. This is because only the signal components in the vicinity of the fundamental frequency of the signal to be measured are processed in jitter analysis since the jitter corresponds to the fluctuation of the fundamental frequency of the signal to be measured.

Then, the instantaneous phase estimator 12 estimates the instantaneous phase from the analytic signal. The instantaneous phase waveform $\phi(t)$ of the real signal x(t) can be calculated from the analytic signal z(t) in accordance with the following equation.

$$x(t) = A\cos\left(\frac{2\pi}{T_0}t + \phi_0 - \Delta\phi(t)\right) \quad (5)$$

$$z(t) = x(t) + j\hat{x}(t)$$

$$\phi(t) = \tan^{-1}\left[\frac{\hat{x}(t)}{x(t)}\right]$$

The calculated instantaneous phase is represented with the following equation.

$$\phi(t) = \left[\frac{2\pi}{T_0}t + \phi_0 - \Delta\phi(t)\right] \bmod 2\pi \quad [\text{rad}] \quad (6)$$

Please note that $\phi(t)$ is represented by using a principal value having a phase in the range from $-\pi$ to $+\pi$ and has a discontinuous point near a changing point at which $\phi(t)$ changes from $+\pi$ to $-\pi$.

Figure 17:
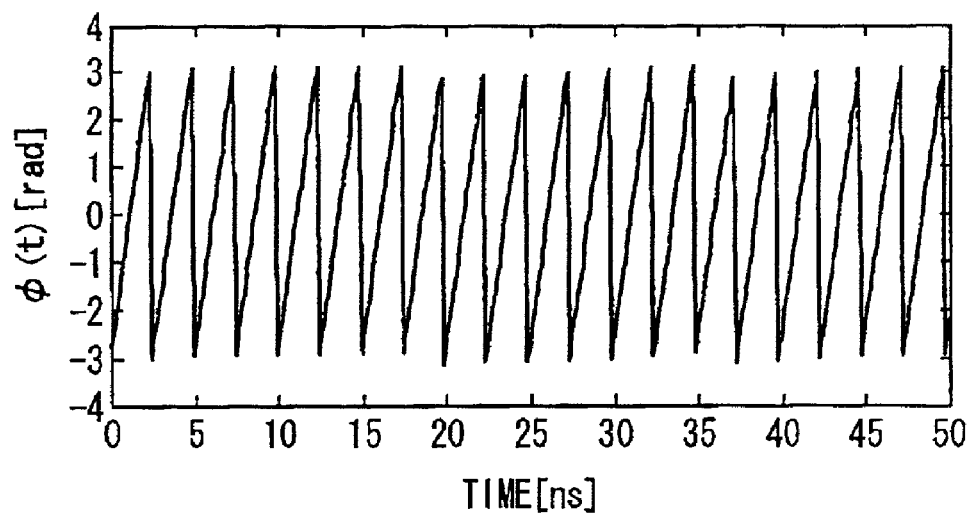
FIG. 17 shows an example of an instantaneous phase waveform $\phi(t)$.

FIG. 17 shows an exemplary instantaneous phase waveform $\phi(t)$. Next, by unwrapping the discontinuous instantaneous phase waveform $\phi(t)$ (that is, appropriately adding an integral multiple of $2\pi$ to the principal value $\phi(t)$), the discontinuity can be removed so that a discontinuous instantaneous waveform $\phi(t)$ is obtained.

$$\phi(t) = \frac{2\pi}{T_0}t + \phi_0 - \Delta\phi(t) \quad (7)$$

The phase unwrapping method is described in Donald G. Childers, David P. Skinner and Robert C. Kemerait, "The Cepstrum: A Guide to Processing," Proceedings of IEEE, vol. 65, pp. 1428–1442, 1977.

Figure 18:
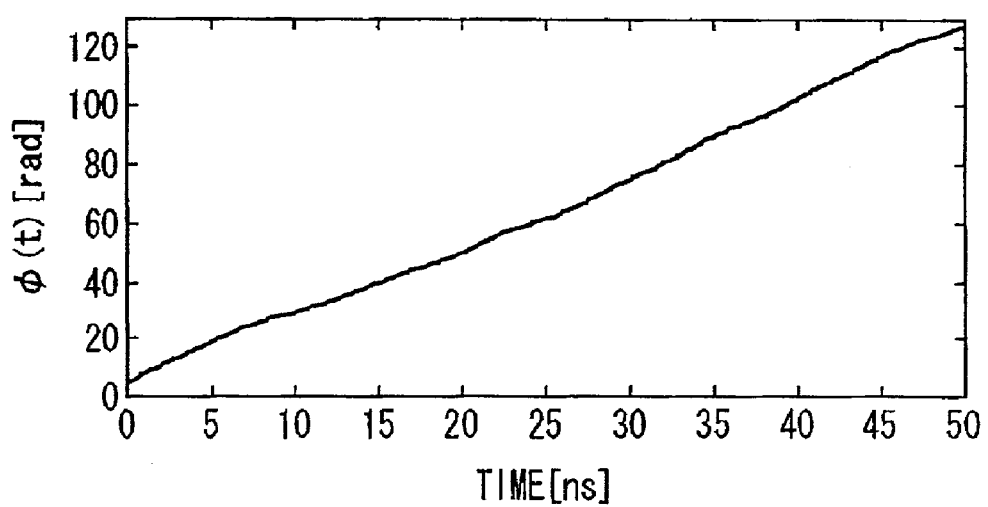
FIG. 18 shows an example of the continuous instantaneous phase waveform $\phi(t)$ that was unwrapped.

FIG. 18 shows an example of the unwrapped continuous instantaneous phase waveform $\phi(t)$. Next, the linear instantaneous phase estimator 13 estimates the linear instantaneous phase based on the unwrapped instantaneous phase. Please note the linear instantaneous phase described here is an instantaneous phase of an ideal signal having no jitter. That is, the linear instantaneous phase estimator 13 calculates linear components of the instantaneous phase. Then, the linear trend remover 14 generates the instantaneous phase noise obtained by removing the linear instantaneous phase from the instantaneous phase.

Figure 19:
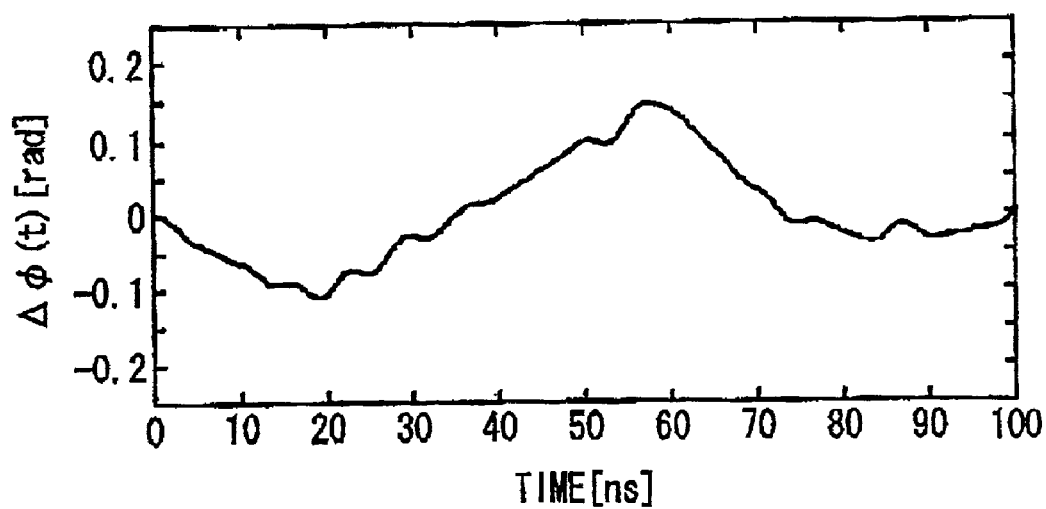
FIG. 19 shows an example of an instantaneous phase noise.

FIG. 19 shows an example of the instantaneous phase noise. Then, the resampler 15 resamples the instantaneous phase noise at the zero-crossing times of the real part of the analytic signal, thereby generating the timing jitter sequence.

Figure 20:
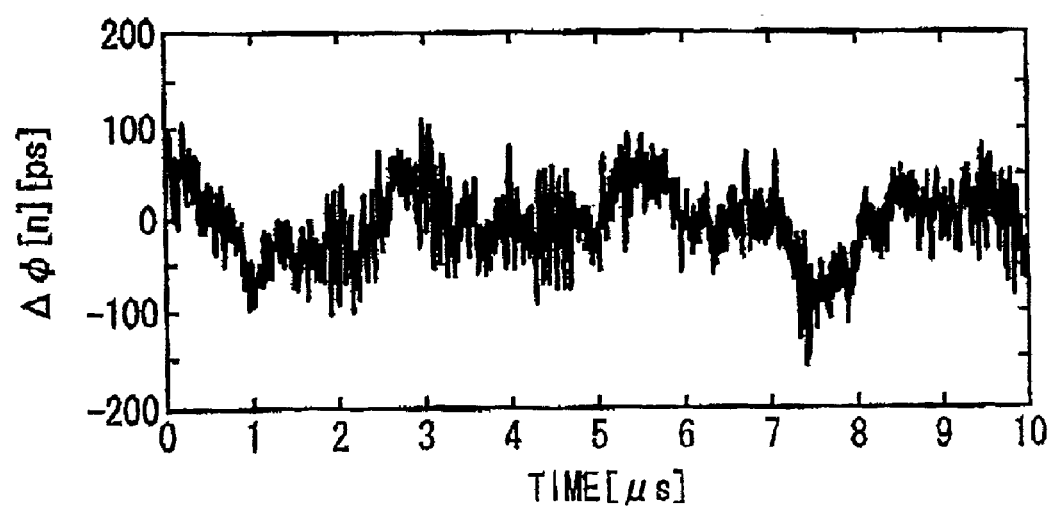
FIG. 20 shows an example of a timing jitter sequence.

FIG. 20 shows an example of the timing jitter sequence. Then, the jitter transfer function estimator 20 calculates the jitter transfer function based on the timing jitter sequences of the input signal and the output signal. Each of the timing jitter spectrum calculators 21 performs Fourier Transform for the timing jitter sequence of the corresponding one of the input and output signals, so as to calculate the frequency components.

Figure 21:
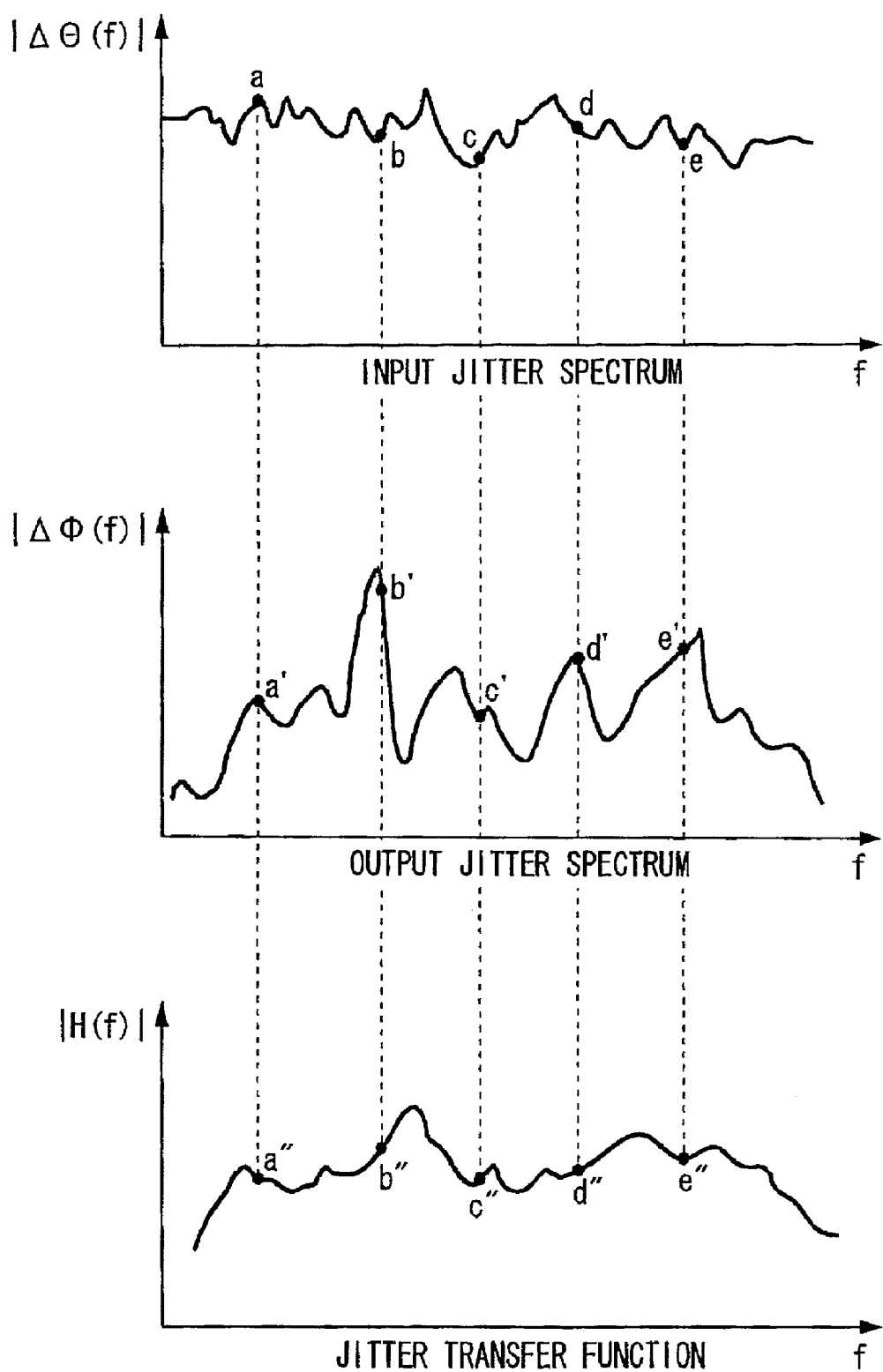
FIG. 21 shows an example of frequency components of timing jitter sequences of input and output signals and a jitter transfer function.

FIG. 21 shows an example of the frequency components of the timing jitter sequences of the input and output signals and an example of the jitter transfer function. As shown in FIG. 21, the jitter transfer function calculator 23 calculates a ratio of the frequency component of the input timing jitter sequence and the frequency component of the output timing jitter, both the frequency components corresponding to frequencies approximately equal to each other. For example, in the input timing jitter sequence, the frequency components indicated with a, b, c, d and e are calculated. Similarly, in the output timing jitter sequence, the frequency components indicated with a', b', c', d' and e' are calculated. Then, based on the ratios of the input timing jitter sequence to the corresponding frequency components of the output timing jitter sequence, frequency components a", b", c", d" and e" of the jitter transfer function are respectively calculated.

The jitter transfer function calculator 23 may calculate the jitter transfer function in a necessary frequency region. In this example, the jitter transfer function calculator 23 calculates the frequency component ratio for each of five frequencies. In an another example, however, it is preferable that the frequency component ratio be calculated for more frequencies so that the jitter transfer function is calculated based on the thus calculated frequency component ratios.

As described before, according to the measuring apparatus 100 of the present example, the jitter transfer function at a desired frequency can be calculated efficiently. Moreover, the jitter transfer function estimator may discriminate the frequencies to estimate the jitter transfer function between the input and output timing jitters at each jitter frequency, or may estimate a mean value of the jitter transfer function in a desired frequency region without discriminating the frequencies. Furthermore, in a case where the frequencies are not discriminated, the jitter transfer function estimator may include a unit operable to obtain the mean value of the jitter transfer function in the desired frequency region. In addition, the jitter transfer function estimator 20 may output a reciprocal of the calculated jitter transfer function as the jitter transfer function when a gain of the estimated jitter transfer function is larger than 1.0. Also, the jitter transfer function estimator 20 may include a unit operable to calculate the reciprocal of the jitter transfer function.

Figure 22:
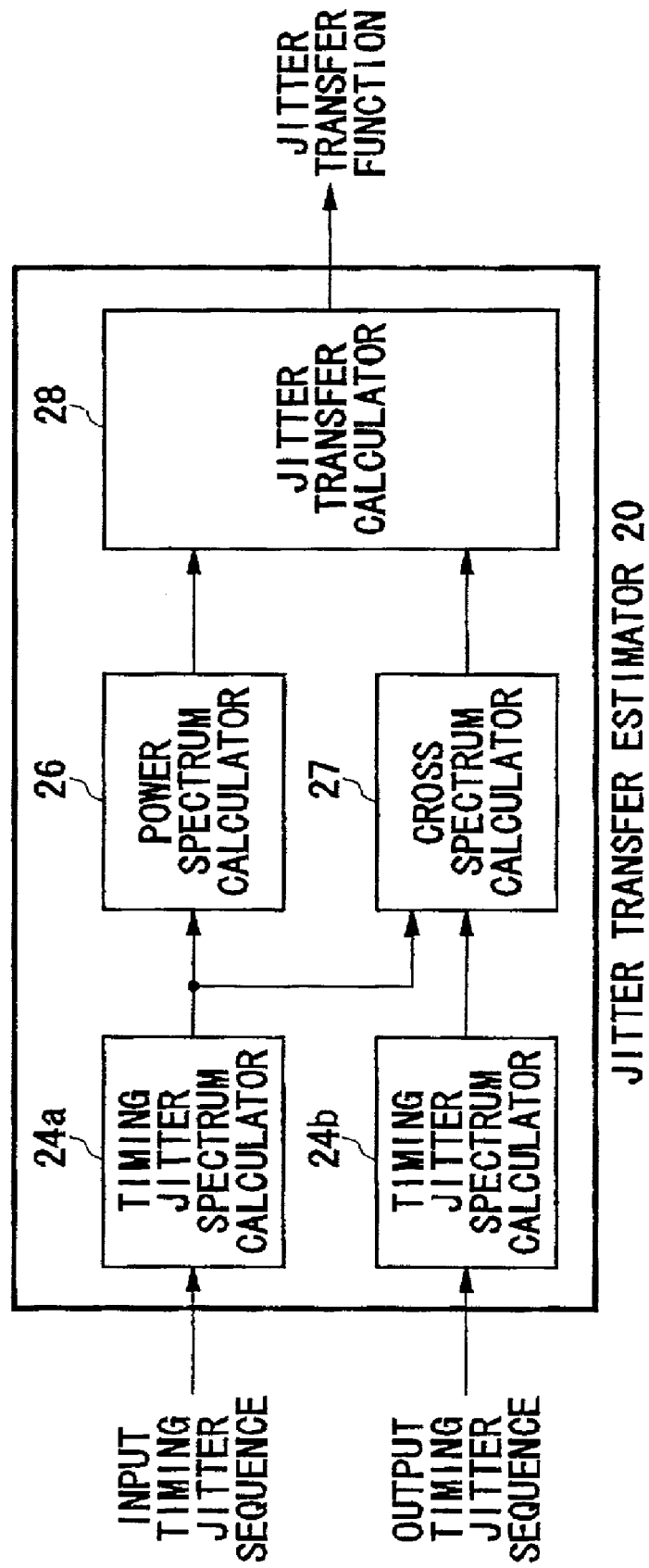
FIG. 22 illustrates another exemplary arrangement of the jitter transfer function estimator 20.

FIG. 22 illustrates another exemplary arrangement of the jitter transfer function estimator 20. In this example, the jitter transfer function estimator 20 includes timing jitter spectrum calculators 24a and 24b, a power spectrum calculator 26, a cross spectrum calculator 27 and a jitter transfer function calculator 23. The timing jitter spectrum calculators 24a and 24b have the same or similar function and arrangement as/to that of the timing jitter spectrum calculator 21 described referring to FIG. 9.

The power spectrum calculator 26 calculates a power spectrum of the input signal based on a spectrum of the timing jitter sequence of the input signal. The power spectrum calculator 26 may calculate a power spectrum of the timing jitter sequence of the output signal. The cross spectrum calculator 27 calculates a cross spectrum of the input and output timing jitter sequences based on the spectra of the timing jitter sequences of the input and output signals.

The jitter transfer function calculator 23 calculates the jitter transfer function based on a ratio of the power spectrum calculated by the power spectrum calculator 26 to the cross spectrum calculated by the cross spectrum calculator 27.

That is, the jitter transfer function calculator 23 calculates the jitter transfer function in accordance with the following equation.

$$|H_j[f_j]| = \frac{|\Delta\Phi[f_j]\Delta\Theta*[f_j]|}{\Delta\Theta[f_j]\Delta\Theta*[f_j]} \quad (8)$$

In Equation (8), $H_j[f_j]$ represents the jitter transfer function; $\Delta\Phi(f_j)$ represents the spectrum of the output timing jitter; and $\Delta\Theta[f_j]$ represents the spectrum of the input timing jitter. When an output timing jitter spectrum of the DUT is represented by using the jitter transfer function, $$\Delta\Phi[f_j]=H_j[f_j]\Delta\Theta[f_j] \quad (9)$$

is obtained. According to the present example, by estimating the jitter transfer function by using the cross spectrum $\Delta\Phi[f_j]\Delta\Theta^*[f_j]$ between the input timing jitter $\Delta\theta[n]$ and the output timing jitter $\Delta\phi[n]$, effects of an extraneous noise at the output can be reduced.

Figure 23:
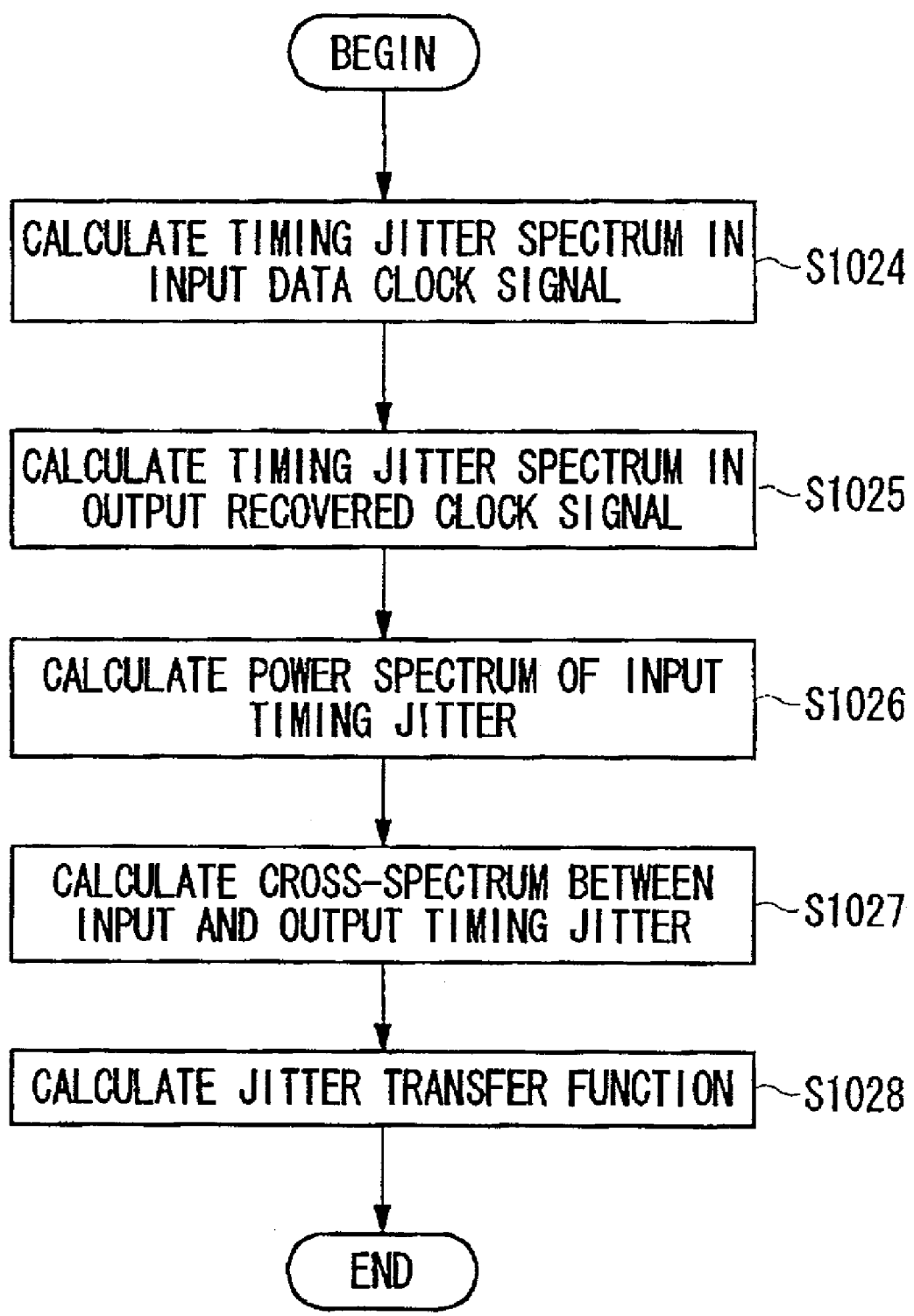
FIG. 23 is a flowchart of another example of Jitter transfer function estimation step S1020.

FIG. 23 is a flowchart showing another example of Jitter transfer function estimation step S1020. First, in Timing jitter spectrum calculation steps S1024 and S1025, the spectrum of the input timing jitter sequence and the spectrum of the output timing jitter sequence are respectively generated. Steps S1024 and S1025 have similar functions to those of the timing jitter spectrum calculators 24a and 24b described referring to FIG. 22.

In Step S1026, the power spectrum of the input timing jitter sequence is calculated. Step S1026 has a similar function to that of the power spectrum calculator 26 described referring to FIG. 22.

In Step S1027, the cross spectrum between the input timing jitter sequence and the output timing jitter sequence is calculated. Step S1027 has a similar function to that of the cross spectrum calculator 27 described referring to FIG. 22.

In Step S1028, the jitter transfer function is calculated. Step S1028 has a similar function to that of the jitter transfer function calculator 23 described referring to FIG. 22.

Figure 24:
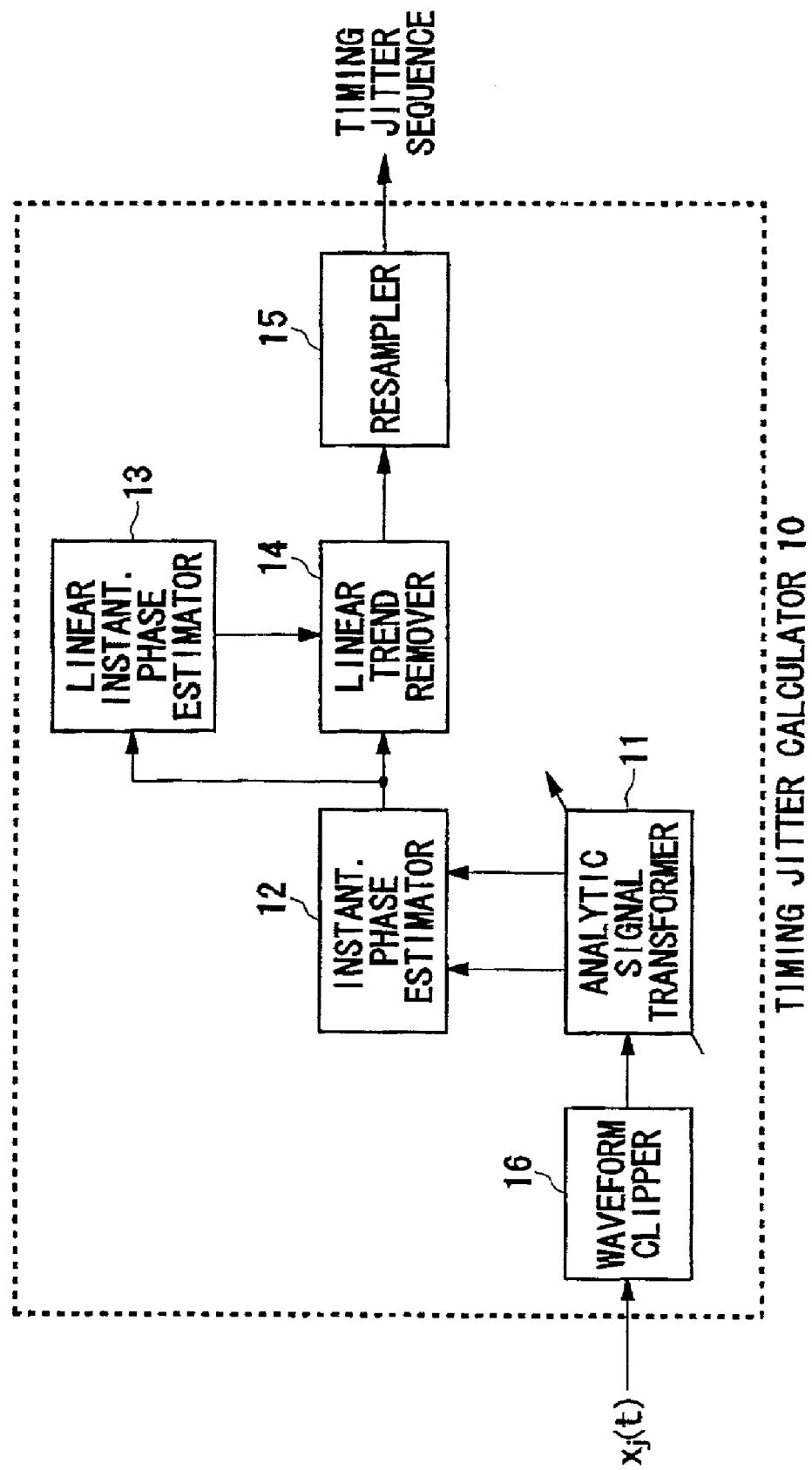
FIG. 24 is a flowchart of another example of Jitter transfer function estimation step S1020.

FIG. 24 illustrates another exemplary arrangement of the timing jitter calculator 10. In the present example, the timing jitter calculator 10 includes the arrangement of the timing jitter calculator described referring to FIG. 7 and further includes a waveform clipper 16. The waveform clipper 16 removes the amplitude modulation components of the signal the timing jitter calculator 10 received and supplies the resultant signal to the analytic signal transformer. According to the present example, the jitter caused only by the phase modulation components can be detected by removing amplitude modulation components of the input and output signals. Thus, the bit error rate or the like can be calculated with high precision.

Figure 25:
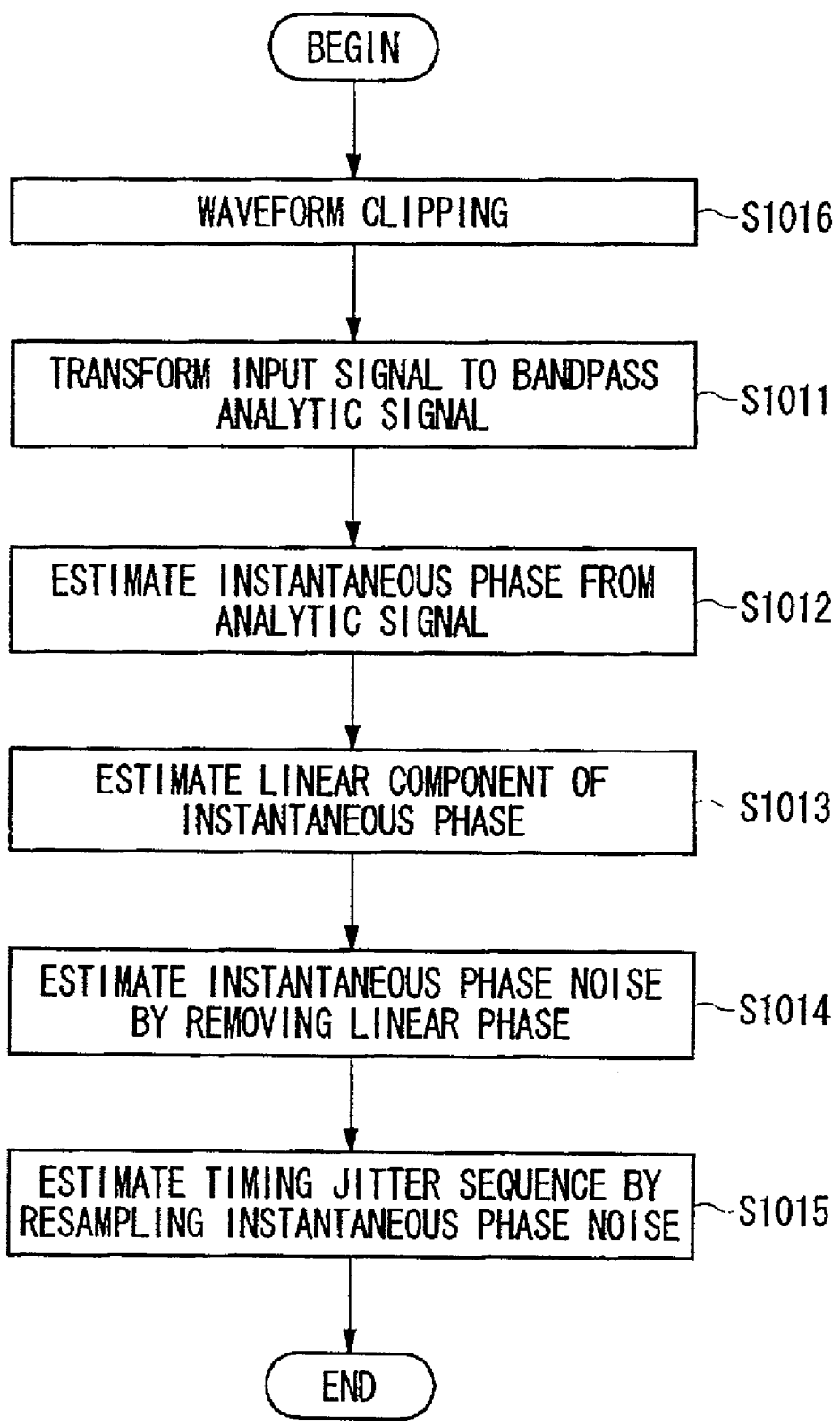
FIG. 25 is a flowchart of another example of Timing jitter calculation step S1010.

FIG. 25 is a flowchart showing another example of Timing jitter calculation step S1010. Step S1010 in the present example includes Waveform clipping step S1016 in addition to Step S1010 described referring to FIG. 8.

In Step S1016, the amplitude modulation components of the input signal and the output signal are removed. Step S1016 has a similar function to that of the waveform clipper 16 described referring to FIG. 24.

Figure 26:
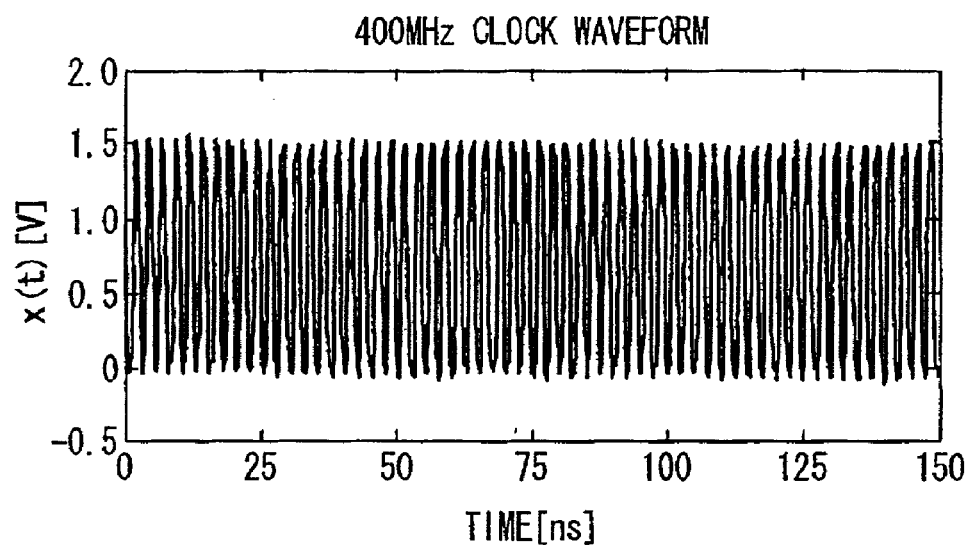
FIG. 26 shows an example of an output signal of a DUT.
Figure 27:
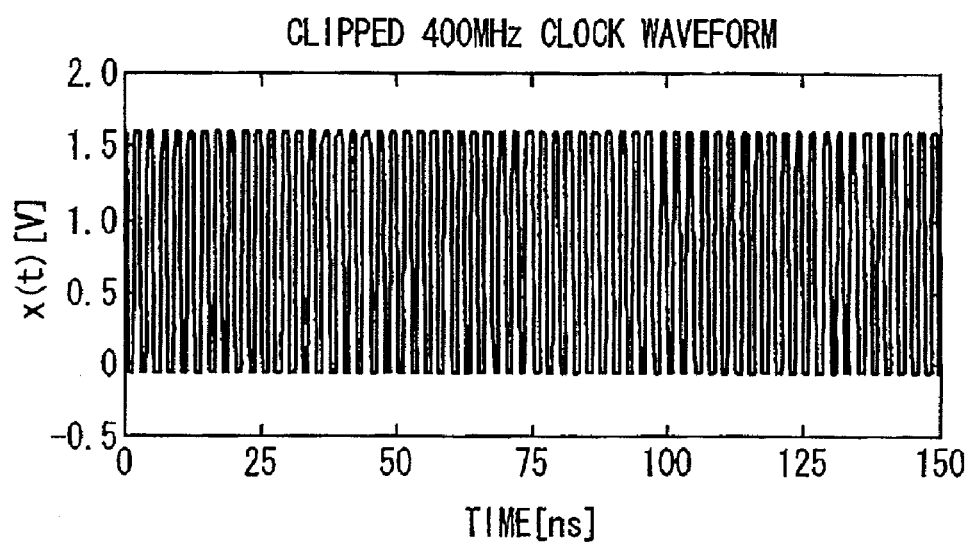
FIG. 27 shows an example of the output signal from which amplitude modulation components were removed.

FIGS. 26 and 27 are diagrams explaining the operation of the waveform clipper 16. FIG. 26 shows an example of the output signal from the DUT. The waveform clipper 16 multiplies signal values of the output signal by a predetermined value. When the value obtained by the multiplication is larger than a predetermined threshold value, the value obtained by the multiplication is replaced with the predetermined value. In this way, the amplitude modulation component can be removed. FIG. 27 shows an example of the output signal from which the amplitude modulation components were removed.

Figure 28:
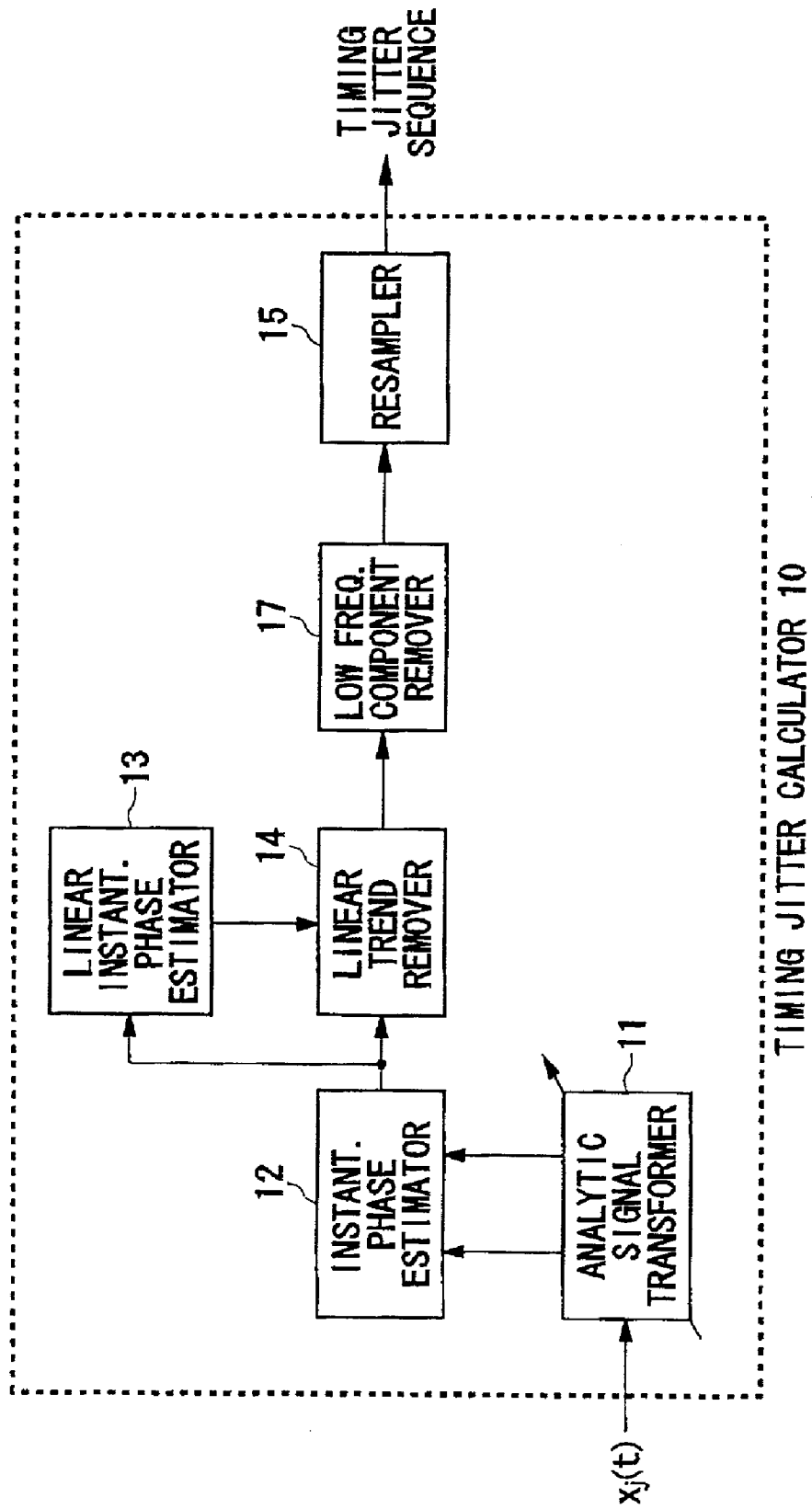
FIG. 28 illustrates another exemplary arrangement of the timing jitter calculator 10.

FIG. 28 illustrates another exemplary arrangement of the timing jitter calculator 10. In the present example, the timing jitter calculator 10 includes the arrangement of the timing jitter calculator 10 described referring to FIG. 7 and further includes a low frequency component remover 17. The low frequency component remover 17 outputs the instantaneous phase noise after removing from the instantaneous phase noise the low frequency components thereof. By removing the low frequency components of the instantaneous phase noise, the gain of the jitter transfer function can be calculated with higher precision.

Figure 29:
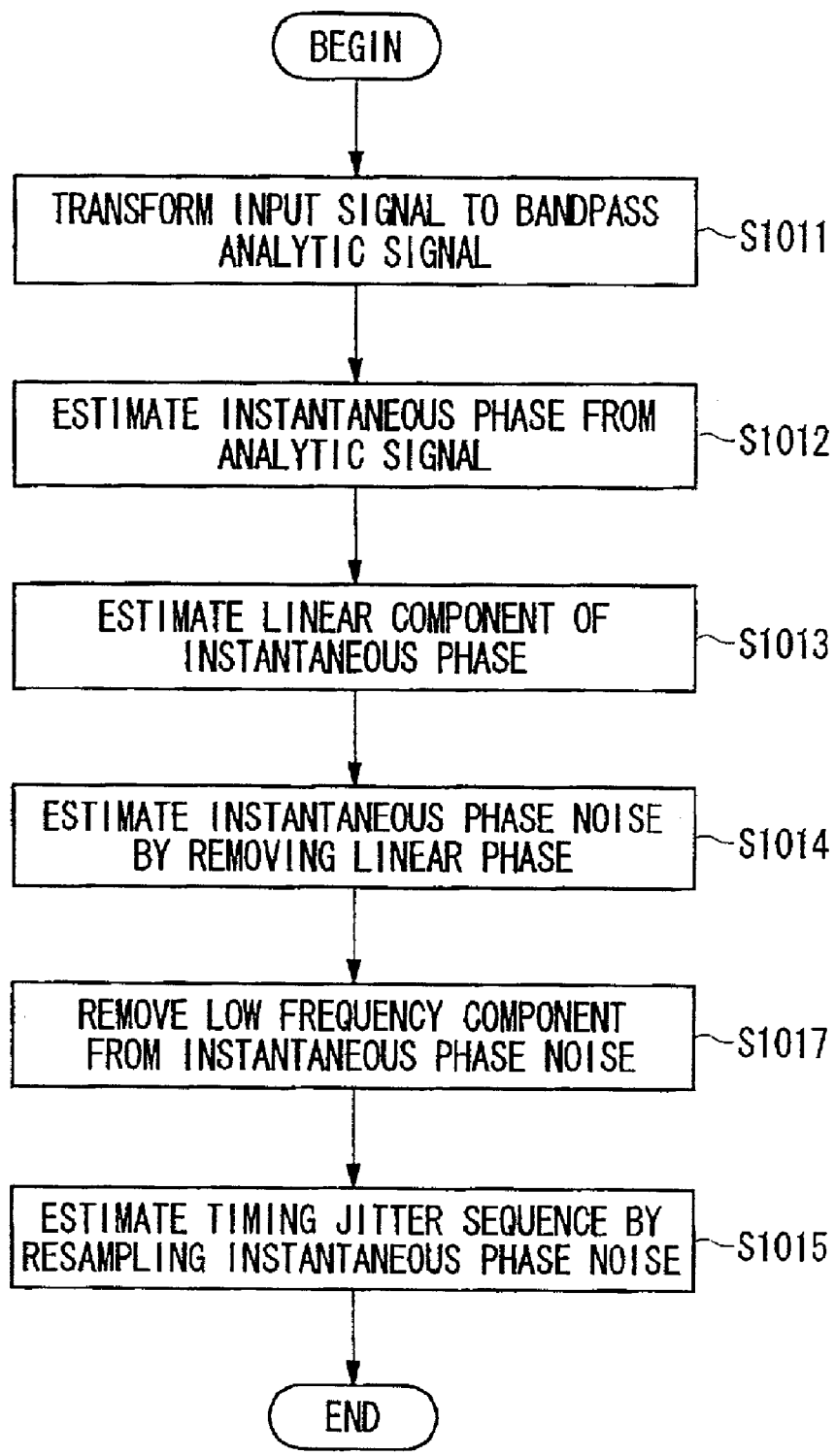
FIG. 29 is a flowchart of other example of Timing jitter calculation step S1010.

FIG. 29 is a flowchart showing another example of Timing jitter calculation step S1010. Step S1010 in the present example includes Low frequency component removing step S1017 in addition to Step S1010 described referring to FIG. 8. Step S1017 removes the low frequency components of the instantaneous phase noise. Step S1017 has a similar arrangement to that of the low frequency component remover 17 described referring to FIG. 28.

Figure 30:
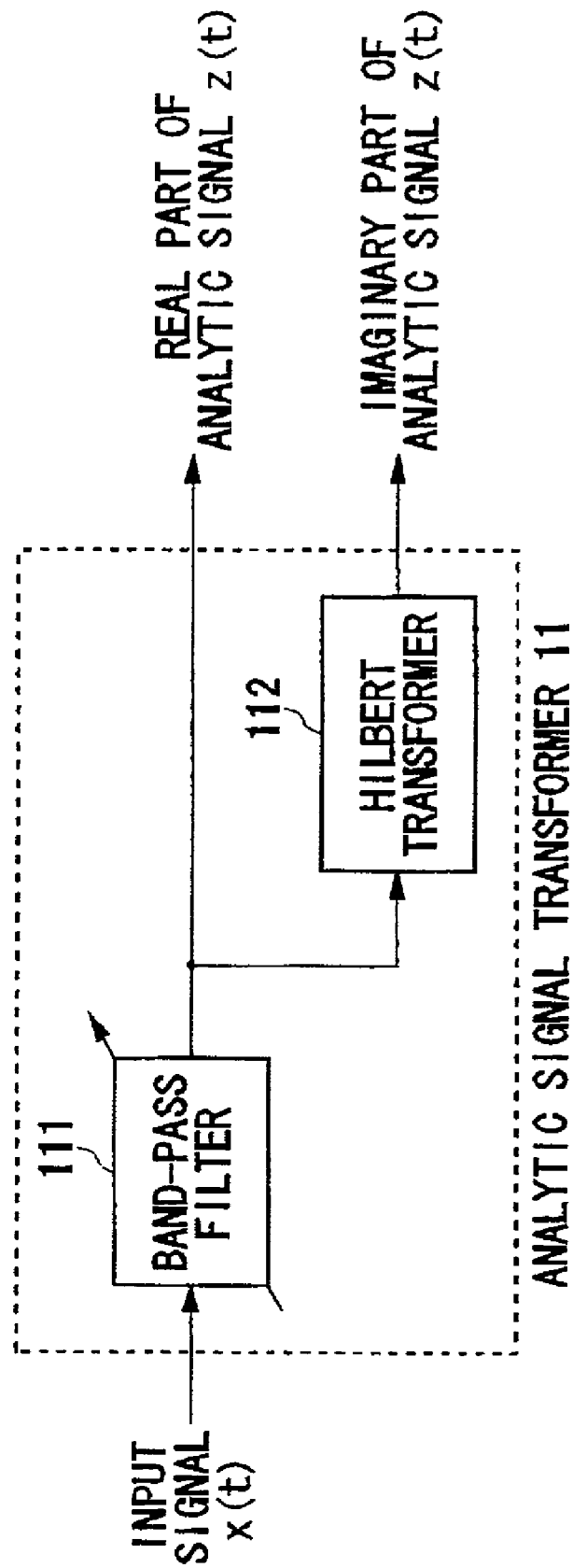
FIG. 30 illustrates another exemplary arrangement of the analytic signal transformer 11.

FIG. 30 illustrates another exemplary arrangement of the analytic signal transformer 11. In this example, the analytic signal transformer 11 includes a band-pass filter 111 and a Hilbert transformer 112.

The band-pass filter 111 generates a band-limited signal obtained by extracting the frequency components around the fundamental frequency of the input or output signal. The band-pass filter 111 may be an analog filter or a digital filter, or may be implemented by digital signal processing such as FFT. Moreover, the band-pass filter 111 may be formed so as to allow the pass band to be freely changed.

The Hilbert transformer 112 performs Hilbert transform for the band-limited signal so as to generate a Hilbert pair. The analytic signal transformer 11 outputs the band-limited signal as the real part of the analytic signal and also outputs the Hilbert pair as the imaginary part of the analytic signal.

According to the analytic signal transformer 11 in the present example, the analytic signal based on the fundamental frequency of the received signal can be generated. Thus, the jitter transfer function can be calculated with high precision. Next, the generation of the analytic signal using Hilbert transform is described.

The analytic signal $z(t)$ of the real signal $x(t)$ is defined by the following complex signal.

$$z(t) = x(t) + j\hat{x}(t) \quad (10)$$

Please note that j is an imaginary unit and an imaginary part $\hat{x}(t)$ of the complex signal $z(t)$ is Hilbert transform of the real part $x(t)$.

On the other hand, Hilbert transform of the time-domain waveform $x(t)$ is defined by the following equation.

$$\hat{x}(t) = H[x(t)] = \frac{1}{\pi}\int_{-\infty}^{+\infty}\frac{x(\tau)}{t-\tau}d\tau \quad (11)$$

In the above, $\hat{x}(t)$ is convolution of the functions $x(t)$ and $(1/\pi t)$. That is, Hilbert transform is equivalent to the output obtained when $x(t)$ is made to pass through an all-band-pass filter. Although the output $\hat{x}(t)$ is the same in the magnitude of the spectrum component, the phase thereof is shifted by $\pi/2$.

The analytic signal and Hilbert transform are described in A. Papoulis, Probability, Random Variables, and Stochastic Processes, 2nd edition, MacGraw-Hill Book Company, 1984, for example.

The instantaneous phase waveform $\phi(t)$ of the real signal $x(t)$ is obtained from the analytic signal $z(t)$ in accordance with the following equation.

$$\phi(t) = \tan^{-1}\left[\frac{\hat{x}(t)}{x(t)}\right] \quad (12)$$

The output signal $x(t)$ is given by the following equation.

$$x(t) = A\cos\left(\frac{2\pi}{T_0}t + \phi_0 - \Delta\phi(t)\right) \quad (13)$$

By applying Hilbert transform to the above equation so as to obtain a signal $$\hat{x}(t) = H[x(t)] = A\sin\left(\frac{2\pi}{T_0}t + \phi_0 - \Delta\phi(t)\right) \quad (14)$$

that corresponds to the imaginary part of the complex signal, the signal $x(t)$ is transformed to the analytic signal $$z(t) = x(t) + j\hat{x}(t) \quad (15)$$
$$= A\cos\left(\frac{2\pi}{T_0}t + \phi_0 - \Delta\phi(t)\right) + jA\sin\left(\frac{2\pi}{T_0}t + \phi_0 - \Delta\phi(t)\right)$$

The thus obtained analytic signal has been subjected to the band-pass filtering by the band-pass filter 111. Thus, the jitter corresponding to the fluctuation of the fundamental frequency of the signal to be measured can be calculated with high precision.

Figure 31:
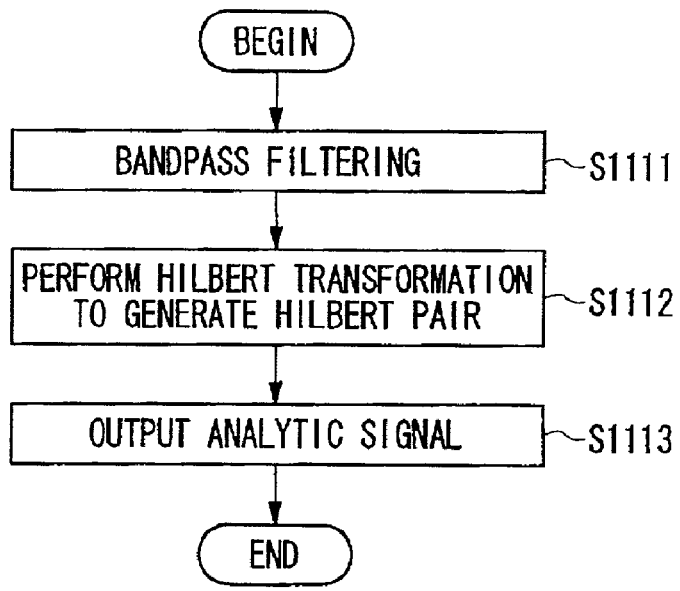
FIG. 31 is a flowchart of another example of Analytic signal transforming step S1011.

FIG. 31 is a flowchart showing another example of Analytic signal transforming step S1011. Step S1011 includes Band-pass filtering step S1111, Hilbert transform step S1112 and Output step S1113.

First, the band-limited signal, that is obtained by limiting the band of the input or output signal, is generated in Step S1111. Step S1111 has a similar function to that of the band-pass filter 111 described referring to FIG. 30.

Then, in Step S1112, the Hilbert pair of the band-limited signal is generated. Step S1112 has a similar function to that of the Hilbert transformer 112 described referring to FIG. 30.

Then, in Step S1113, the band-limited signal is output as the real part of the analytic signal, while the Hilbert pair is output as the imaginary part of the analytic signal.

Figure 32:
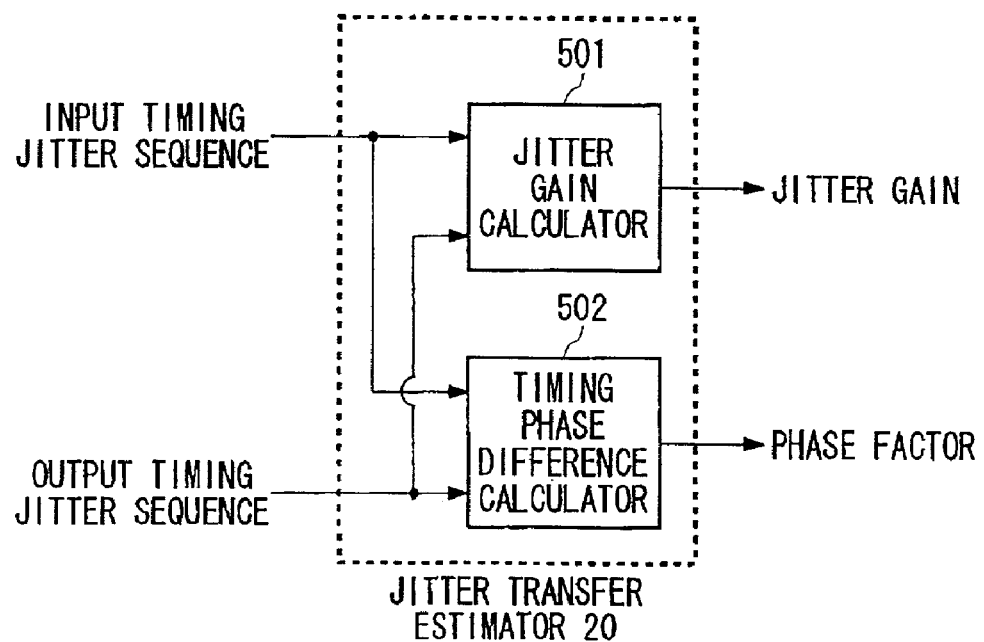
FIG. 32 illustrates another exemplary arrangement of the jitter transfer function estimator 20.

FIG. 32 illustrates another exemplary arrangement of the jitter transfer function estimator 20. The jitter transfer function estimator 20 includes a gain calculator 501 and a timing phase difference calculator 502. In this example, the jitter incorporating unit 40 incorporates a plurality of input timing jitters having different amplitudes from each other into the input signal.

The gain calculator 501 performs linear fitting (linear approximation) of the timing jitter values in the input timing jitter sequence and the timing jitter values in the output timing jitter sequence, both of which are made to correspond to the respective amplitudes of the input timing jitters, straight line in a linear operation region of the DUT, so as to calculate the gain of the jitter transfer function. That is, the gain calculator 501 calculates the gain of the jitter transfer function by performing the linear approximation of a relationship between the timing jitter values of the first timing jitter sequence and the timing jitter values of the second timing jitter sequence, both of which are made to correspond to the respective amplitude of the input timing jitters.

The timing phase difference calculator 502 calculates the phase difference between the input and output timing jitters. This timing difference is calculated in accordance with the following equation.

$$\Delta\Psi(f_j) = \angle\Delta\Phi[f_j] - \angle\Delta\Theta[f_j] \approx \angle\Delta\Phi(f_j) - \angle\Delta\Theta(f_j) \quad (15)$$

Figure 33:
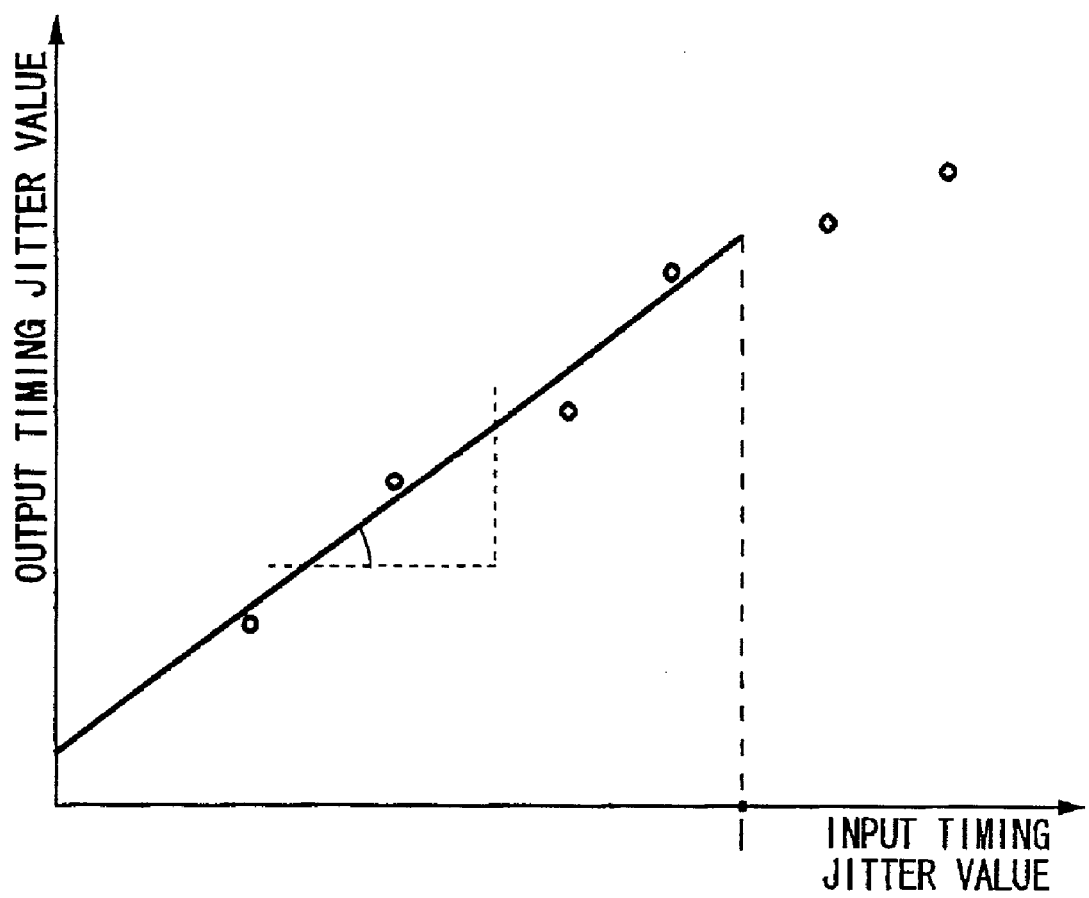
FIG. 33 shows an exemplary relationship between timing jitter values of the input timing jitter sequence and timing jitter values of the output timing jitter sequence.

FIG. 33 shows an exemplary relationship between the timing jitter values of the input timing jitter sequence and those of the output timing jitter sequence. In FIG. 33, circles represent actual measured values, while straight line represents a result of linear fitting of the actual measured values.

The gain calculator 501 calculates a slope of this straight line as the gain of the jitter transfer function. Moreover, the gain calculator 501 performs linear fitting of the actually measured values in the region where the DUT linearly operates. For example, the linear fitting is performed in a region where the input timing jitter value is one or less, as shown in FIG. 33, thereby calculating the gain of the jitter transfer function.

Figure 34:
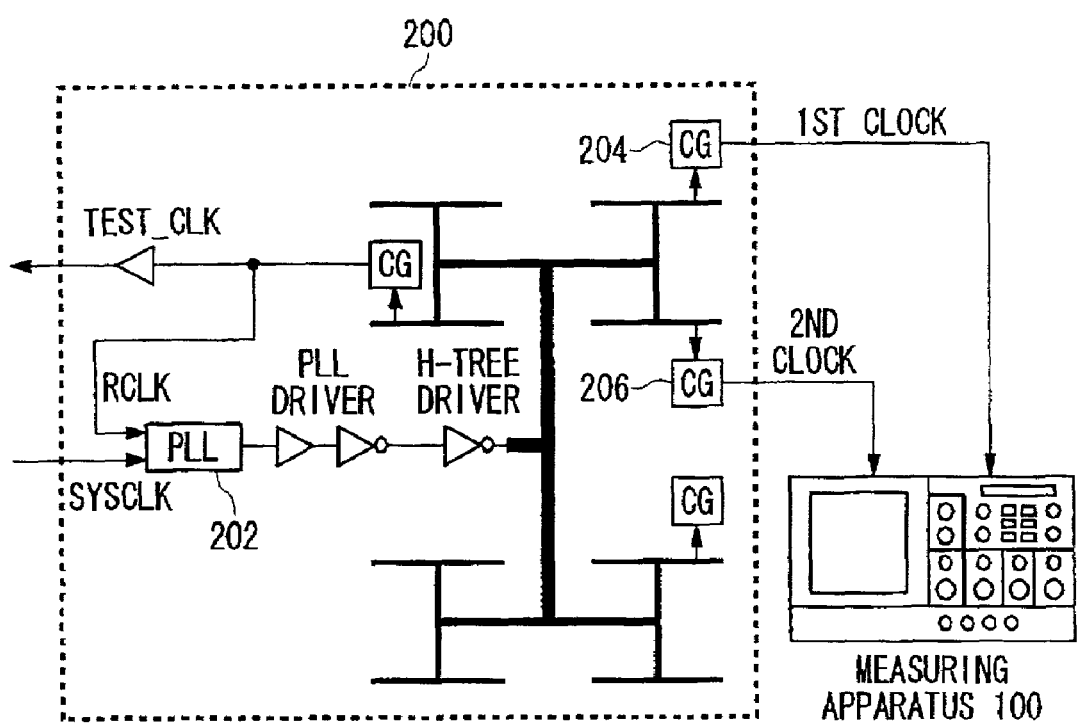
FIG. 34 illustrates another example of the measurement by the measuring apparatus 100.

FIG. 34 illustrates another example of the measurement by the measuring apparatus 100. In this example, the DUT 200 includes a clock generator 202 that generates a clock based on the input signal of the DUT; the first circuit 204 that receives the first distributed clock; and the second circuit 206 that receives the second distributed clock. The first and second distributed clocks may be clocks of the same frequency, or clocks having multiple frequencies. For example, the clock generator 202 is a PLL and generates the clock with a jitter.

The measuring apparatus 100 in the present example performs the measurement while using the first distributed clock received by the first circuit 204 and the second distributed clock received by the second circuit 206 as the first and second signals, respectively.

Figure 35:
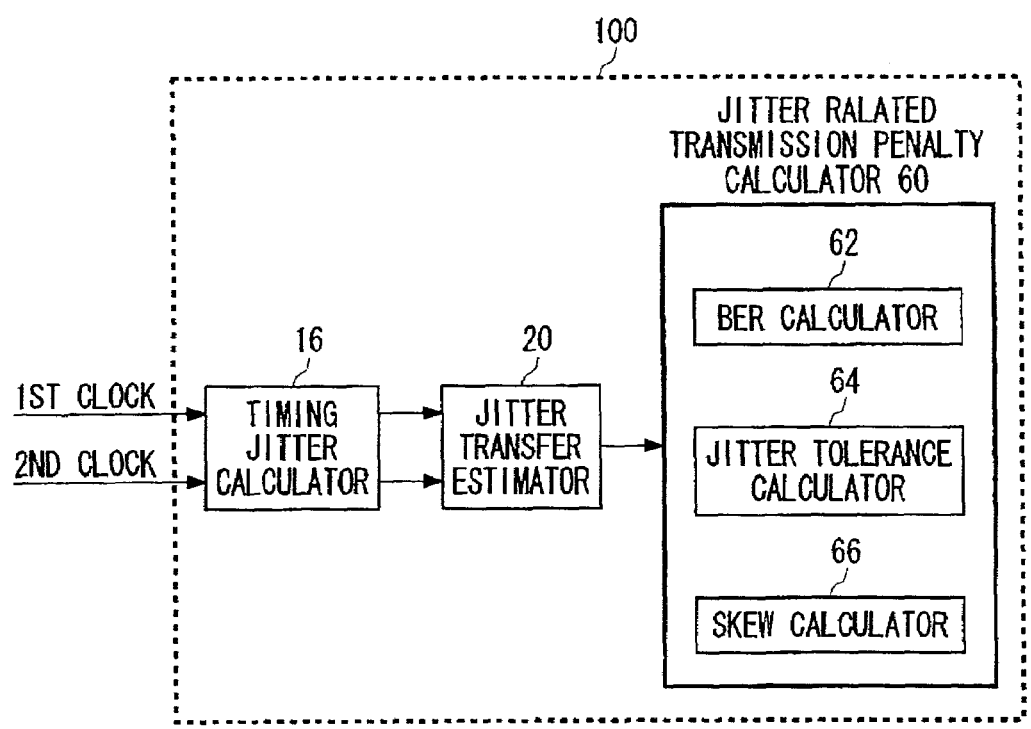
FIG. 35 illustrates an exemplary arrangement of the measuring apparatus 100 shown in FIG. 34.

FIG. 35 illustrates an exemplary arrangement of the measuring apparatus 100 shown in FIG. 34. In the present example, the measuring apparatus 100 includes the timing jitter calculator 10, the jitter transfer function estimator 20 and the jitter related transmission penalty calculator 60.

The timing jitter calculator 10 receives the first and second distributed clocks, calculates the first timing jitter sequence based on the first distributed clock and calculates the second timing jitter sequence based on the second distributed clock. The timing jitter calculator 10 has the same or similar function and arrangement as/to that of the timing jitter calculator 10 described referring to FIG. 5.

The jitter transfer function estimator 20 calculates the jitter transfer function between the first and second distributed clocks. The jitter transfer function estimator 20 has the same or similar function and arrangement as/to that of the jitter transfer function estimator 20 described referring to FIG. 5.

The jitter related transmission penalty calculator 60 includes the arrangement of the jitter related transmission penalty calculator 60 described referring to FIG. 5 and further includes a skew calculator 66. The skew calculator 66 calculates a skew between the first circuit 202 and the second circuit 204 based on the jitter transfer function. The mean square value of the gain of the jitter transfer function from the gain value of 1.0 is in proportion to energy of the clock skew. Thus, clock slew can be calculated based on the gain of the jitter transfer function. For example, the skew calculator 66 calculates an effective value of the clock skew in accordance with the following equation.

$$T_{SKEW} = \sqrt{\frac{1}{L}\sum(|H_{\Delta\phi\Delta\phi}(f)| - 1)^2} \quad (16)$$

Please note that the right-hand side of Equation (16) represents the mean square value of the gain of the jitter transfer function from the gain value of 1.0.

In addition, according to the measuring apparatus 100 of the present example, an error rate between the first circuit 204 and the second circuit 206 can be easily calculated by means of a bit error rate calculator 62.

Figure 36:
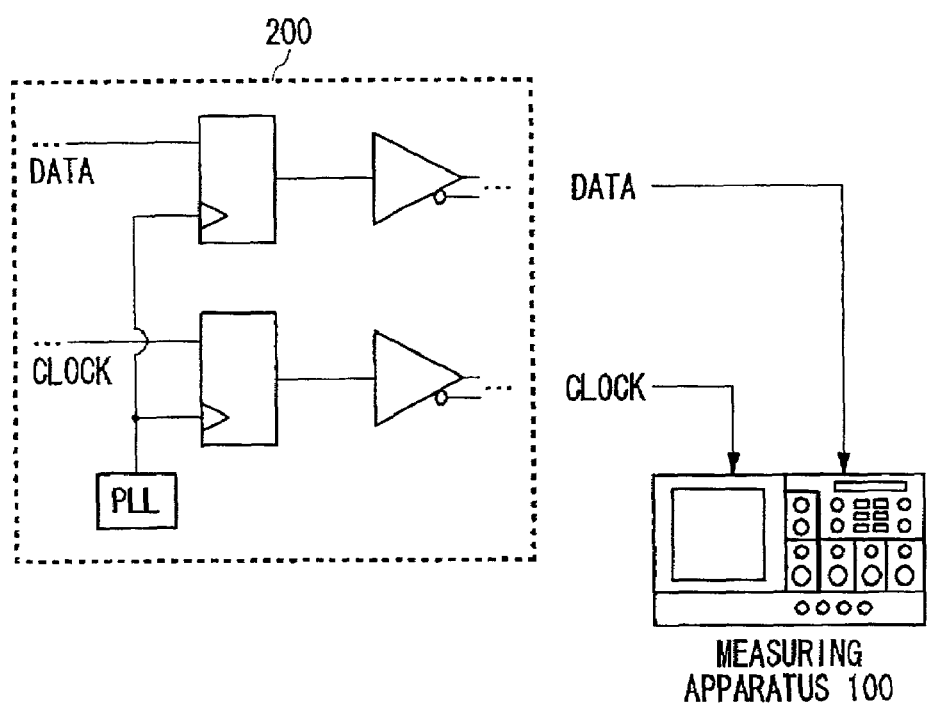
FIG. 36 illustrates another example of the measurement by the measuring apparatus 100.

FIG. 36 illustrates another example of the measurement by the measuring apparatus 100. In this example, the DUT 200 has a synchronous circuit that outputs a data signal and a clock signal to be synchronized with the data signal. The measuring apparatus 100 measures the jitter related transmission penalty of the synchronous circuit while using the data signal and the clock signal that are output from the synchronous circuit as the first signal and the second signal, respectively.

Figure 37:
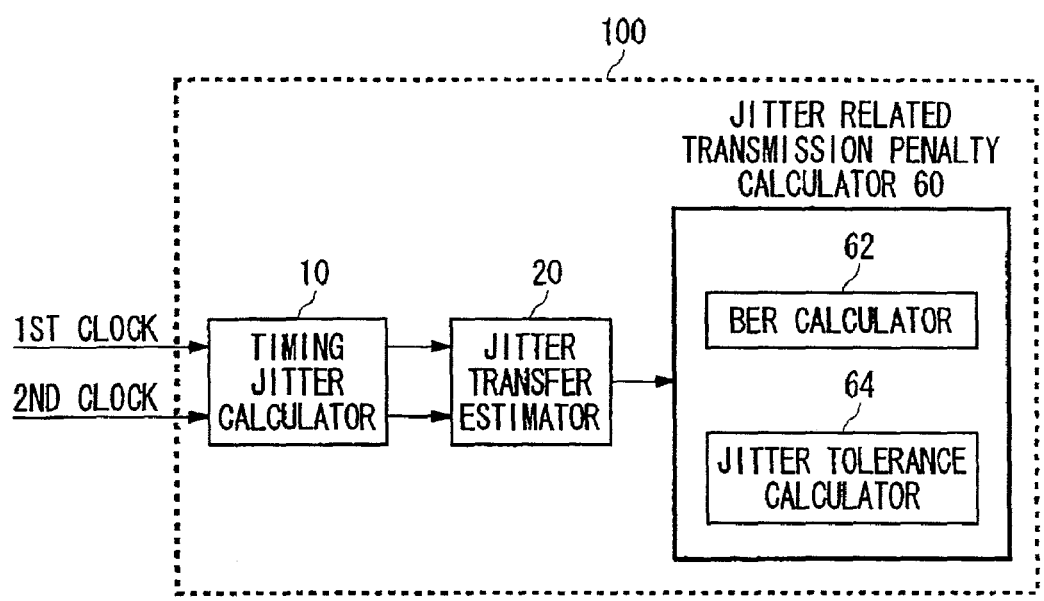
FIG. 37 illustrates an exemplary arrangement of the measuring apparatus 100 shown in FIG. 36.

FIG. 37 illustrates an exemplary arrangement of the measuring apparatus 100 shown in FIG. 36. The measuring apparatus 100 includes the timing jitter calculator 10, the jitter transfer function estimator 20 and the jitter related transmission penalty calculator 60. The measuring apparatus 100 of the present example has the same or similar function and arrangement as/to that of the measuring apparatus 100 described referring to FIG. 35. According to the measuring apparatus 100 of the present example, the error rate between the data signal and the clock signal can be easily calculated by means of the bit error rate calculator 62.

Next, the measurement principle of the measuring apparatus 100 is described.

First, the jitter transfer function is described. When the input instantaneous phase noise $\Delta\theta(nT_S)$ and the output instantaneous phase noise $\Delta\Phi(nT_S)$ are transformed into frequency domain by Fourier transform, the following phase noise spectra are obtained.

$$\Delta\Theta(f_J) = \frac{1}{L}\sum_{k=0}^{L}\Delta\theta(kT_S)\exp\left(-j\frac{2\pi f_J k}{L}\right) \quad (17)$$

$$\Delta\Phi(f_J) = \frac{1}{L}\sum_{k=0}^{L}\Delta\phi(kT_S)\exp\left(-j\frac{2\pi f_J k}{L}\right) \quad (18)$$

Please note that $T_S$ is a sampling period and $f_J$ is a jitter frequency that is an offset frequency from the clock frequency.

When the instantaneous phase noise in the vicinity of the zero-crossings (rising edges or falling edges) are sampled while the sampling period $T_S$ is made equal to the clock period T of the clock recovery unit under test, the input timing jitter $\Delta\theta[nT]$ and the output timing jitter $\Delta\phi[nT]$ are obtained. When $\Delta\theta[nT]$ and $\Delta\phi[nT]$ are transformed into frequency domain by Fourier transform, the following timing jitter spectra $$\Delta\Theta[f_J] = \frac{1}{L}\sum_{k=0}^{L}\Delta\theta(kT)\exp\left(-j\frac{2\pi f_J k}{L}\right) \quad (19)$$

$$\Delta\Phi[f_J] = \frac{1}{L}\sum_{k=0}^{L}\Delta\phi(kT)\exp\left(-j\frac{2\pi f_J k}{L}\right) \quad (20)$$

are obtained. Since the timing jitter is wide-sense cyclostationary of a period T, the timing jitter spectrum is more effective for analysis of a modulation noise source than the phase noise spectrum.

When $|\Delta\Theta[f_J]|$ is not zero, the jitter transfer function is defined as follows.

$$H_J[f_J] = |H_J[f_J]|\exp(-j\angle H_J[f_J]) \quad (21)$$

$$|H_J[f_J]| = \left|\frac{\Delta\Phi[f_J]}{\Delta\Theta[f_J]}\right| \approx \left|\frac{\Delta\Phi(f_J)}{\Delta\Theta(f_J)}\right| \quad (22)$$

$$\angle H_J[f_J] = \angle\Delta\Phi[f_J] - \angle\Delta\Theta[f_J] \quad (23)$$

The jitter transfer function is given as a frequency response function of a constant-parameter linear system.

Next, the calculation of the gain of the jitter transfer function in the gain calculator 501 described referring to FIG. 32.

From assumption of linearity, a peak-to-peak value of the input timing jitter is amplified by the gain $|H_J(f_J)|$ of the jitter transfer function, so as to provide a peak-to-peak value of the timing jitter of the recovered clock.

The jitter transfer function is measured from a ratio of the peak-to-peak values or mean values of the input and output jitters. Next, a method for measuring the gain of the jitter transfer function in frequency domain and time domain is discussed.

When $|\Delta\Theta(f_J)|$ is not zero, the gain of the jitter transfer function can be estimated from the peak-to-peak value or mean value of the timing jitter spectrum (phase noise spectrum) in frequency domain.

$$[|H_J(f_J)|^2] = \frac{\text{Worst}[|\Delta\Phi[f_J]|^2]}{\max[|\Delta\Theta[f_J]|^2]} = \frac{\max[|\Delta\Phi[f_J]|^2]}{\max[|\Delta\Theta[f_J]|^2]} \quad (24)$$

$$[|H_J(f_J)|^2] = \frac{\text{average}[|\Delta\Phi[f_J]|^2]}{\text{average}[|\Delta\Theta[f_J]|^2]} \quad (25)$$

Since the jitter transfer function is given as the frequency response function of the constant-parameter linear system, the jitter transfer function is not a function of the input to the system. Based on this fact, a procedure for estimating the jitter transfer function in time domain is described. First, the peak-to-peak value of the input timing jitter is set in a region in which the operation of the clock recovery unit under test is linear operation, and then the input/output relationship between $\Delta\theta[nT]$ and $\Delta\phi[nT]$ plural times. Thereafter, the input/output relationship of the peak-to-peak jitter between $\Delta\theta[nT]$ and $\Delta\phi[nT]$ or the input/output relationship of the RMS jitter is subjected to linear fitting, as shown in FIG. 33. From the slope of the straight line, the gain of the jitter transfer function is obtained.

$$\sqrt{[|H_J(f_J)|^2]} \approx \left.\frac{d(\Delta\phi_{PP})}{d(\Delta\theta_{PP})}\right|_{LinearOperation} \quad (26)$$

$$\sqrt{[|H_J(f_J)|^2]} \approx \left.\frac{d(\Delta\sigma_{\Delta\phi})}{d(\Delta\sigma_{\Delta\theta})}\right|_{LinearOperation} \quad (27)$$

It was confirmed that four measurements of the input/output relationship between $\Delta\theta[nT]$ and $\Delta\phi[nT]$ were enough in order to obtain the gain of the jitter transfer function by linear fitting. Moreover, as described referring to FIG. 21, in a case of obtaining the jitter transfer function without performing linear fitting, it is not necessary to perform the measurement of the input/output relationship between $\Delta\theta[nT]$ and $\Delta\phi[nT]$ plural times for one frequency. Thus, the jitter transfer function can be calculated faster.

The peak-to-peak value of the timing jitter of the recovered clock is given as follows.

$$\Delta\phi_{PP} = \Delta\theta_{PP}\sqrt{[|H_J(f_J)|^2]} \quad (28)$$

Next, a condition required for observing the jitter transfer function of the clock recovery unit with higher frequency-resolution. An input bit stream to the DUT is given at a bit rate of $f_{bit}$. For example, the DUT is a deserializer that outputs $N_{parallel}$ bits at a data rate of $f_{bit}/N_{parallel}$. It is assumed that $\Delta\theta[nT]$ and $\Delta\phi[nT]$ are transformed into frequency domain by L-point Fourier transform so that the input timing jitter spectrum $\Delta\Theta[f_J]$ and the output timing jitter spectrum $\Delta\Phi[f_J]$ are obtained, for example. The frequency-resolutions are given by the following equations, respectively.

$$\left.\Delta f\right|_{input} = \frac{1}{TL} \quad (29)$$

$$\left.\Delta f\right|_{output} = \frac{1}{(N_{parallel}T)L} = \frac{\Delta f|_{input}}{N_{parallel}} \neq \Delta f|_{input}$$

That is, the frequency-resolution of $\Delta\Phi[f_J]$ is $N_{parallel}$ times higher than that of $\Delta\Phi[f_J]$. Since the jitter transfer function is given by the ratio of the timing jitter spectra at the common jitter frequency $f_J$, only the jitter transfer functions of $$\frac{L}{N_{parallel}}$$

lines can be measured by transforming $\Delta\theta[nT]$ and $\Delta\phi[nT]$ into frequency domain by L-point Fast Fourier transform. On the other hand, when $\Delta\theta[nT]$ and $\Delta\phi[nT]$ are transformed into frequency domain by $N_{parallel}$L-point Fast Fourier transform and L-point Fast Fourier transform, respectively, the frequency-resolutions of the input timing jitter spectrum $\Delta\Theta[f_J]$ and the output timing jitter spectrum $\Delta\Phi[f_J]$ are represented by the following equations.

$$\Delta f|_{input} = \frac{1}{T(N_{parallel}L)} \tag{30}$$

$$\Delta f|_{output} = \frac{1}{(N_{parallel}T)L} = \Delta f|_{input}$$

Thus, they are coincident with each other. Therefore, when (a) a broad band jitter of $|\Delta\Theta[f_j]|\neq 0$ ($f_j \in$ band) is input as $\Delta\theta[nT]$ and (b) $\Delta\theta[nT]$ and $\Delta\phi[nT]$ are transformed into frequency region by $N_{parallel}$L-point Fast Fourier transform and L-point Fast Fourier transform, respectively, (c) the jitter transfer functions of L lines can be calculated simultaneously. That is, the speed of the measurement can be increased about L times. It is preferable that the jitter transfer function estimator 20 calculate the jitter transfer function in the above manner. This condition of Fast Fourier transform is reasonable with respect to the causal relationship. This is because both the input timing jitter sequence and the output timing jitter sequence are observed for a time period of $TN_{parallel}L$ and therefore the causal relationship is established between them.

A PLL incorporated in the deserializer under test includes a frequency divider therein. The division ratio $N_{division}$ of the frequency divider used in the deserializer is typically designed to be equal to the number of bits output in parallel, $N_{parallel}$.

Next, an alignment jitter is described. The alignment jitter is defined as the amount in time domain. The alignment jitter represents an alignment error between the timing jitter of the input signal and the timing jitter of the recovered clock.

$$\Delta align[nT]=|(\Delta\phi[nT]-\Delta\theta[nT])| \tag{31}$$

In order to allow the bit error rate to be directly handled, the alignment jitter is defined again as the amount in frequency domain. That is, with respect to $f_J$, the alignment jitter is represented as follows.

$$\Delta align[f_J]=||\Delta\Phi[f_J]|\exp^{-j\angle\Delta\Phi[f_J]}-|\Delta\Theta[f_J]|\exp^{-j\angle\Delta\Theta[f_J]}| \tag{32}$$

From Equations (22) and (32), the alignment jitter is obtained as follows.

$$\Delta align[f_J] = |\Delta\Theta[f_J]|\left|\frac{|\Delta\Phi[f_J]|\exp(-j\angle\Delta\Phi[f_J])}{|\Delta\Theta[f_J]|\exp(-j\angle\Delta\Theta[f_J])} - 1\right| \tag{33}$$

$$= |\Delta\Theta[f_J]||H_J[f_J]|\exp(-j\angle H_J[f_J]) - 1|$$

Thus, it is found that the jitter transfer function having a value of 1.0 provides a reference value of zero of the alignment jitter. This is established when $\Delta\theta(f_J,nT)$ and $\Delta\phi(f_J,nT)$ are aligned to have the same amplitude and the same phase. The peak-to-peak value and the effective value of the alignment jitter are given as follows.

$$\Delta align_{PP}[f_J]=\Delta\theta_{PP}\{||H_J[f_J]|\exp(-j\angle H_J[f_J])-1|\} \tag{34}$$

$$\sigma_{\Delta align}[f_J]=\sigma_\theta\{||H_J[f_J]|\exp(-j\angle H_J[f_J])-f\angle H_J[f_J])-1|\} \tag{35}$$

In an ideal bit stream, times of bit boundaries have no fluctuation. That is, a timing jitter of the ideal bit stream (fluctuation of the bit boundaries) have no energy in frequency domain. Thus, even when the ideal bit stream is applied to the clock recovery unit under test, it is impossible to measure the jitter transfer function of the clock recovery unit under test since the energy of the input timing jitter spectrum becomes zero. Therefore, in order to measure the jitter transfer function of the clock recovery unit under test, it is necessary to make the boundaries in the bit stream fluctuate. This fluctuation can be attained by phase modulation or frequency modulation of the bit boundaries. The noise incorporating unit 40 provides the boundaries in the bit stream with fluctuation.

When the timing jitter $\Delta\theta[nT]$ of the input data x(t) to the clock recovery unit under test and the timing jitter $\Delta\phi[nT]$ of the recovered clock y(t) are represented as phase modulation waveforms, the following equations are obtained.

$$x(t)=A \sin(2\pi f_{bit}t+\Delta\theta[t]) \tag{36}$$

$$y(t) = B\sin\left(2\pi\frac{f_{bit}}{N_{parallel}}t + \Delta\phi[t]\right) \tag{37}$$

Please note that $f_{bit}$ is a bit rate (bit clock frequency). Moreover, $f_{bit}/N_{parallel}$ is a data rate of the recovered clock. $N_{parallel}$ is typically given as $2^n$ (n=0, 1, 2, . . . ). As the timing jitter $\Delta\theta[nT]$ of x(t), a sinusoidal jitter and a Gaussian noise jitter are known. However, in the present specification, a pseudo-random sequence is also included in the Gaussian noise jitter.

First, in a case of incorporating the sinusoidal jitter is described.

The instantaneous phase $\Delta\theta[nT]$ of the bit clock is changed by a sine wave $\cos(2\pi f_{PM}t)$. At this time, the input data stream to the DUT has the following timing jitter.

$$\Delta\theta[nT]=K_i \cos(2\pi f_{PM}t)|_{t=nT} \tag{38}$$

In the above, $2K_i$ is a peak-to-peak value of the input jitter and $f_{PM}$ is a phase modulation frequency by the sine wave. When the sinusoidal jitter, that is sufficiently larger than an internal jitter generated by the DUT, is input to the DUT, $$\Delta\phi[nT]=K_i|H_J(f_{PM})|\exp(-j\angle H_J(f_{PM})) \cos(2\pi f_{PM}t)|_{t=Tn} \tag{39}$$

is obtained, where $H_J(f_{PM})$ is the jitter transfer function of the clock recovery unit. From Equations (38) and (39), the peak-to-peak value of the sinusoidal jitter is bounded as shown by the following relationship.

$$\Delta\theta_{PP}<M_1, \Delta\phi_{PP}<M_2 \tag{40}$$

In addition, the jitter frequency $f_J$ is given by the phase modulation frequency $f_{PM}$.

$$f_J=f_{PM} \tag{41}$$

Thus, the worst-case value and the mean value of the jitter at the jitter frequency $f_J$ are obtained as follows.

$$\text{Worst}[|\Delta\Phi[f_J]|^2] = [|H_J(f_J)|^2] \max [|\Delta\Theta[f_J]|^2] \quad (42)$$

$$\text{mean}[|\Delta\Phi[f_J]|^2] = [|H_J(f_J)|^2]\text{mean}[|\Delta\Theta[f_J]|^2] \quad (43)$$

$$\approx \text{average}[|H_J(f_J)\Delta\Theta[f_J]|^2] = \frac{1}{n_d}\sum_1^{n_d}|H_J(f_J)\Delta\Theta[f_J]|^2$$

Moreover, the peak-to-peak value and the RMS value in time domain are respectively obtained as follows.

$$\Delta\phi_{PP} = \max\{(\text{Worst}[|\Delta\Phi[f_J]|^2])^{0.5}\exp(j2\pi f_J k)\} - \quad (44)$$
$$\min\{(\text{Worst}[|\Delta\Phi[f_J]|^2])^{0.5}\exp(j2\pi f_J k)\}$$

$$\sigma_{\Delta\phi} = \sqrt{\frac{1}{L}\{(\text{mean}[|\Delta\Phi[f_J]|^2])^{0.5}\exp(j2\pi f_J k)\}^2} \quad (45)$$

In the above, $|X|^2$ and $(|X|^2)^{0.5}$ can be calculated as $|X|$.

From the above description, the sinusoidal jitter gives the DUT a deterministic jitter. In addition, the probability density distribution of the sinusoidal jitter corresponds to the worst case.

Next, a case where the Gaussian distribution jitter is incorporated is described.

In a case where the input timing jitter $\Delta\theta[nT]$ of the bit clock is changed by a Gaussian noise $n_g(t)$, the edges in the input data stream to the DUT are fluctuated by the input timing jitter.

$$\Delta\theta[nT] = K_i n_g(t)|_{t=nT} \quad (46)$$

In the above, $2K_i$ is a peak-to-peak value of the input jitter. When the Gaussian noise jitter, that is sufficiently larger than the internal jitter generated by the DUT, is input to the DUT, the output timing jitter sequence is represented by the following equation.

$$\Delta\phi[nT] = K_i \sum_{f_J=f_{lower}}^{f_{upper}} H_J(f_J)\Delta\Theta[f_J]\exp\left(j\frac{2\pi f_J n}{L}\right) \quad (47)$$

In the above, $H_J(f)$ is the jitter transfer function of the DUT.

When the jitter transfer function is measured in an offset frequency section ($f_{lower}$, $f_{upper}$) from $f_{bit}/N_{parallel}$, time of the measurement using the sinusoidal jitter and time of the measurement using the Gaussian noise jitter are compared with each other.

When the jitter transfer function of the clock recovery unit is measured, the sinusoidal jitter has been conventionally used. The sinusoidal jitter makes the instantaneous phase of the bit clock, $\Delta\theta[nT]$ or $\Delta\phi[nT]$ correspond to the sine wave $\cos(2\pi f_{PM}t)$. To the contrary, when the sinusoidal jitter is demodulated, the sine wave is obtained. Since this sine wave corresponds to a line spectrum in frequency domain, the jitter frequency $f_J$ is given as a single frequency $f_{PM}$. Therefore, in order to measure the jitter transfer function by using the sinusoidal jitter, it is necessary to sweep the frequency $f_{PM}$ of the sine wave $K_{sweep}$ times from $f_{lower}$ to $f_{upper}$.

The measurement time of the jitter transfer function when the sinusoidal jitter is incorporated is obtained. (a) First, the sampling of the sinusoidal jitter is performed for a period corresponding to $M_{cycle}$ periods (20 periods, for example). This requires observation time of $M_{cycle}/f_J$. (b) Then, the digitized waveform thus obtained is subjected to Fast Fourier transform (4 k or 8 k-point Discrete Fourier transform, for example), so that the timing jitter sequence of the digitized waveform is obtained. That is, a product of calculation time of Fast Fourier transform $T_{FFT}$ and the number $N_{FFT}$ of sections of overlap-save sectioning (40, for example) dominates total calculation time. Thus, the total calculation time that is required for obtaining the timing jitter sequences from the digitized waveforms of the input and output is given by $T_{FFT}N_{FFT}$. (c) Moreover, the relationship between the input and output timing jitter values is subjected to linear fitting, thereby obtaining the gain of the jitter transfer function. As described above, the amplitude of the sinusoidal jitter is changed four times, and the jitter transfer function is measured for each of four amplitudes of the sinusoidal jitter. Thus, the sum of the observation time and the total calculation time is multiplied by a constant, 4. (d) Finally, the resultant is multiplied by the number of the frequency sweep times $K_{sweep}$. Accordingly, the total measurement time is given by the following equation.

$$T_{Meas,Sine} = 4K_{sweep}\left(\frac{M_{cycle}}{f_J} + 2N_{FFT}T_{FFT}\right) \quad (48)$$

On the other hand, when the Gaussian noise jitter is demodulated, the Gaussian noise waveform is obtained. Since the Gaussian noise corresponds to a broadband spectrum in frequency domain, the frequency sweep in the offset frequency section ($f_{lower}$, $f_{upper}$) is not necessary. The jitter transfer functions in the offset frequency section ($f_{lower}$, $f_{upper}$) can be measured simultaneously.

The total measurement time is obtained in a similar manner. (a) First, sampling of the Gaussian noise jitter is performed for a period corresponding to $M_{cycle}$ periods. This requires observation time of $M_{cycle}/f_{lower}$. (b) Then, the digitized waveform thus obtained is subjected to Fast Fourier transform, so that the timing jitter sequence of the digitized waveform is obtained. That is, the product of the calculation time $T_{FFT}$ of Fast Fourier transform and the number $N_{FFT}$ of the sections of overlap-save sectioning dominates the total calculation time. Thus, the total calculation time that is required for obtaining the timing jitter sequences from the digitized waveforms of the input and output is given by $N_{FFT}T_{FFT}$. (c) Moreover, the input timing jitter sequence and the output timing jitter sequence are transformed from time domain to frequency domain by $M_{cycle}$-point Fast Fourier transform and $M_{cycle}/N_{divider}$-point Fast Fourier transform, respectively, thereby obtaining the gain of the jitter transfer function. The total measurement time according to the broadband jitter method is obtained as follows.

$$T_{Meas,Rand} = \frac{M_{cycle}}{f_{lower}} + 2N_{FFT}T_{FFT} + T_{JitTransFctn} \quad (49)$$

Time required for calculating the jitter transfer function is $$T_{JitTransFctn} = 5T_{CPU}\left\{M_{cycle}\log_2(M_{cycle}) + \left(\frac{M_{cycle}}{N_{division}}\right)\log_2\left(\frac{M_{cycle}}{N_{division}}\right)\right\} \quad (50)$$

and operation time of Fast Fourier transform is given by the sum of the number of times of addition and the number of times of multiplication. Therefore, when the clock frequency of a CPU is increased, the measurement time ratio of the sinusoidal jitter method and the broadband jitter method is $$\frac{T_{Meas,Rand}}{T_{Meas,Sine}} \to \frac{1}{4K_{sweep}} \quad (T_{CPU} \to 0) \quad (51)$$

and therefore the measurement time according to the broadband method is $4K_{sweep}$ times higher than the measurement time according to the sinusoidal jitter method.

For example, in a case where the jitter transfer function is measured by means of a computer having a clock speed of 1 GHz, the measurement time of the sinusoidal jitter method and that of the broadband jitter method are compared. First, the measurement time of the jitter transfer function by using the sinusoidal jitter is considered. From Equation (48), the total measurement time of $T_{Meas,SIne}$=74 sec is obtained. Each reading operation for reading 500 k-point digitized waveform requires 300 msec while each calculation of the timing jitter requires 625 msec, where $K_{sweep}$=20, 10 GSps. Next, the measurement of the jitter transfer function using the Gaussian noise jitter is considered. From Equation (51), the total measurement time of $T_{Meas,Rand}$=1.115 sec is obtained. That is, the broadband jitter method is 66 times faster than the sinusoidal jitter method. It takes $T_{JitTransFctn}$=190 msec to obtain the jitter transfer functions of 8 k lines by transforming $\Delta\theta[nT]$ and $\Delta\phi[nT]$ into frequency region by 128 k-point Fast Fourier transform and 8 k-point Fast Fourier transform, respectively. Moreover, if the calculation time by the computer can be ignored, $T_{Meas,Sine}$=24 sec. On the other hand, $T_{Meas,Rand}$=300 msec, which is 80 times faster.

An oscilloscope or a conventional error rate measuring device is used for measuring an eye diagram or an error rate. However, such a measuring device measures the eye diagram or the error rate without discriminating the frequency. In the following description, we will define the timing jitter measurement without discriminating the frequency and will make the limitation of this measurement method clear.

When the bit boundaries in the bit stream are made to fluctuate by the Gaussian noise jitter, the timing jitter of the recovered clock is represented by the following equation.

$$\Delta\phi[nT] = K_i \sum_{f_J=f_{lower}}^{f_{upper}} H_J[f_J]\Delta\Theta[f_J]\exp\left(j\frac{2\pi f_J n}{L}\right) \quad (52)$$

The timing jitter spectrum of the recovered clock is given by a product of the jitter transfer function and the timing jitter spectrum of the bit stream. The measurement in which the frequency is not discriminated, such as the error rate measurement in time domain can be considered as follows.

$$|\Delta\Phi[f_J]|^2 = |H_J[f_J]|^2|\Delta\Theta[f_J]|^2 \quad (53)$$

$$|\Delta\Phi[f_J]|^2 + |\Delta\Phi[f_{J+1}]|^2 \approx \frac{|H_J(f_J)|^2 + |H_J(f_{J+1})|^2}{2}\{|\Delta\Theta[f_J]|^2 + |\Delta\Theta[f_{J+1}]|^2\}$$

$$|\Delta\Phi[f_J]|^2 + |\Delta\Phi[f_{J+1}]|^2 + |\Delta\Phi[f_{J+2}]|^2 \approx$$
$$\frac{|H_J(f_J)|^2 + |H_J(f_{J+1})|^2 + |H_J(f_{J+2})|^2}{3}\{|\Delta\Theta[f_J]|^2 + |\Delta\Theta[f_{J+1}]|^2 + |\Delta\Theta[f_{J+2}]|^2\}$$

That it, since the frequency is not discriminated, the sum of the timing jitter power spectrum in frequency domain can be made to correspond to energy of the timing jitter of the recovered clock. In general, $$\left[\sum_{f_J}|\Delta\Phi[f_J]|^2\right] = \left\{\frac{1}{K_f}\sum_{f_J}\left[|H_J[f_J]|^2\right]\right\}\sum_{f_J}|\Delta\Theta[f_J]|^2 \quad (54)$$

is obtained.

When the jitter transfer function is discriminated without discriminating the frequency, the following equation is obtained from Equation (54).

$$\frac{1}{K_f}\sum_{f_J}\left[|H_J[f_J]|^2\right] = \frac{\sum_{f_J}|\Delta\Phi[f_J]|^2}{\sum_{f_J}|\Delta\Theta[f_J]|^2} \quad (55)$$

This is equivalent to the gain estimation of the jitter transfer function in time domain, which is described below. In time domain, when the input/output relationship between $\Delta\theta[nT]$ and $\Delta\phi[nT]$ is measured plural times and linear fitting is performed for the measured input/output relationship, the gain of the jitter transfer function can be estimated from the slope of the thus obtained straight line as follows.

$$\sqrt{\frac{1}{K_f}\sum_{f_J}\left[|H_J[f_J]|^2\right]} \approx \left.\frac{d(\sigma_{\Delta\phi})}{d(\sigma_{\Delta\theta})}\right|_{LinearOperation} \quad (56)$$

The difference between the measurement in which the frequency is discriminated and the measurement in which the frequency is not discriminated is described by comparing the alignment jitters of both the measurements. First, the measurement method in which the frequency is not discriminated is considered. In a case of the Gaussian noise jitter, the effective value of the alignment jitter is obtained as follows $$\sigma_{\Delta align} \approx \sqrt{\sum_{f_J}|\Delta\Theta[f_J]|^2}\left|\sqrt{\frac{1}{K_f}\sum_{f_J}\left[|H_J[f_J]|^2\right]} - 1\right| \quad (57)$$

$$\approx \sigma_\theta\left|\sqrt{\frac{1}{K_f}\sum_{f_J}\left[|H_J[f_J]|^2\right]} - 1\right|$$

where Perseval's theorem $$\sigma_\theta^2 \equiv \frac{1}{K_f} \sum_{l=0}^{K_f-1} \Delta\theta^2[l] = \sum_{f_J=0}^{K_f-1} |\Delta\Theta[f_J]|^2 \quad (58)$$

is used.

Next, the measurement in which the frequency is discriminated is discussed. It is assumed that the alignment jitter represents the worst-case value at the jitter frequency of $f_{worst}$. That is, $$\sigma_{\Delta align}[f_{Worst}] > \sigma_{\Delta align}[f_J] \ (f_J \neq f_{Worst}) \quad (59)$$

is established. Here, $$\sigma_{\Delta align}[f_{Worst}] \equiv \sigma_\theta\{||H_J[f_{Worst}]|\exp(-j\angle H_J[f_{Worst}]) - 1|\} \quad (60)$$

is also established. Thus, when the thus obtained alignment jitter is compared with the estimated alignment jitter value $\overline{\sigma}_{\Delta align}$ of the measurement without discriminating the frequency is not discriminated, the following relationship is obtained.

$$\sigma_{\Delta align}[f_{Worst}] > \overline{\sigma}_{\Delta align} \quad (61)$$

That is, in the case of incorporating the Gaussian noise jitter, the worst-case value of the alignment jitter cannot be observed in the measurement without discriminating the frequency, and therefore the alignment jitter that was averaged in the observed band has to be measured.

Next, the bit error rate by the timing jitter is described. When a rising edge timing $t_{zero-crossing}$ and a falling edge timing $t_{zero-crossing}$ of the adjacent bits cross the optimum sampling time $t_{decision}$, respectively, an bit error occurs. Thus, the bit error rate is given by estimating the probability that the edge timings timing $t_{zero-crossing}$ cross $t_{decision}$ taking the probability density function of the input timing jitter into consideration.

$$BER = \frac{1}{2} P_e(t_{decision} < t_{zero-crossing}) + \frac{1}{2} P_e(t_{zero-crossing} < t_{decision}) \quad (62)$$

Assuming a uniform distribution, the bit error rate for a single jitter frequency $f_J$ is obtained as follows $$BER[f_J] = p(x)(X - t_{decision}) = g(\Delta align_{PP}[f_J]) \quad (63)$$

where p(x) is the probability density function of the input timing jitter. X corresponds to the maximum value of the alignment jitter. The alignment jitter $\Delta align_{PP}[f_J]$ can be represented by using the jitter transfer function between the input timing jitter and the timing jitter of the recovered clock as follows.

$$BER[f_J] = g(p(x), X, |H_J[f_J]|\exp(-j\angle H_J[f_J])) \quad (64)$$

That is, the bit error rate is given as a function of the probability density function of the input timing jitter and the jitter transfer function. Thus, when the probability density function of the input jitter, for example, p(x) is the sinusoidal distribution or the Gaussian distribution, is given, the bit error rate BER[$f_J$] with respect to the peak-to-peak value or the effective value of the input jitter can be calculated by combining the given probability density function with the jitter transfer function. The important points are the measurement of the jitter transfer function and independence of the probability density function of the timing jitter. Therefore, it is not necessary to directly measure the bit error rate and jitter tolerance (the minimum input jitter amount that causes the bit error in the deserializer under test). For example, when the fast measurement of the jitter transfer function was performed by using the Gaussian noise jitter, the bit error rate or jitter tolerance that corresponds to the probability density function of the sinusoidal jitter or Gaussian noise jitter can be estimated by selecting the function $g(x,X,f_J)$ in Equation (64).

As described above, the bit error rate calculator 62 may calculate the worst-case value or mean value of the bit error rate, or may calculate the bit error rate in a case where the sinusoidal jitter was incorporated or the bit error rate in a case where the Gaussian distribution jitter was incorporated.

Similarly, the jitter tolerance calculator 64 may calculate the worst-case value or mean value of the jitter tolerance, or may calculate the jitter tolerance in the case where the sinusoidal jitter was incorporated or that in the case where the Gaussian distribution jitter was incorporated.

Next, the bit error rate of the DUT in a case where a sinusoidal jitter was incorporated is described.

A case where the rising edges in the bit stream fluctuate by the effects of the incorporated jitter is considered. It is assumed that the bit stream is provided with timing fluctuation by a phase modulator with no modulation noise. When timings $t_{zero-crossing}$ of the adjacent rising edges cross $t_{decision}$, respectively, the preceding bit or the next bit is discriminated at $t_{decision}$. In other words, the bit error occurs. Since the probability that the preceding bit is mistakenly determined is equal to the probability that the next bit is mistakenly determined, the bit error rate is given by the following equation.

$$BER = f(\Delta align_{PP}) \quad (65)$$
$$= \frac{1}{2} P_e(t_{decision} < t_{zero-crossing}) + \frac{1}{2} P_e(t_{zero-crossing} < t_{decision})$$

For simplification, $t_{decision}$ is regarded as the optimum sampling time, and the timing fluctuation $\Delta\phi[nT]$ is incorporated into the fluctuation of the input data stream $\Delta\theta[nT]$. As a result, only theoretical calculation of the bit error rate by the alignment jitter is necessary. Here, since the sinusoidal distribution is symmetrical with respect to the mean value, the first term is equal to the second term in Equation (65). Thus, $$BER = f(\Delta align_{PP}) = P_e(t_{decision} < t_{zero-crossing}) \quad (66)$$

is obtained.

Then, the probability density function of the alignment jitter is obtained. When Equations (38) and (39) are substituted in Equation (31), $$\Delta\text{align}[nT] = |K_i\{|H_J(f_{PM})|\exp(-j\angle H_J(f_{PM}))-1\}\cos(2\pi f_{PM}t)|_{t=nT} \quad (67)$$

is obtained. When the phase modulation frequency $f_{PM}$ is given, $K_i\{|H_J(f_{PM})|\exp(-j<H_J(f_{PM})-1)\}$ becomes constant. Therefore, in a case of the sinusoidal jitter input, the probability density function of the alignment jitter has a sinusoidal distribution as follows.

$$p(x) = \begin{cases} \dfrac{1}{\pi\sqrt{X^2 - x^2}} & |x| < X \\ 0 & |x| \geq X \end{cases} \quad (68)$$

Here, $X = K_i\{|H_J(f_{PM})|-1\}$. For simplification, this sinusoidal distribution is approximated by using the following uniform distribution.

$$p(x) = \begin{cases} \dfrac{1}{2X} & |x| < X \\ 0 & |x| \geq X \end{cases} \quad (69)$$

Then, the bit error rate is obtained by using $X = \Delta\phi_P = \Delta\theta_{P\{HJ}(f_{PM})|-1\}$. When the probability that a random variable indicating the uniform distribution exceeds $t_{decision}$ is obtained, $$BER = p(x)(X - t_{decision}) \quad (70)$$

$$= \frac{1}{\Delta\theta_{PP}\{|H_J(f_{PM})| - 1|\}} \left\{ \{\Delta\theta_P\{|H_J(f_{PM})| - 1|\} + \frac{t_{decision}}{2} \right) - t_{decision} \right\}$$

$$= \frac{1}{2}\left\{1 - \frac{t_{decision}}{\Delta\theta_{PP}\{|H_J(f_{PM})| - 1|\}}\right\}$$

is obtained from Equation (66). Moreover, $t_{decision} = 0.5$ UI. Thus, $$BER = \frac{1}{2}\left\{1 - \frac{1}{2\Delta\theta_{PP}\{|H_J(f_{PM})| - 1|\}}\right\} \quad (71)$$

is obtained.

In addition, when the phase of the jitter transfer function is incorporated into the bit error rate given by Equation (71), $$BER = \frac{1}{2}\left\{1 - \frac{1}{2\Delta\theta_{PP}\{|H_J(f_{PM})|\exp(-j\angle H_J(f_{PM}))-1|\}}\right\} \quad (72.1)$$

is obtained.

Equation (72.1) shows that the bit error rate can be calculated only from the jitter transfer function. That is, Equation (72.1) shows the performance limit of the bit error rate of the DUT. The bit error rate performance of the DUT is degraded because of a problem of the design of the DUT (for example, a loop band of a PLL circuit). When a degradation index of the bit error rate that is determined by the design is assumed to be $\beta$, the degraded bit error rate is given by the following equation.

$$BER = \frac{1}{2}\left\{1 - \frac{1}{2\Delta\theta_{PP}\{|H_J(f_{PM})|\exp(-j\angle H_J(f_{PM}))-1|^\beta\}}\right\} \quad (72.2)$$

Next, the jitter tolerance in a case where the sinusoidal jitter was incorporated is described.

The jitter tolerance of the sinusoidal jitter input is given by the lower limit of the input timing jitter that causes the bit error. Therefore, the jitter tolerance of the sinusoidal jitter input is obtained from Equation (71) as follows.

$$\inf(\Delta\theta_{PP}) = \frac{1}{2||H_J(f_{PM})| - 1|} \ [UI] \quad (73)$$

In addition, when the phase of the jitter transfer function is incorporated, the jitter tolerance is represented by the following equation from Equation (72.1).

$$\inf(\Delta\theta_{PP}) = \frac{1}{2||H_J(f_{PM})|\exp(-j\angle H_J(f_{PM}))-1|} \quad (74.1)$$

In a case where the aforementioned degradation index $\beta$ is considered, the jitter tolerance is given as follows.

$$\inf(\Delta\theta_{PP}) = \frac{1}{2\,||\,H_J(f_{PM})\,|\exp(-j\angle H_J(f_{PM}))-1\,|^\beta} \quad (74.2)$$

As well as the bit error rate, Equation (74.2) provides the performance limit of the jitter tolerance of the DUT.

Figure 38:
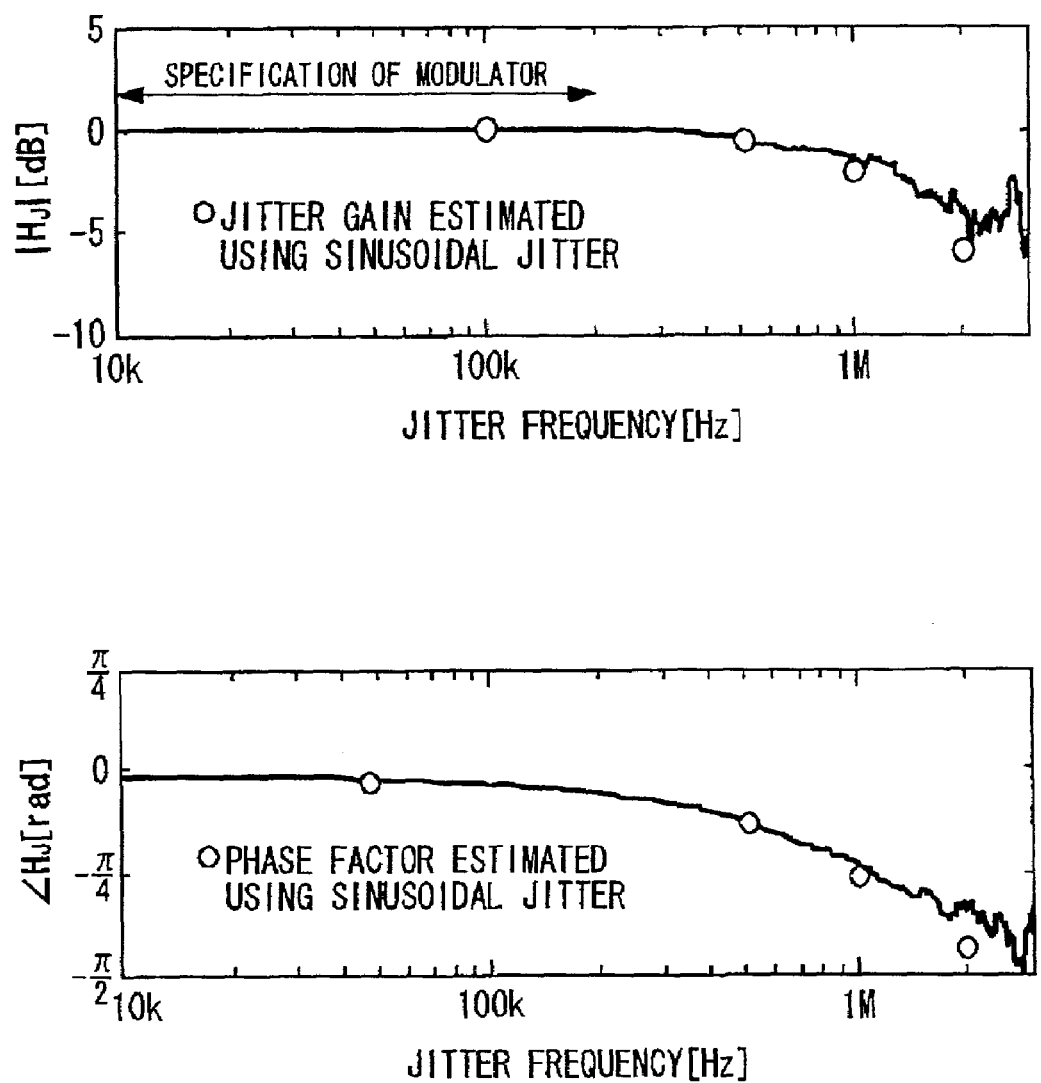
FIG. 38 shows an example of the result of the jitter transfer function measurement performed by the measuring apparatus 100.

FIG. 38 shows an example of the jitter transfer function calculated by incorporating a random jitter into the input signal. A graph in the upper half of FIG. 38 shows the gain of the thus calculated jitter transfer function, while a graph in the lower half shows the phase of the jitter transfer function. In FIG. 38, solid line represents the calculation result in the measuring apparatus 100 and circles represent the measurement result by BERT method using the conventional sinusoidal jitter input. As shown in FIG. 38, the calculation result by the measuring apparatus 100 is approximately coincident with the conventional measurement result.

Figure 39:
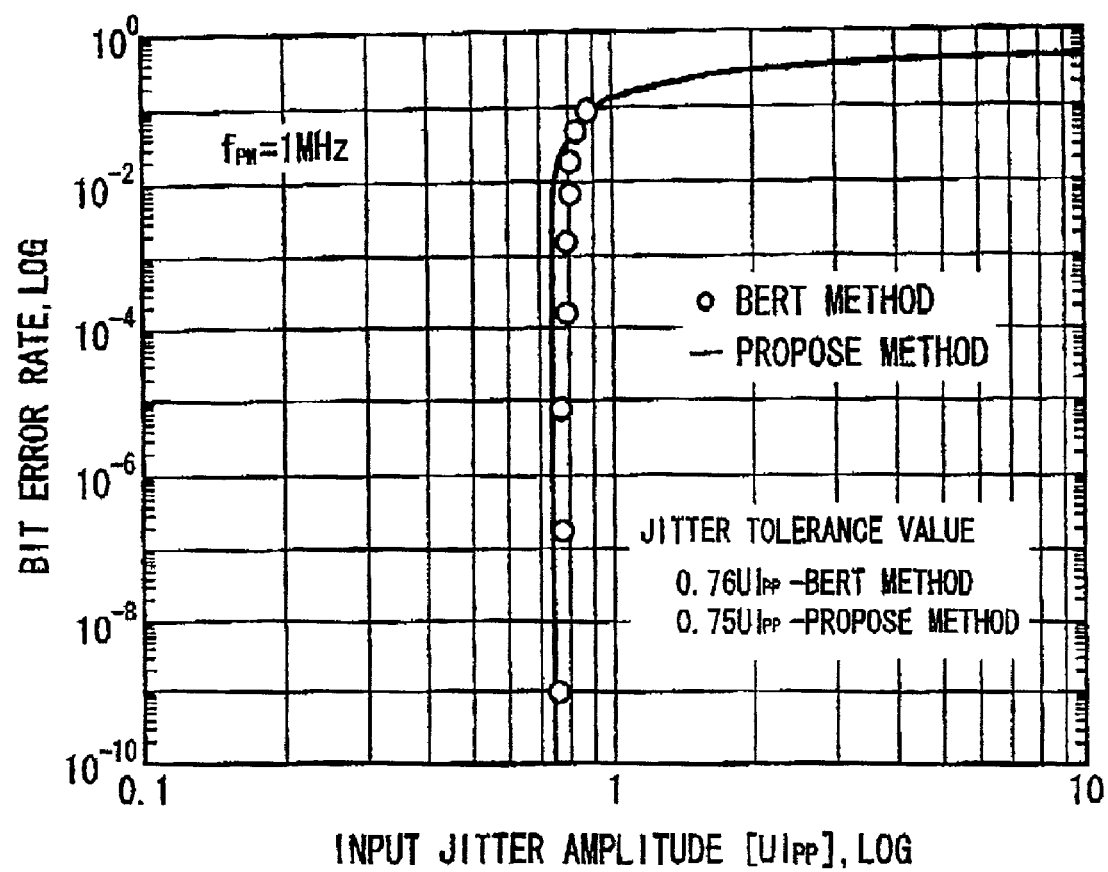
FIG. 39 shows an example of the result of the bit error rate measurement performed by the measuring apparatus 100.

FIG. 39 shows an example of the bit error rate calculated by incorporating the random jitter into the input signal. In FIG. 39, solid line represents the calculation result in the measuring apparatus 100 and circles represent the measurement result by BERT method mentioned above. As shown in FIG. 39, the calculation result by the measuring apparatus 100 is approximately coincident with the conventional measurement result.

Figure 40:
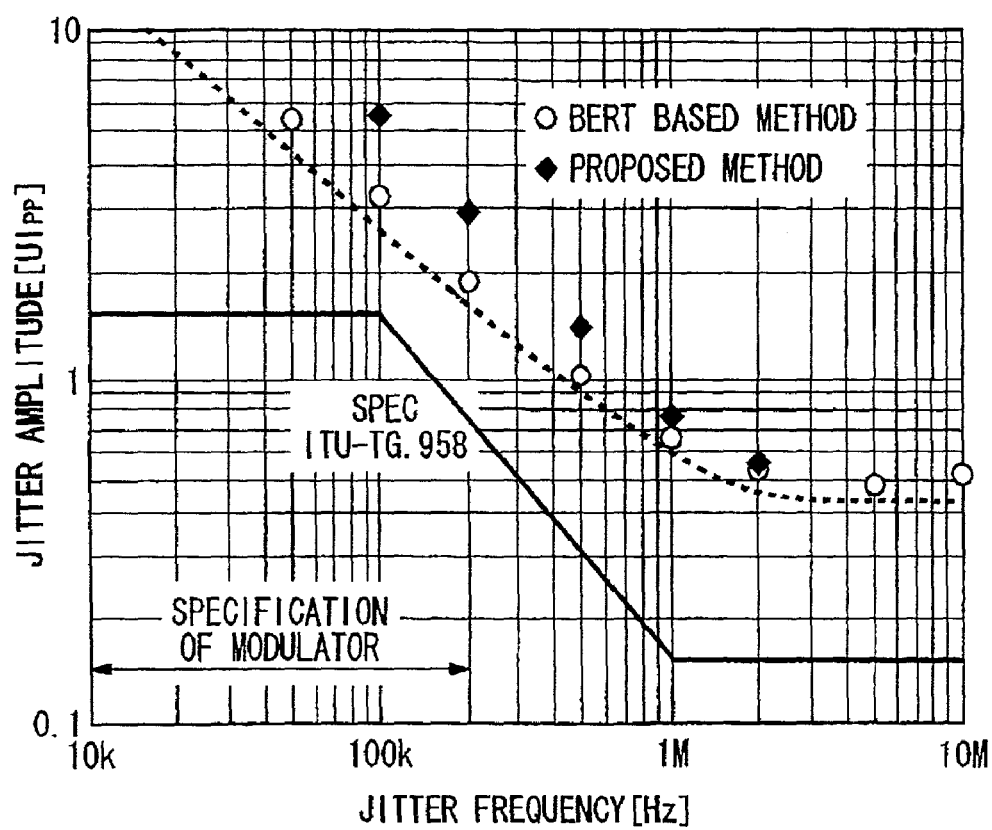
FIG. 40 shows an example of the result of the jitter tolerance measurement performed by the measuring apparatus 100.

FIG. 40 shows an example of the jitter tolerance calculated by incorporating the random jitter into the input signal. In FIG. 40, squares represent the calculation result in the measuring apparatus 100 and circles represent the measurement result by BERT based method mentioned above. In this example, the jitter tolerance value was calculated by using Equation (74.1). As shown in FIG. 40, the calculation result by the measuring apparatus 100 exhibits larger values than those of the conventional measurement result. This is because the performance limit of the DUT was calculated as described in the description for Equation (74.1).

Figure 41:
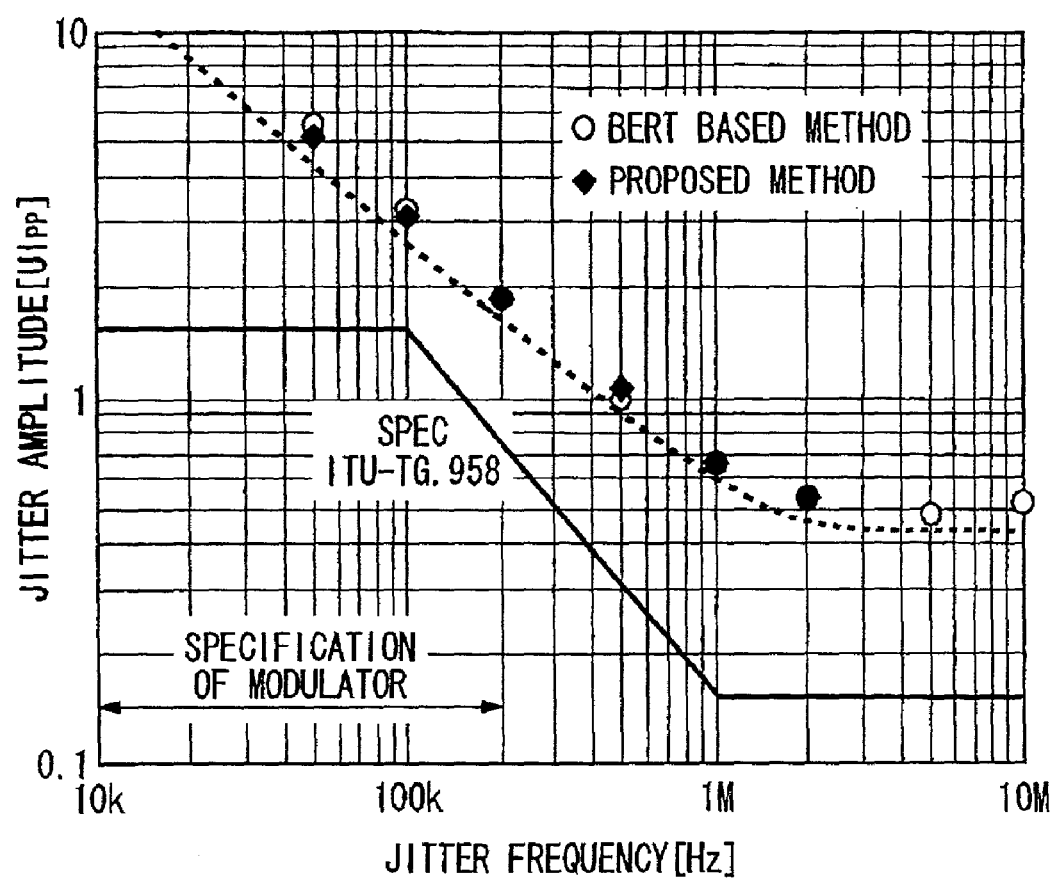
FIG. 41 shows another example of the result of the jitter tolerance measurement performed by the measuring apparatus 100.

FIG. 41 shows another example of the jitter tolerance calculated by incorporating the random jitter into the input signal. In FIG. 41, squares represent the calculation result in the measuring apparatus 100 and circles represent the measurement result by BERT based method mentioned above. In this example, the jitter tolerance value was calculated by using Equation (74.2) while setting β to be 0.75. As shown in FIG. 41, the measuring apparatus 100 can calculate the jitter tolerance that is compatible with the values obtained by the conventional method.

Next, the bit error rate when the frequency was discriminated in a case where a Gaussian distribution jitter was incorporated is described. A case where the rising edges in the bit stream fluctuate by the effects of the incorporated jitter is considered. When timings $t_{zero-crossing}$ of the adjacent rising edges cross $t_{decision}$, respectively, the preceding bit or the next bit is discriminated at $t_{decision}$. In other words, the bit error occurs. Since the probability that the preceding bit is mistakenly determined is equal to the probability that the next bit is mistakenly determined and Gaussian distribution is symmetrical with respect to the mean value, the bit error rate for the jitter frequency $f_J$ is given by the following equation $$BER[f_J] = P_e(t_{decision} < t_{zero-crossing}) \quad (75)$$

$$= \frac{1}{2} \text{erfc}\left(\frac{1}{2\sqrt{2}\ \sigma_{\Delta align}[f_J]}\right)$$

where $\sigma_{align}$ is the effective value of the alignment jitter. Moreover, a complementary error function $$Q(t_{decision}) = \frac{1}{\sqrt{2\pi}\ \sigma_{\Delta align}} \int_{t_{decision}}^{\infty} \exp\left(-\frac{x^2}{2\sigma_{\Delta align}^2}\right) dx \quad (76)$$

$$= \frac{1}{\sqrt{\pi}} \int_{\frac{t_{decision}}{\sqrt{2}\sigma_{\Delta align}}}^{\infty} \exp(-y^2) dy$$

$$= \frac{1}{2} \text{erfc}\left(\frac{t_{decision}}{\sqrt{2}\ \sigma_{\Delta align}}\right)$$

$$= \frac{1}{2} \text{erfc}\left(\frac{1}{2\sqrt{2}\ \sigma_{\Delta align}}\right)$$

was used.

$$\frac{t_{decision}}{\sigma_{\Delta align}}$$

corresponds to the time interval of $t_{decision}$ (=0.5 UI) and the signal-to-noise ratio of the alignment jitter. When Equation (35) is substituted in Equation (57), $$BER[f_J] = \frac{1}{2}\text{erfc}\left(\frac{1}{2\sqrt{2}\ \sigma_{\theta}||H_J[f_J]|\exp(-jLH_J[f_J]) - 1|}\right) \quad (77)$$

is obtained. It is assumed that the bit error rate at the jitter frequency $f_{Worst}$ indicates the worst-case value thereof. That is, $$BER[f_{Worst}] > BER[f_J] (f_J \neq f_{Worst}) \quad (78)$$

is established.

Next, the bit error rate when the frequency is not discriminated in a case where the Gaussian jitter was incorporated is described. The bit error rate when the frequency is not discriminated is re-defined. By using the jitter transfer function estimation (this amount is measured by a technique in which the frequency is not discriminated) by Equation (55), the bit error rate that does not discriminate the frequency is obtained from Equation (77) as follows.

$$\overline{BER} \approx \frac{1}{2}\text{erfc}\left(\frac{1}{2\sqrt{2}\ \sigma_{\theta}||\overline{H}_J[bw_J]|\exp(-jL\overline{H}_J[bw_J]) - 1|}\right) \quad (79)$$

$$\left|\overline{H}_J[bw_J]\right| \equiv \sqrt{\frac{1}{K_f}\sum_{f_J}[|H_J[f_J]|^2]} \quad (80)$$

$$L\overline{H}_J[bw_J] \equiv \frac{1}{K_f}\sum_{f_J} LH_J[f_J] \quad (81)$$

In the above, $b_{WJ}$ represents the bandwidth of the jitter transfer function.

Thus, the measurement technique which does not discriminate the frequency cannot observe the worst-case value of the bit error rate in the case of the Gaussian jitter input, but measures the bit error rate averaged in the observed band. In other words, the following relationship is established.

$$BER[f_{Worst}] > \overline{BER} \quad (82)$$

Next, the jitter tolerance is described. The jitter tolerance in a case of a random noise jitter input is given by the minimum value of the input timing jitter, that corresponds to a threshold value ber' of a certain error rate. Therefore, the jitter tolerance of the random noise jitter input when the frequency is discriminated and that when the frequency is not discriminated are obtained from Equations (59) and (61), respectively.

$$inf(\Delta\theta[f_J]_{Rand,RMS}, ber') = \quad (83)$$

$$\frac{1}{2\sqrt{2}\ \text{erfc}^{-1}(2ber')||H_J[f_J]|\exp(-jLH_J[f_J]) - 1|}$$

$$inf(\Delta\theta[bw_J]_{Rand,RMS}, ber') = \quad (84)$$

$$\frac{1}{2\sqrt{2}\ \text{erfc}^{-1}(2ber')||\overline{H}_J[bw_J]|\exp(-jL\overline{H}_J[bw_J]) - 1|}$$

Figure 42:
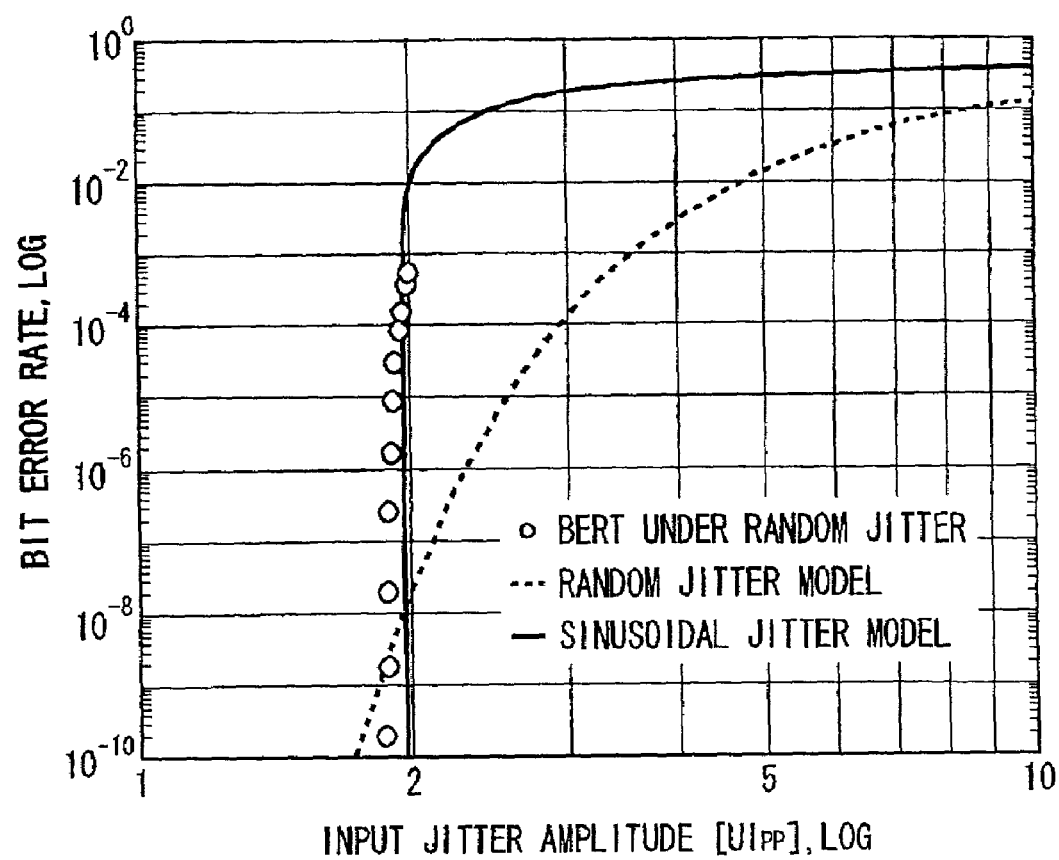
FIG. 42 shows an example of the bit error rate measured by the measuring apparatus 100.
Figure 43:
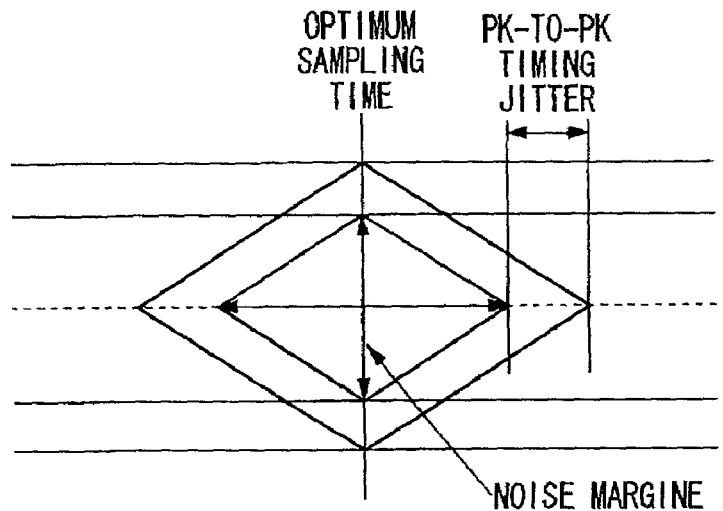
FIG. 43 shows an eye diagram.
Figure 44:
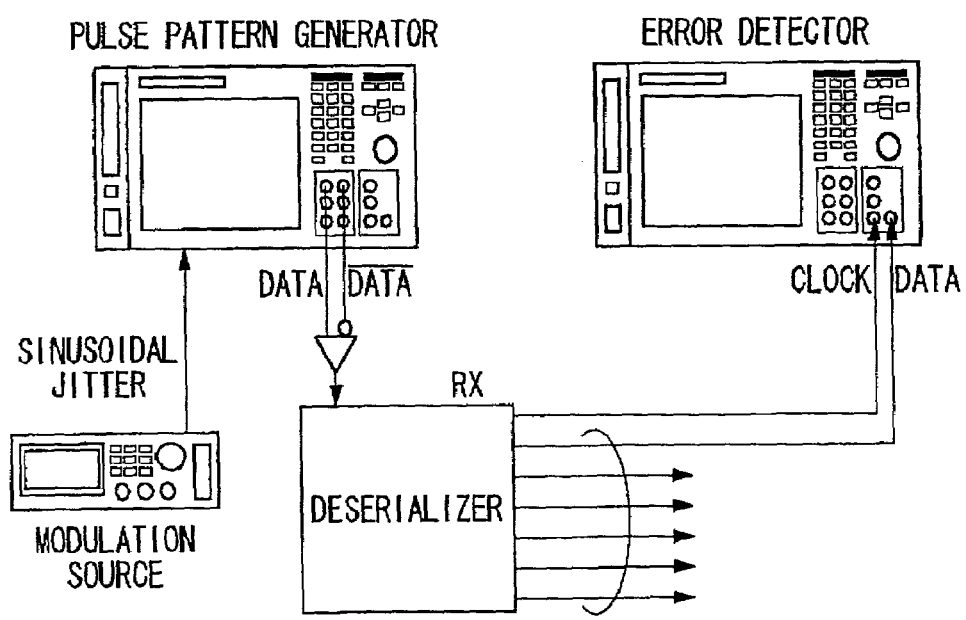
FIG. 44 illustrates an arrangement for a jitter tolerance measurement of a deserializer.
Figure 45:
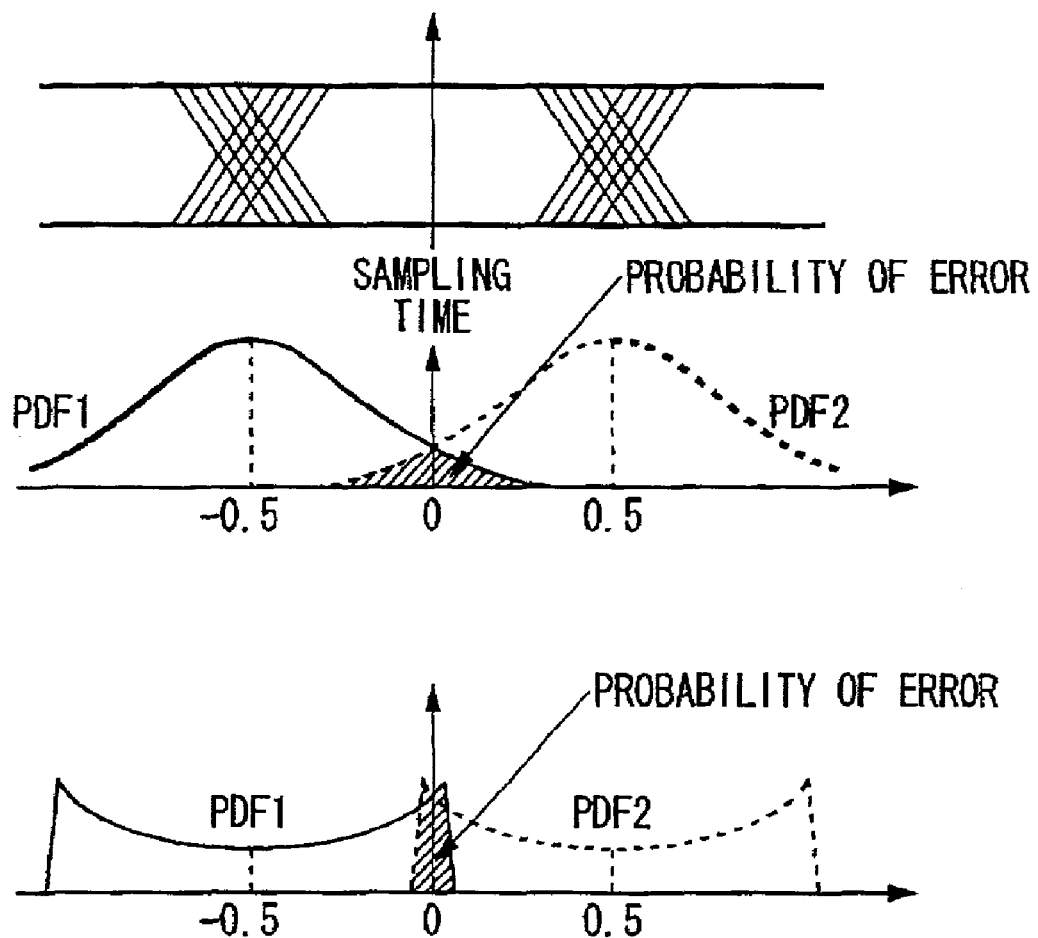
FIG. 45 compares a probability density distribution of a Gaussian noise jitter with that of a sinusoidal jitter.

Next, the bit error rate measured by the measuring apparatus 100 is described referring to FIG. 42. In FIG. 42, circles represent actual bit error rates when the random jitter was incorporated. The measuring apparatus 100 can incorporate the Gaussian distribution jitter as described above, and can calculate the bit error rate and jitter tolerance when the sinusoidal jitter was incorporated and bit error rate and jitter tolerance when the Gaussian distribution jitter was incorporated based on the calculated jitter transfer function. In FIG. 42, broken line represents the bit error rate when the Gaussian distribution jitter was incorporated while solid line represents the bit error rate when the sinusoidal jitter was incorporated. As shown in FIG. 42, the measuring apparatus 100 can measure the worst-case value of the bit error rate with high precision.

It is preferable that the noise source 50 and the jitter incorporating unit 40 be realized by using a broadband phase modulator. In this case, timing degradation by the timing jitter generated in a case of using a narrower-band phase modulator, amplitude degradation and the like can be prevented, so that the measurement can be performed with higher precision.

Moreover, the measuring apparatus 100 can be used in measurement of characteristics of a deserializer or serializer in serial communication or a high-speed input/output circuit, test thereof, and the like. In addition, as described referring to FIG. 34, the measuring apparatus 100 can be used in performance evaluation or test of a clock distribution circuit of a VLSI chip and the measurement of the bit error rate or jitter tolerance of the clock distribution circuit. In this case, the jitter transfer function between the distributed clocks is measured while $N_{parallel}$ is set to be one in the aforementioned procedure. Moreover, $|H_J[f_J]|>1.0$ means that jitter is amplified. Thus, the error rate may be over-estimated in some cases. It is therefore preferable that for each jitter frequency $f_J$ two distributed clocks are made to correspond to the input and output, respectively, so as to realize $|H_J[f_J]| \leq 1.0$.

As is apparent from the above, according to the measuring apparatus and the measuring method of the present invention, the jitter transfer function and the like of the DUT can be calculated efficiently with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. A measuring apparatus for measuring jitter characteristics of an electronic circuit, comprising:
   a timing jitter calculator operable to calculate a first timing jitter sequence of a first signal and a second timing jitter sequence of a second signal, said first signal being supplied to said electronic circuit or generated by said electronic circuit, said second signal being generated by said electronic circuit; and
   a jitter transfer function estimator operable to calculate a jitter transfer function between said first signal and said second signal based on frequency components of said first and second timing jitter sequences.

2. A measuring apparatus as claimed in claim 1, wherein said jitter transfer function estimator calculates said jitter transfer function based on a ratio of a frequency component of a timing jitter in said first timing jitter sequence and a frequency component of a timing jitter in said second timing jitter sequence, said timing jitter in said first timing jitter sequence and said timing jitter in said second timing jitter sequence having approximately equal frequencies.

3. A measuring apparatus as claimed in claim 2, wherein each of said first and second timing jitter sequences includes a plurality of frequency components, and
   said jitter transfer function estimator calculates said jitter transfer function, for a plurality of frequency component pairs each of which is formed by a frequency component of a timing jitter in said first timing jitter sequence and a frequency component of a timing jitter in said second timing jitter sequence which correspond to approximately equal frequencies, based on frequency component ratios of said timing jitters in said first and second timing jitter sequences.

4. A measuring apparatus as claimed in claim 3, wherein said timing jitter calculator calculates said first timing jitter sequence while using an input signal supplied to said electronic circuit as said first signal.

5. A measuring apparatus as claimed in claim 1, wherein said first signal is an input signal supplied to said electronic circuit, and
   said measuring apparatus further comprises a jitter incorporating unit operable to incorporate a desired input timing jitter into said input signal.

6. A measuring apparatus as claimed in claim 1, wherein said jitter transfer function estimator includes a timing jitter spectrum calculator operable to receive said first and second timing jitter sequences and to calculate frequency components of said first and second timing jitter sequences.

7. A measuring apparatus as claimed in claim 5, wherein said jitter incorporating unit incorporates said input timing jitter having a plurality of frequency components into said input signal.

8. A measuring apparatus as claimed in claim 1, wherein said jitter transfer function estimator includes:
   a power spectrum calculator operable to calculate a power spectrum of said first timing jitter sequence or said second timing jitter sequence;
   a cross spectrum calculator operable to calculate a cross spectrum between said first timing jitter sequence and said second timing jitter sequence; and
   a jitter transfer function calculator operable to calculate said jitter transfer function based on a ratio of said power spectrum to said cross spectrum.

9. A measuring apparatus as claimed in claim 1, further comprising a jitter related transmission penalty calculator operable to calculate jitter related transmission penalty of said electronic circuit based on said jitter transfer function.

10. A measuring apparatus as claimed in claim 9, wherein said jitter related transmission penalty calculator includes a bit error rate calculator operable to calculate a bit error rate of said electronic circuit based on said jitter transfer function.

11. A measuring apparatus as claimed in claim 9, wherein said jitter related transmission penalty calculator includes a jitter tolerance calculator operable to calculate jitter tolerance of said electronic circuit based on said jitter transfer function.

12. A measuring apparatus as claimed in claim 10, wherein each of said first and second timing jitter sequences includes a plurality of frequency components, and
   said bit error rate calculator calculates a worst-case value of said bit error rate for said plurality of frequency components.

13. A measuring apparatus as claimed in claim 12, wherein each of said first and second timing jitter sequences includes a plurality of frequency components, and said bit error rate calculator further calculates a mean value of said bit error rate for said plurality of frequency components.

14. A measuring apparatus as claimed in claim 12, wherein each of said first and second timing jitter sequences includes a plurality of frequency components, and
said bit error rate calculator further calculates said bit error rate in a case where a sinusoidal jitter was incorporated as an input timing jitter into an input signal of said electronic circuit, for said plurality of frequency components.

15. A measuring apparatus as claimed in claim 14, wherein said bit error rate calculator calculates performance limit of said bit error rate of said electronic circuit in the case where said sinusoidal jitter was incorporated as said input timing jitter.

16. A measuring apparatus as claimed in claim 11, wherein each of said first and second timing jitter sequences includes a plurality of frequency components, and
said jitter tolerance calculator calculates a worst-case value of said jitter tolerance for said plurality of frequency components.

17. A measuring apparatus as claimed in claim 16, wherein each of said first and second timing jitter sequences includes a plurality of frequency components, and
said jitter tolerance calculator further calculates a mean value of said jitter tolerance for said plurality of frequency components.

18. A measuring apparatus as claimed in claim 16, wherein said jitter tolerance calculator calculates said jitter tolerance of said electronic circuit in the case where said sinusoidal jitter was incorporated as an input timing jitter.

19. A measuring apparatus as claimed in claim 18, wherein said jitter tolerance calculator calculates performance limit of said jitter tolerance of said electronic circuit in the case where said sinusoidal jitter was incorporated as said input timing jitter.

20. A measuring apparatus as claimed in claim 5, wherein said jitter incorporating unit incorporates said timing jitter into said input signal by performing phase modulation of said input signal.

21. A measuring apparatus as claimed in claim 5, wherein said jitter incorporating unit incorporates said timing jitter into said input signal by performing frequency modulation of said input signal.

22. A measuring apparatus as claimed in claim 5, wherein said second signal is an output signal output from said electronic circuit,
said jitter incorporating unit incorporates a plurality of input timing jitters having different amplitudes into said input signal, said amplitudes being within a region where a relationship between said input timing jitters and output timing jitters of said output signal is linear, and
said jitter transfer function estimator includes a gain calculator operable to calculate a gain of said jitter transfer function by performing linear approximation of a relationship between timing jitter values in said first timing jitter sequence and timing jitter values in said second timing jitter sequence, said timing jitter values in said first and second timing jitter sequences being made to correspond to said respective amplitudes of said input timing jitters.

23. A measuring apparatus as claimed in claim 22, wherein said jitter transfer function estimator further includes a timing phase difference calculator operable to calculate a phase difference between said input timing jitters and said output timing jitters.

24. A measuring apparatus as claimed in claim 1, wherein said timing jitter calculator includes:
an analytic signal transformer operable to transform said first and second signals to an analytic signal that is a complex number;
an instantaneous phase estimator operable to estimate an instantaneous phase of said analytic signal based on said analytic signal;
a linear instantaneous phase estimator operable to estimate a linear instantaneous phase of each of said first and second signals based on said instantaneous phase of said analytic signal; and
a linear trend remover operable to calculate an instantaneous phase noise, that is obtained by removing said linear instantaneous phase from said instantaneous phase, based on said instantaneous phase and said linear instantaneous phase for each of said first and second signals.

25. A measuring apparatus as claimed in claim 24, wherein said timing jitter calculator further includes a resampler operable to receive said instantaneous phase noise of each of said first and second signals and to calculate said first and second timing jitter sequences by resampling said received instantaneous phase noise.

26. A measuring apparatus as claimed in claim 25, wherein said resampler re-samples said instantaneous phase noise at times approximately the same as zero-crossing times of a corresponding one of said first and second signals.

27. A measuring apparatus as claimed in claim 24, wherein said analytic signal transformer includes:
a bandwidth limiter operable to extract, from each of said first and second signals, frequency components containing a fundamental frequency of a corresponding one of said first and second signals; and
a Hilbert transformer operable to generate, for each of said first and second signals, a Hilbert pair obtained by performing Hilbert transform of said frequency components extracted by said bandwidth limiter, and
wherein said analytic signal transformer outputs said Hilbert pair as an imaginary part of said analytic signal.

28. A measuring apparatus as claimed in claim 24, wherein said analytic signal transformer includes:
a time-domain to frequency-domain transformer operable to transform each of said first and second signals to a two-sided spectrum in frequency domain;
a bandwidth limiter operable to extract frequency components of said two-sided spectrum, said frequency components containing a positive fundamental frequency; and
a frequency-domain to time-domain transformer operable to output as said analytic signal a signal obtained by transforming said frequency components extracted by said bandwidth limiter into time domain.

29. A measuring apparatus as claimed in claim 24, wherein said analytic signal transformer includes:
a buffer memory operable to store said first and second signals;
a waveform data selector operable to sequentially select apart of said first and second signals stored in said buffer memory;
an window function multiplier operable to multiply said signal part selected by said waveform data selector by a predetermined window function;

a time-domain to frequency-domain transformer operable to transform said signal part multiplied by said window function to a spectrum in frequency domain;

a bandwidth limiter operable to extract frequency components of said spectrum, said frequency components containing a positive fundamental frequency;

a frequency-domain to time-domain transformer operable to transform said frequency components extracted by said bandwidth limiter to a time-domain signal; and an amplitude corrector operable to multiply said time-domain signal by a reciprocal of said window function to generate said analytic signal, and wherein said waveform data selector selects said signal part to partially overlap a previously selected signal part.

30. A measuring apparatus as claimed in claim 27, wherein said bandwidth limiter extracts a desired frequency band.

31. A measuring apparatus as claimed in claim 23, wherein said timing jitter estimator includes an waveform clipper operable to remove amplitude modulation components of said first and second signals and to supply said first and second signals without said amplitude modulation components to said analytic signal transformer.

32. A measuring apparatus as claimed in claim 25, wherein said timing jitter calculator further includes a low frequency component remover operable to remove low frequency components of said instantaneous phase noise and to supply said instantaneous phase noise without said low frequency components to said resampler.

33. A measuring apparatus for performing a measurement for an electronic circuit, comprising:

an instantaneous phase noise calculator operable to calculate a first instantaneous phase noise of a first signal and a second instantaneous phase noise of a second signal, said first signal being supplied to said electronic circuit or generated by said electronic circuit, said second signal being generated by said electronic circuit; and a jitter transfer function estimator operable to calculate a jitter transfer function between said first and second signals based on frequency components of said first and second instantaneous phase noises.

34. A measuring method for measuring jitter characteristics of an electronic circuit, comprising:

calculating a first timing jitter sequence of a first signal and a second timing jitter sequence of a second signal, said first signal being supplied to said electronic circuit or generated by said electronic circuit, said second signal being generated by said electronic circuit; and calculating a jitter transfer function between said first and second signals based on frequency components of said first and second timing sequences.

35. A measuring method as claimed in claim 34, further comprising calculating jitter related transmission penalty of said electronic circuit based on said jitter transfer function.

36. A measuring method as claimed in claim 35, wherein said calculation of jitter related transmission penalty includes calculation of a bit error rate of said electronic circuit based on said jitter transfer function.

37. A measuring method as claimed in claim 35, wherein said calculation of jitter related transmission penalty includes calculation of jitter tolerance of said electronic circuit based on said jitter transfer function.

38. A measuring method for performing a measurement for an electronic circuit, comprising:

calculating a first instantaneous phase noise of a first signal and a second instantaneous phase noise of a second signal, said first signal being supplied to said electronic circuit or generated by said electronic circuit, said second signal being generated by said electronic circuit; and calculating a jitter transfer function between said first and second signals based on frequency components of said first and second instantaneous phase noises.

39. A measuring apparatus as claimed in claim 28, wherein said bandwidth limiter extracts a desired frequency band.

40. A measuring apparatus as claimed in claim 29, wherein said bandwidth limiter extracts a desired frequency band.

* * * * *